(12) United States Patent
Sakui et al.

(10) Patent No.: US 6,292,390 B1
(45) Date of Patent: Sep. 18, 2001

(54) SEMICONDUCTOR DEVICE

(75) Inventors: Koji Sakui, Tokyo; Takehiro Hasegawa, Yokohama; Shigeyoshi Watanabe, Yokohama; Fujio Masuoka, Yokohama; Tsuneaki Fuse, Tokyo; Toshiki Seshita, Kawasaki; Seiichi Aritome, Yokohama; Akihiro Nitayama, Kawasaki; Fumio Horiguchi, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/755,143

(22) Filed: Jan. 8, 2001

Related U.S. Application Data

(62) Division of application No. 08/268,728, filed on Jun. 30, 1994, which is a continuation of application No. 08/035,205, filed on Mar. 22, 1993, now abandoned, which is a continuation of application No. 07/660,982, filed on Feb. 27, 1991, now abandoned, which is a continuation of application No. 07/293,807, filed on Jan. 5, 1989, now abandoned.

(30) Foreign Application Priority Data

| Jan. 8, 1988 | (JP) | 63-1334 |
| Jan. 29, 1988 | (JP) | 63-17383 |
| Jan. 29, 1988 | (JP) | 63-17384 |
| Jan. 29, 1988 | (JP) | 63-17385 |
| Jan. 29, 1988 | (JP) | 63-17386 |
| Mar. 25, 1988 | (JP) | 63-69627 |
| Mar. 25, 1988 | (JP) | 63-69636 |
| Jun. 28, 1988 | (JP) | 63-158188 |
| Jun. 28, 1988 | (JP) | 63-158189 |
| Jun. 28, 1988 | (JP) | 63-158190 |
| Jun. 30, 1988 | (JP) | 63-160874 |
| Jan. 29, 1989 | (JP) | 63-17387 |

(51) Int. Cl.$^7$ ................................. G11C 11/34
(52) U.S. Cl. ................ 365/177; 365/175; 365/179
(58) Field of Search ........................ 365/177, 179, 365/154, 155, 159, 149, 175, 205, 207; 327/439

(56) References Cited

U.S. PATENT DOCUMENTS 6,049,494 * 4/2000 Sakui et al. .................... 365/203

* cited by examiner

*Primary Examiner*—Richard Elms
*Assistant Examiner*—Hien Nguyen
(74) *Attorney, Agent, or Firm*—Oblon, Spivak, McClelland, Maier & Neustadt, P.C.

(57) ABSTRACT

A semiconductor device includes a bipolar transistor whose emitter-collector voltage is set to satisfy a condition $I_{BE} < I_{CB}$ according to a voltage applied across a base and emitter where $I_{BE}$ is the base current flowing through a base-emitter path in a forward direction, and $I_{CB}$ is the base current flowing through a collector-base path in a reverse direction.

12 Claims, 66 Drawing Sheets

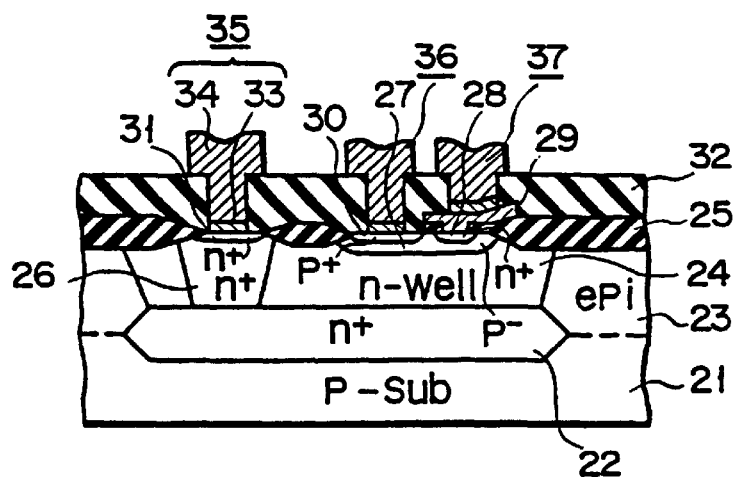
F I G. 2
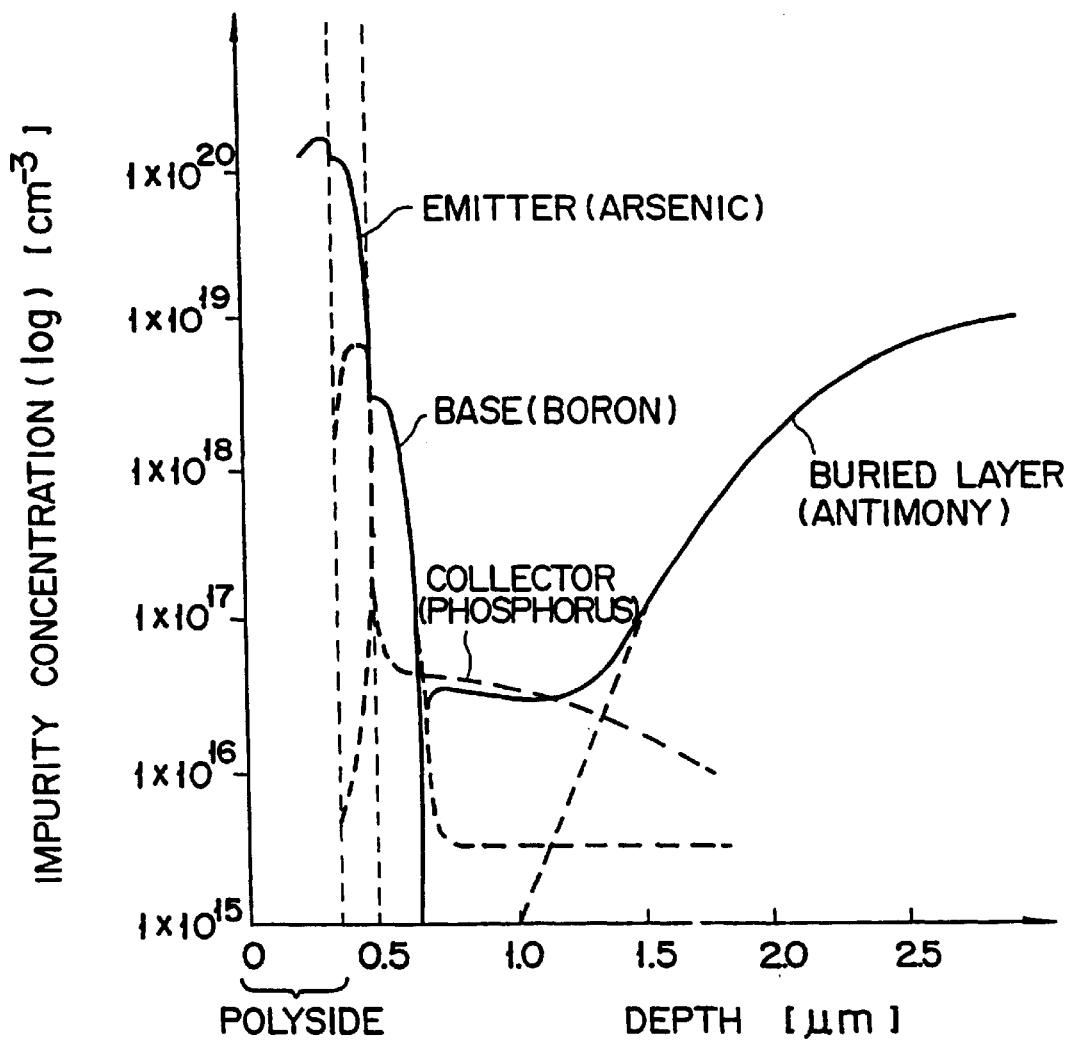
F I G. 3

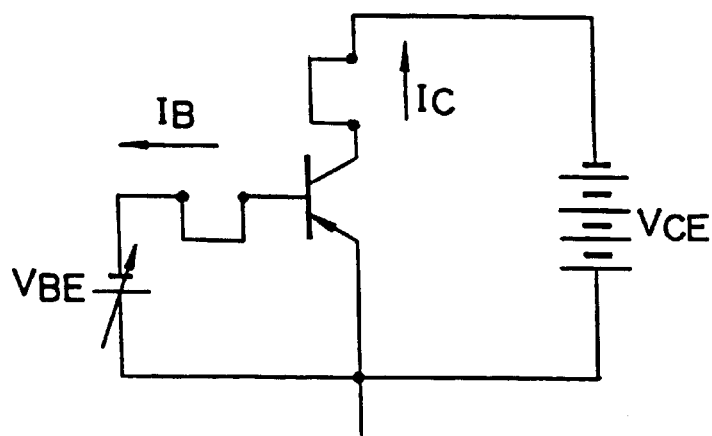
F I G. 11
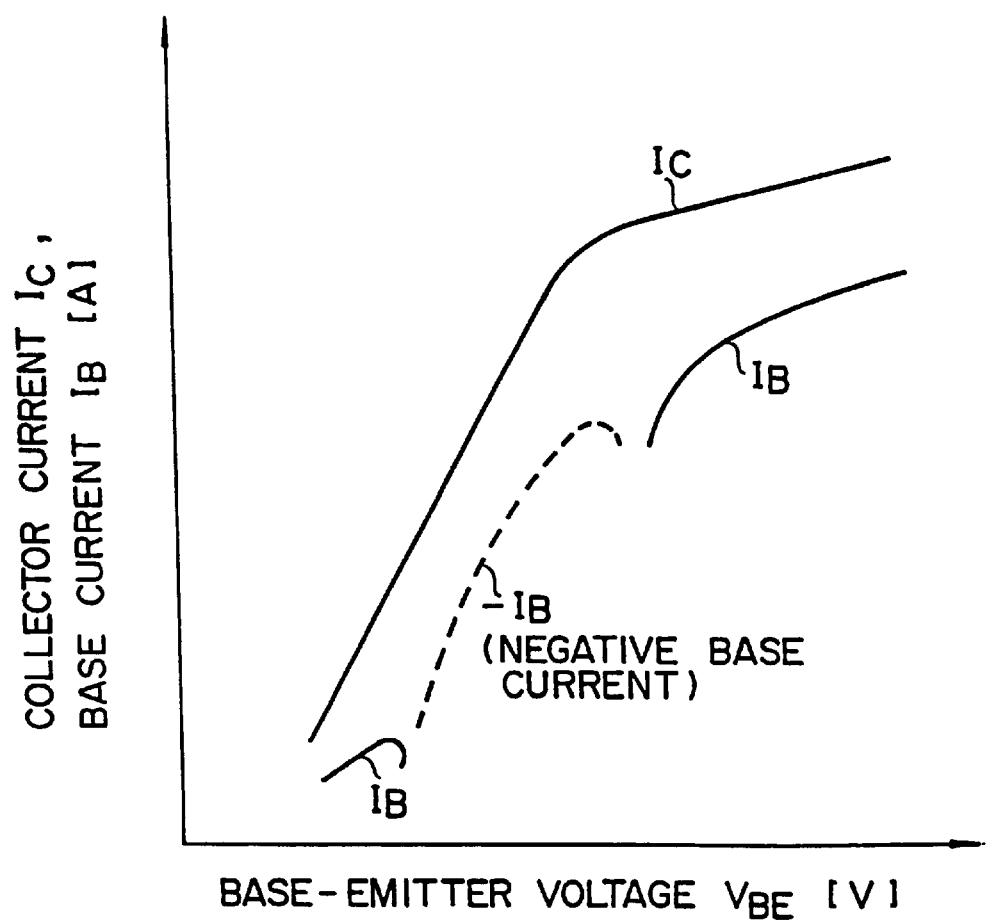
F I G. 12

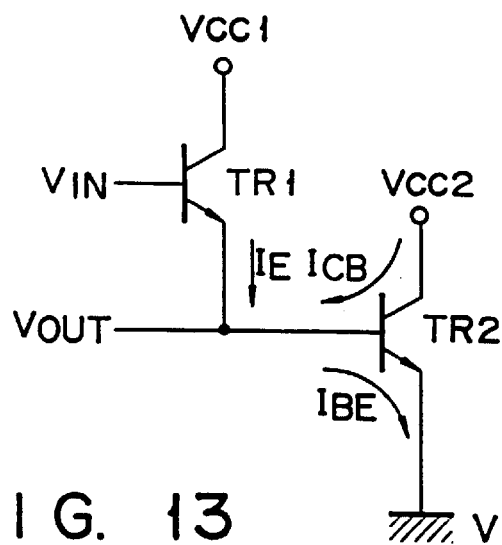
F I G. 13
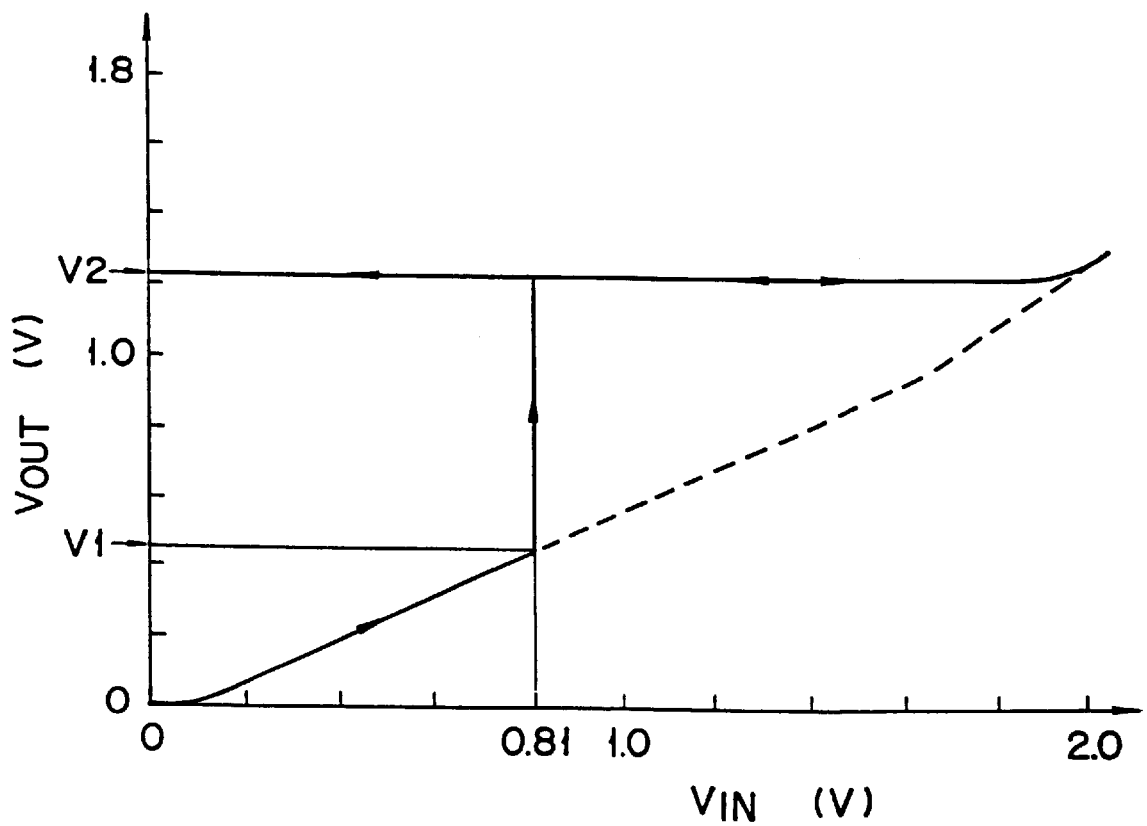
F I G. 14

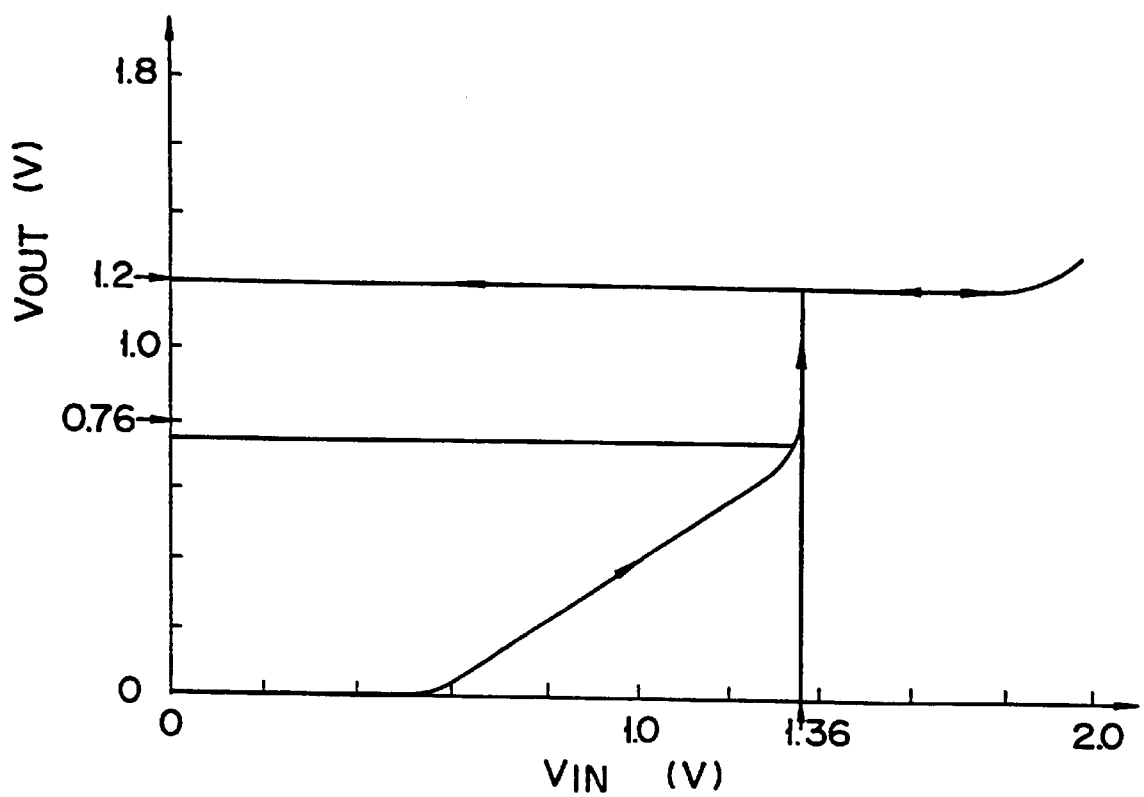
F I G. 17
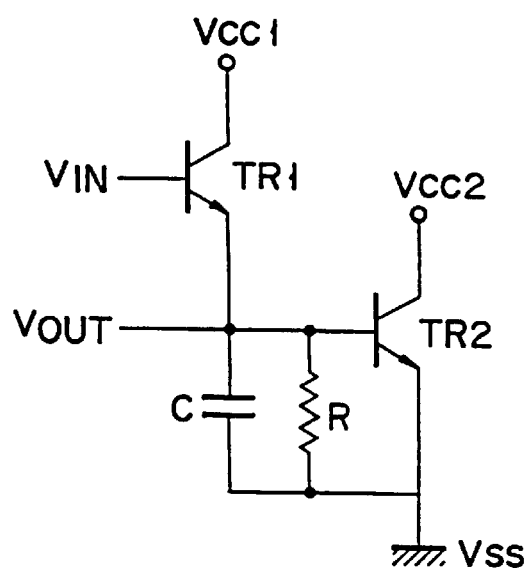
F I G. 18

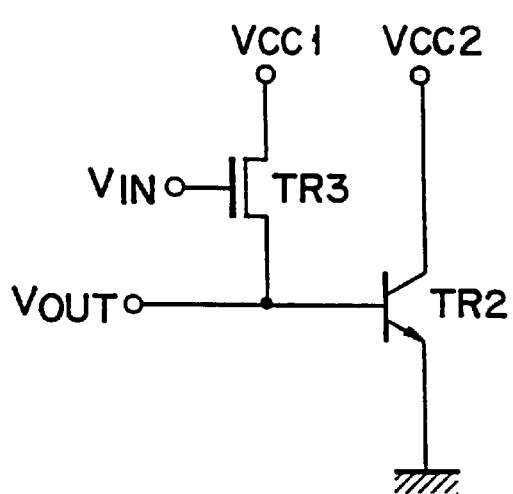
F I G. 19
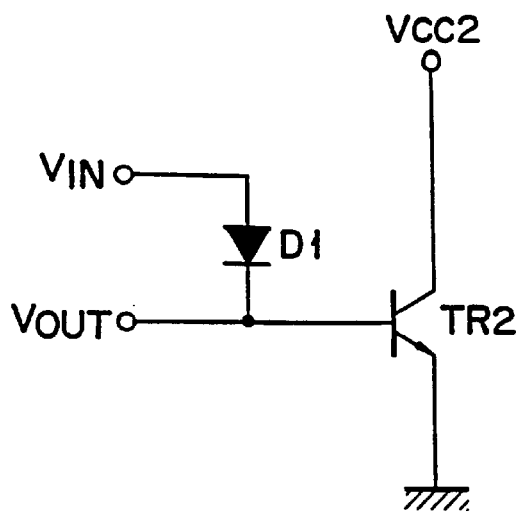
F I G. 20
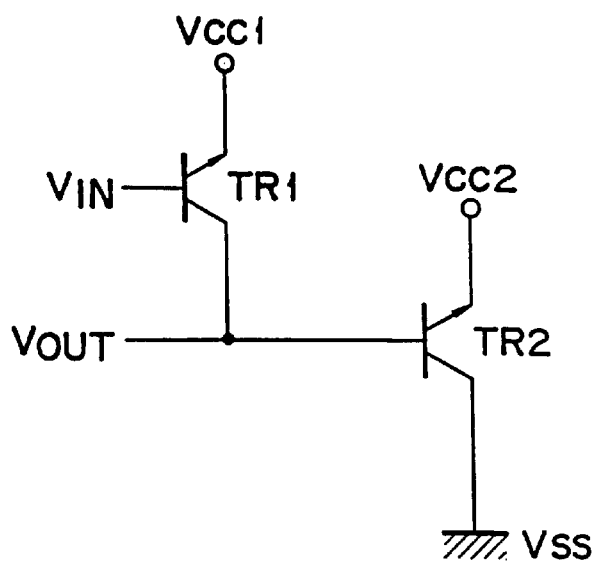
F I G. 21

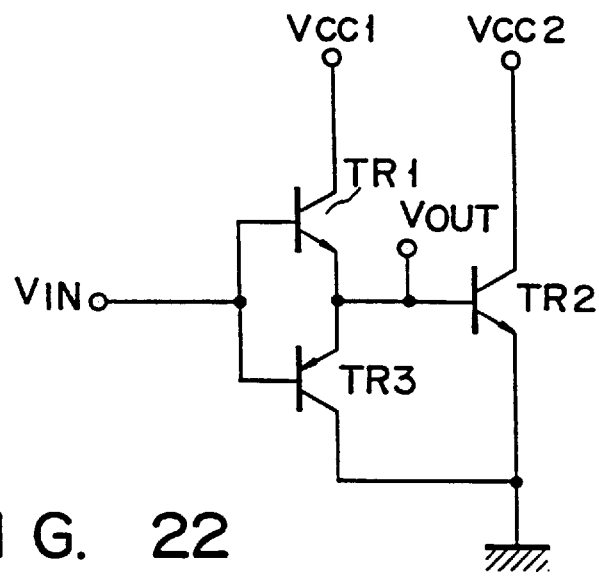
F I G. 22
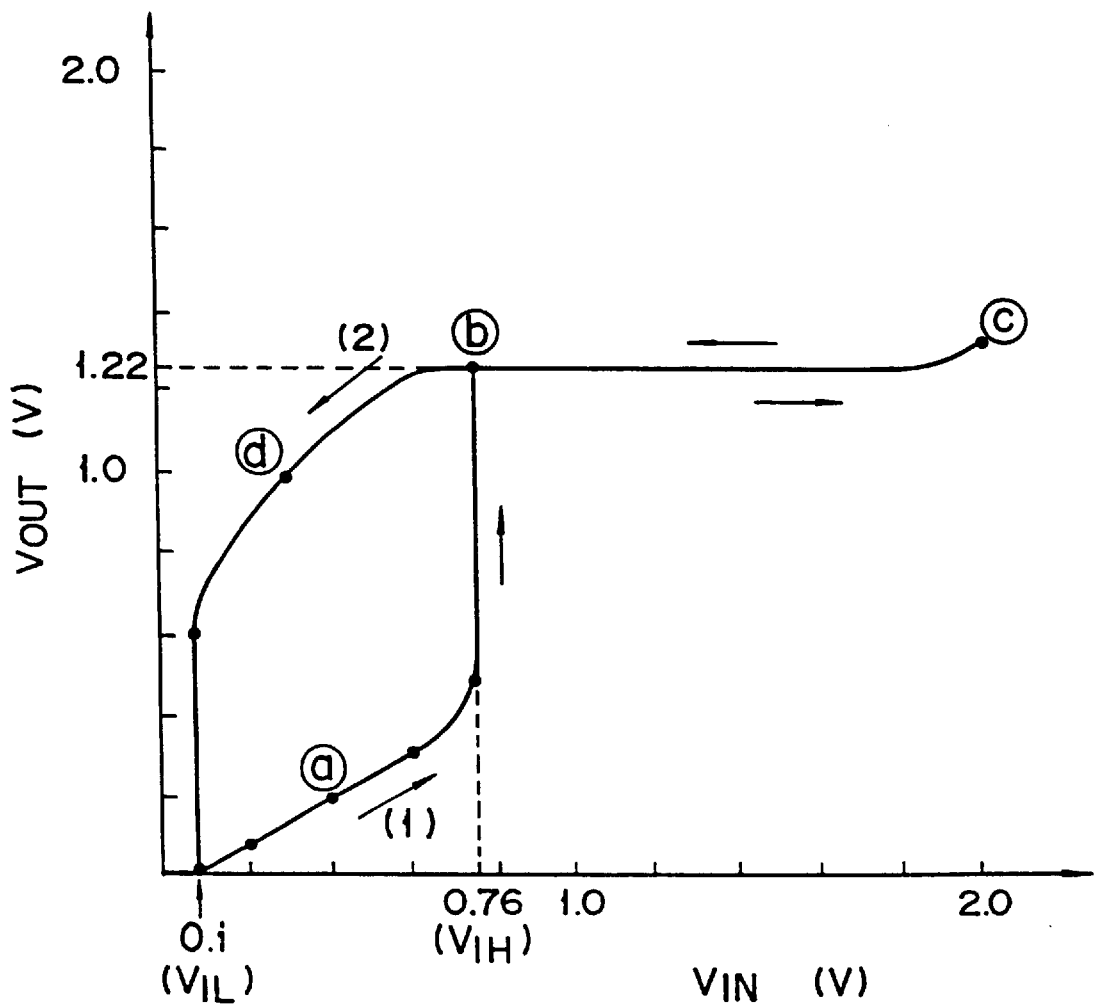
F I G. 23

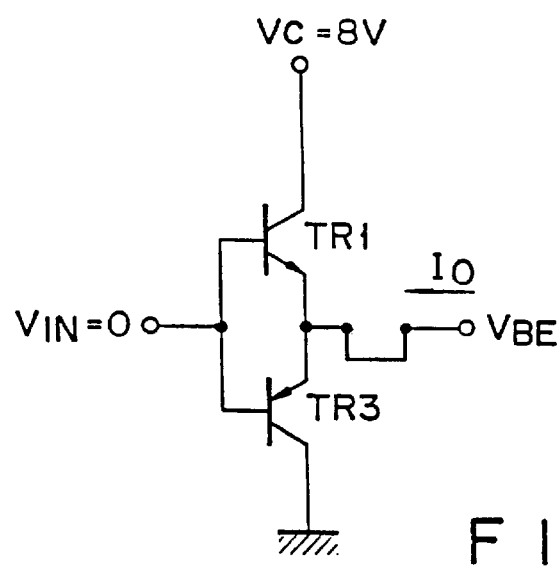
F I G. 24A
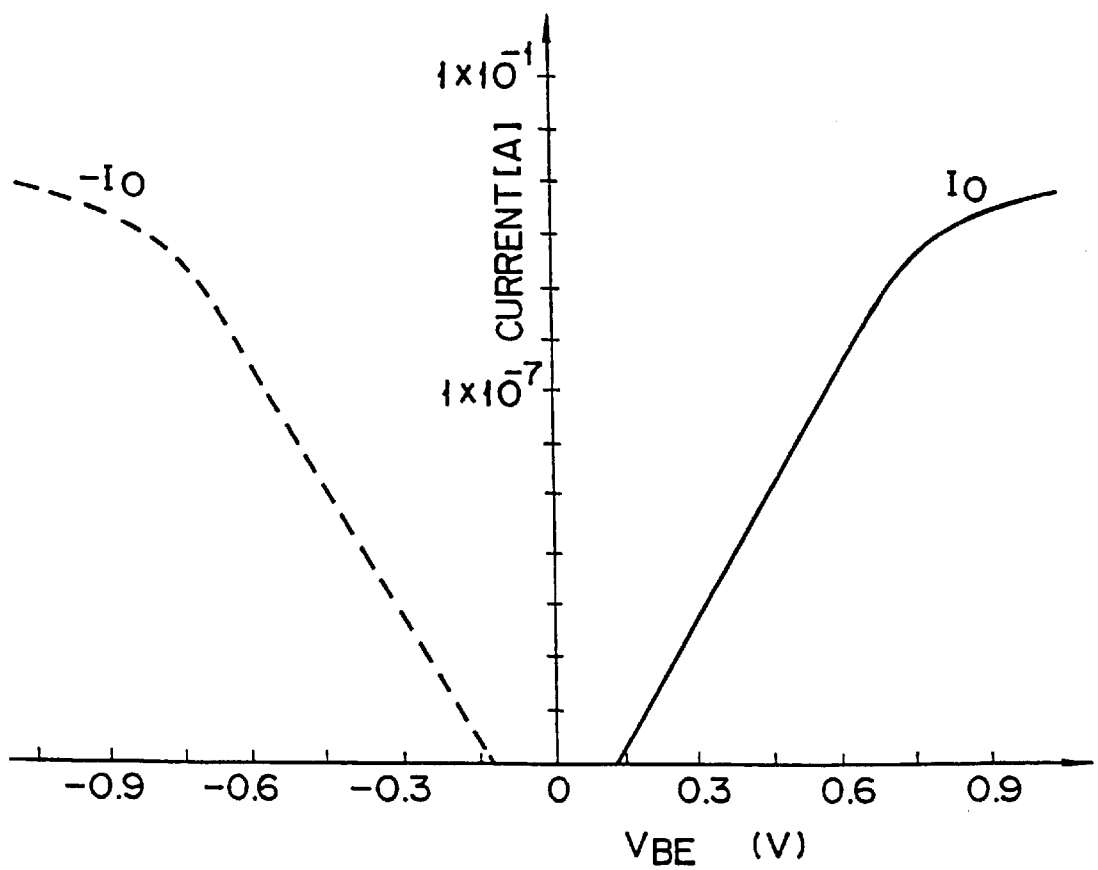
F I G. 24B

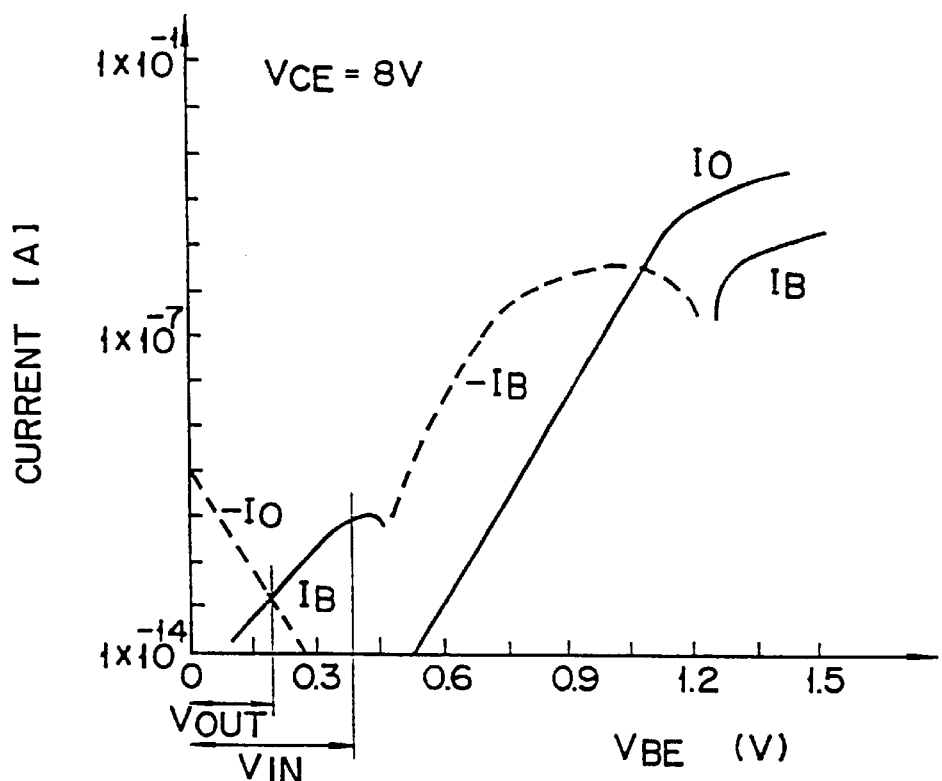
F I G. 25A
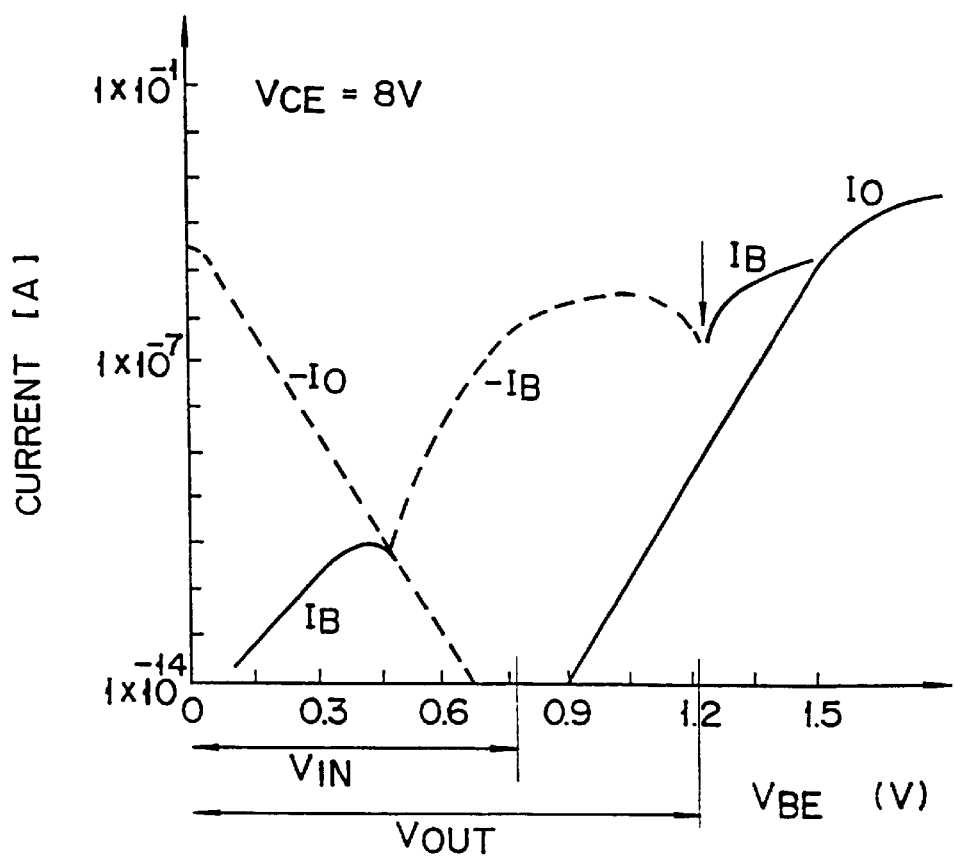
F I G. 25B

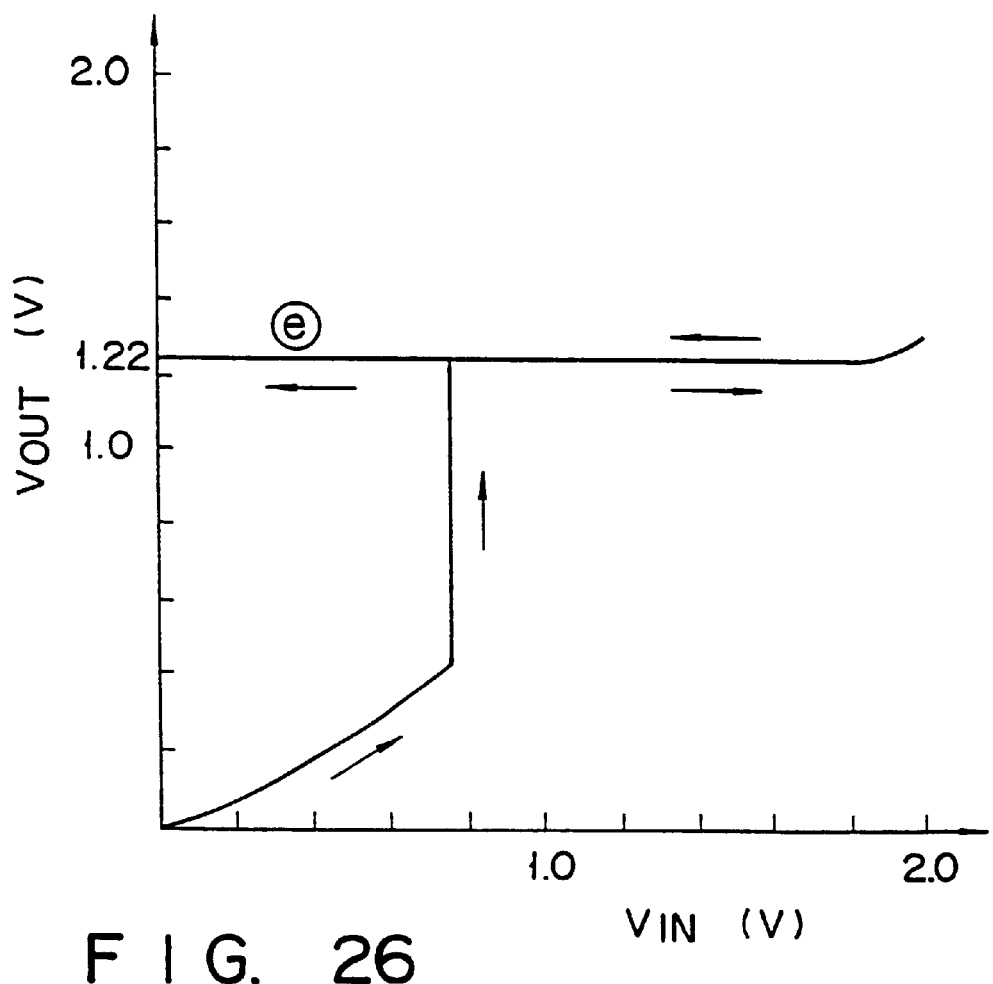
F I G. 26
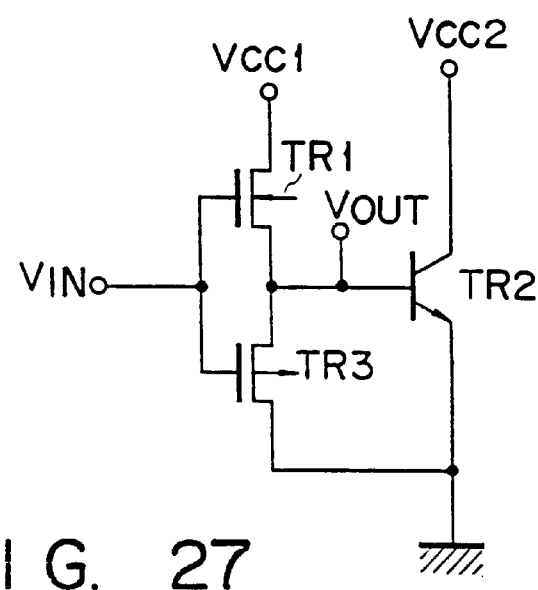
F I G. 27

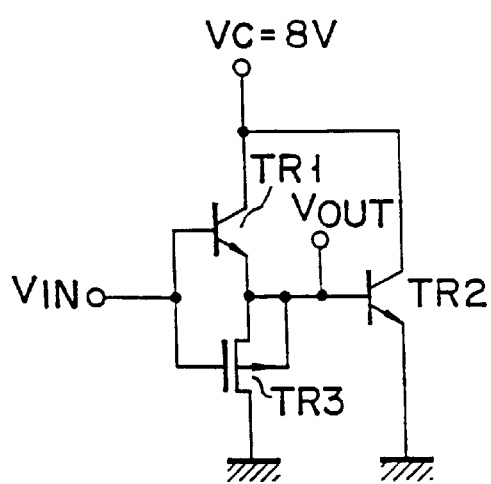
F I G. 28
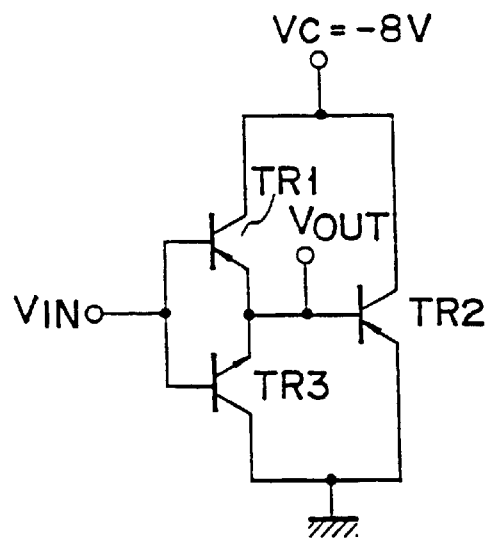
F I G. 29
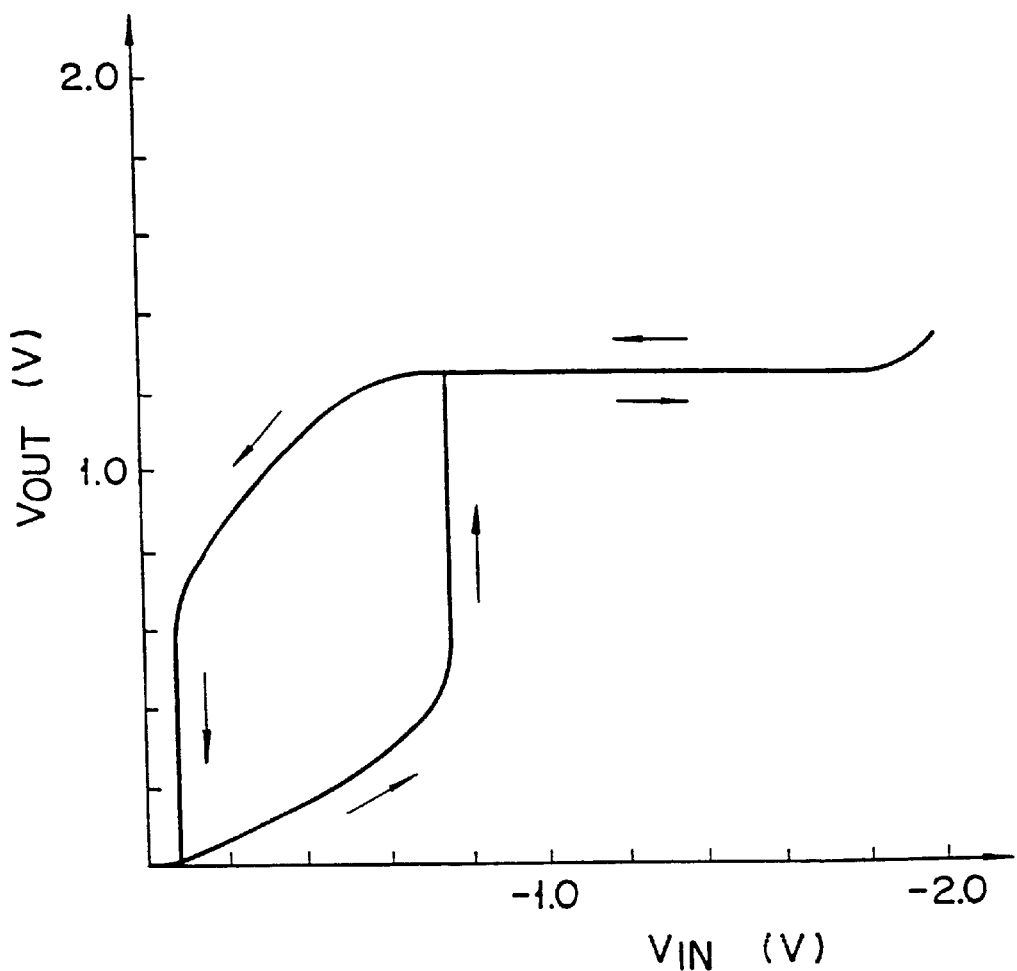
F I G. 30

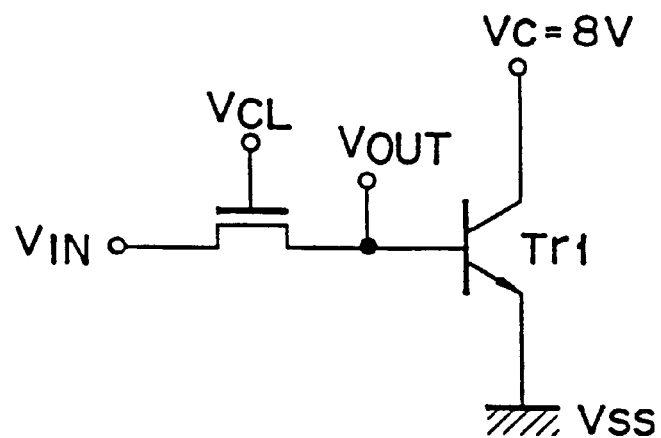
F I G. 31
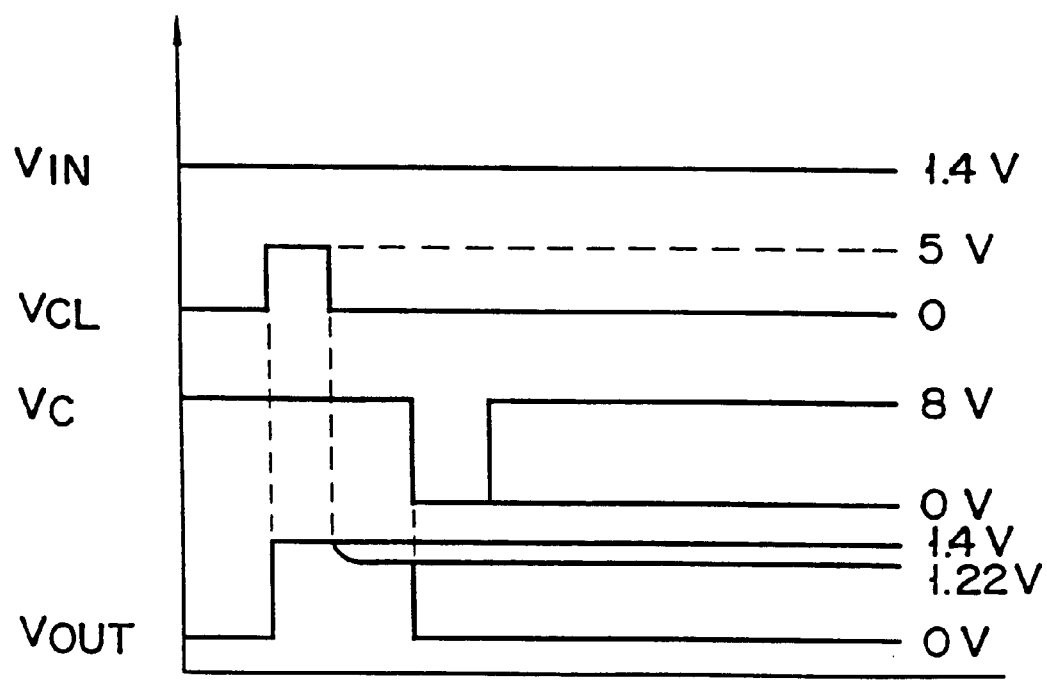
F I G. 32

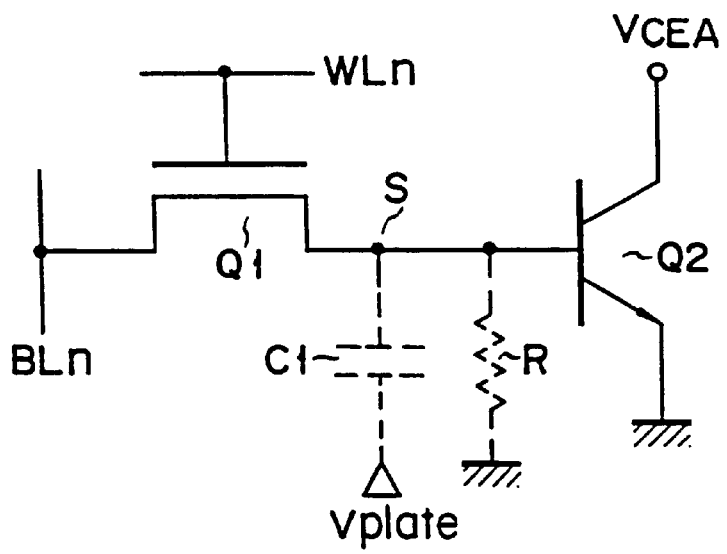
F I G. 33
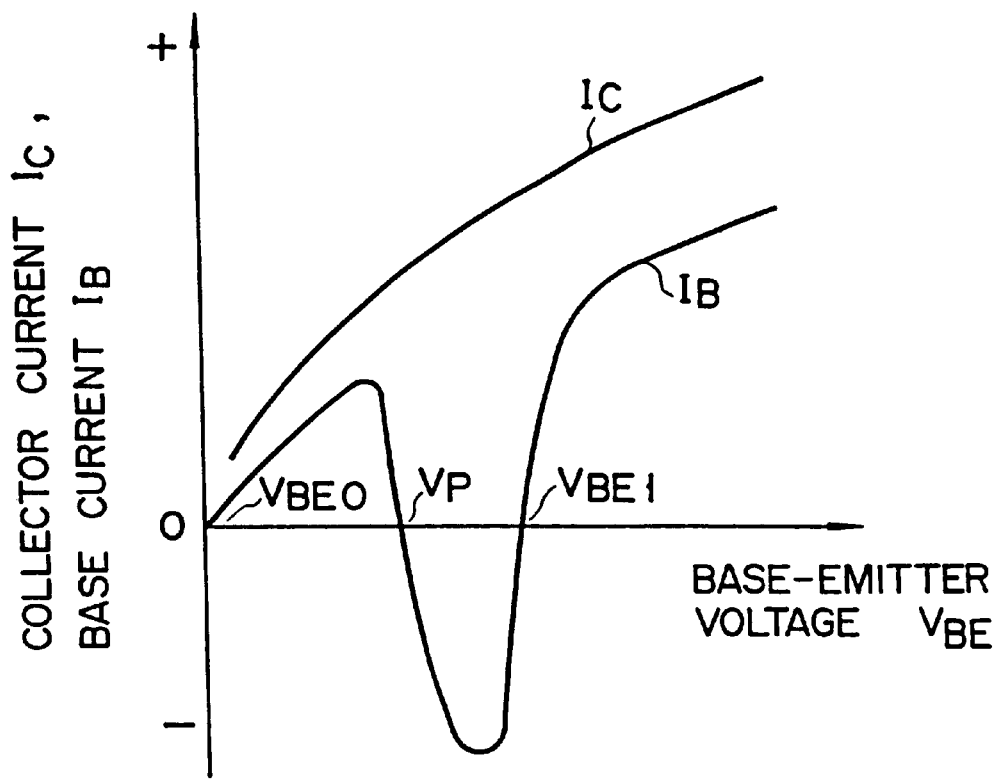
F I G. 34

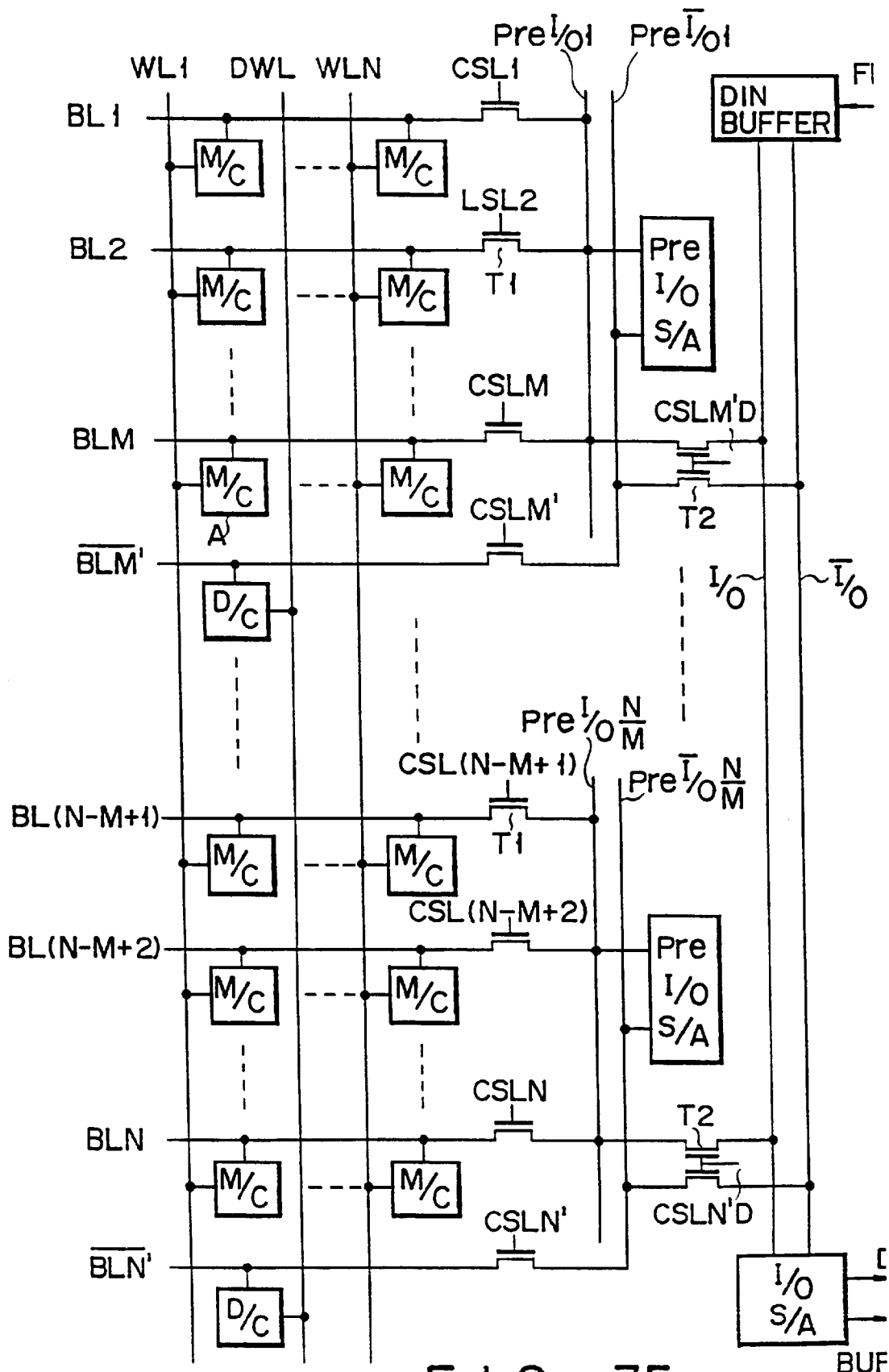
F I G. 35

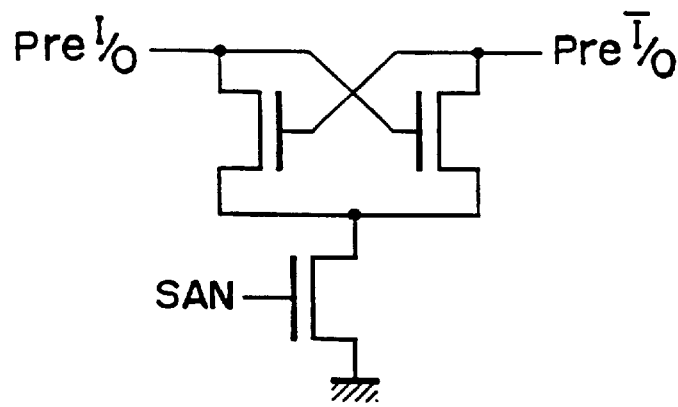
F I G. 36
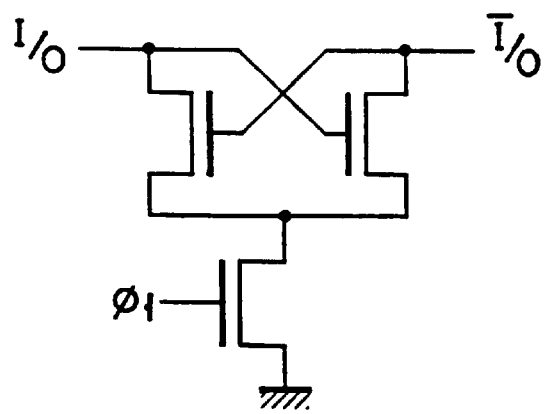
F I G. 37
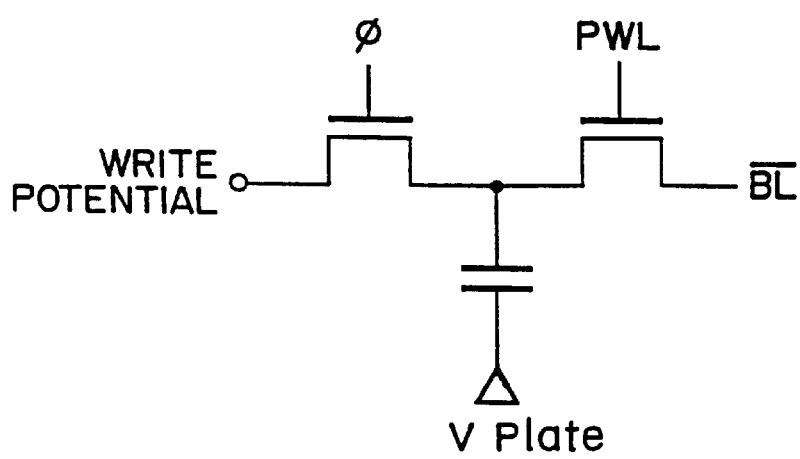
F I G. 38

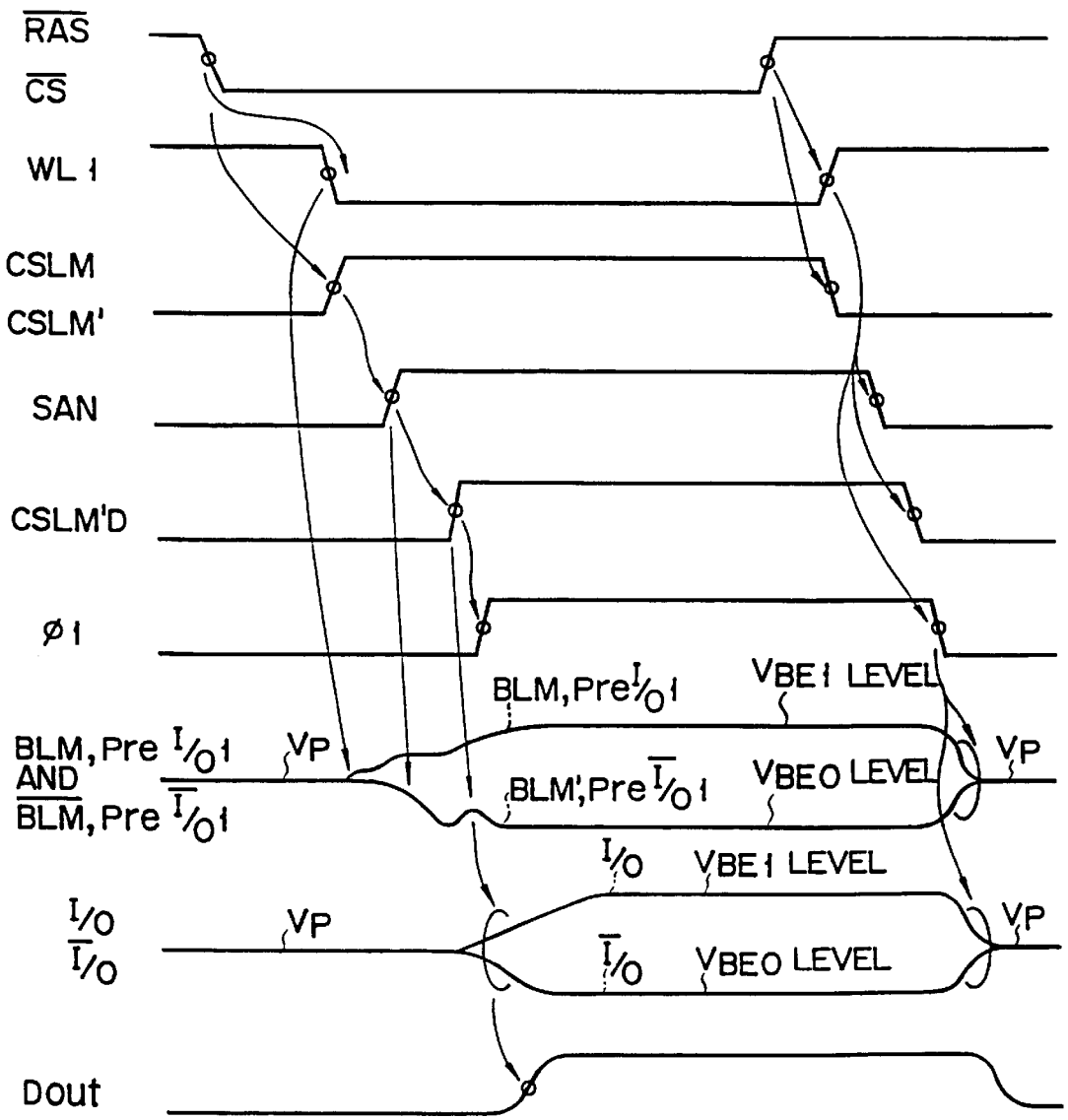
F I G. 39

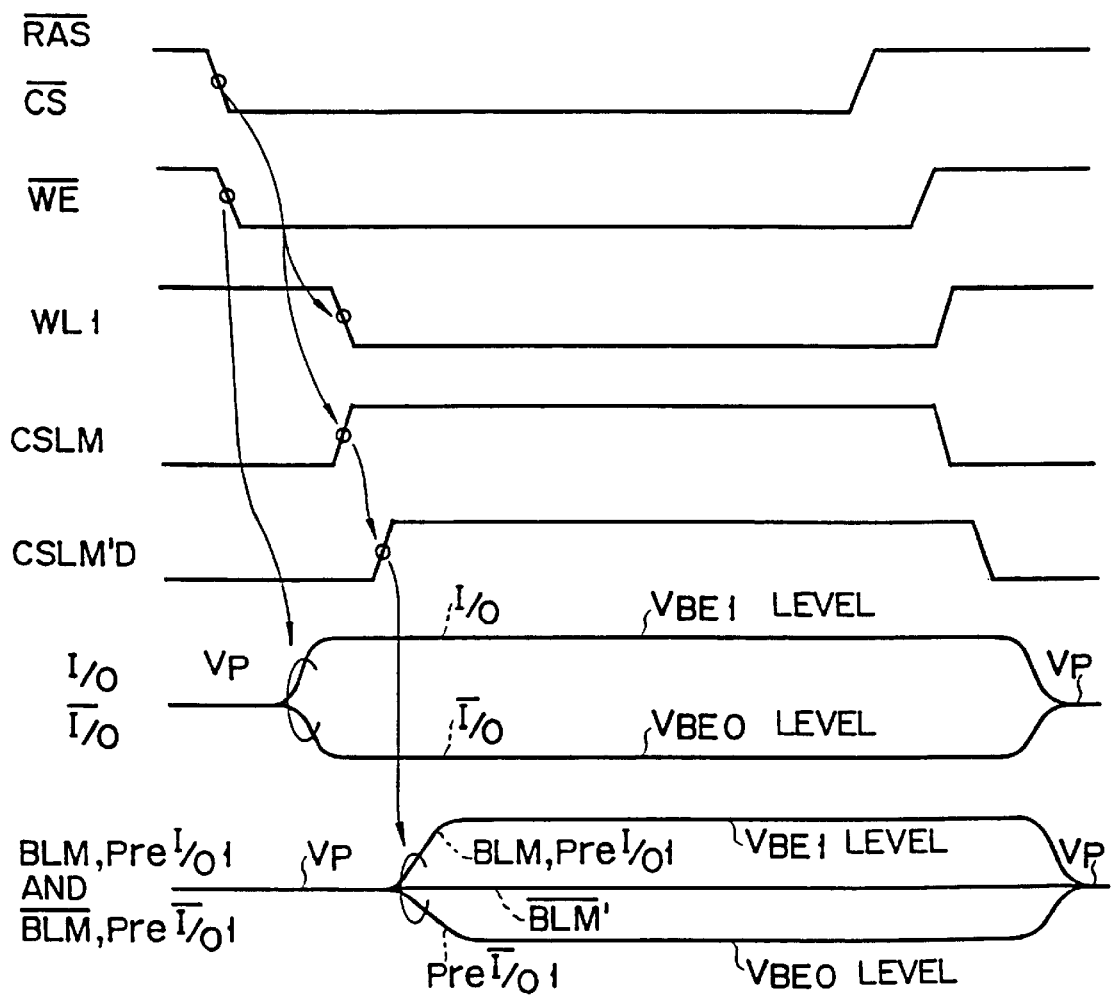
F I G. 40

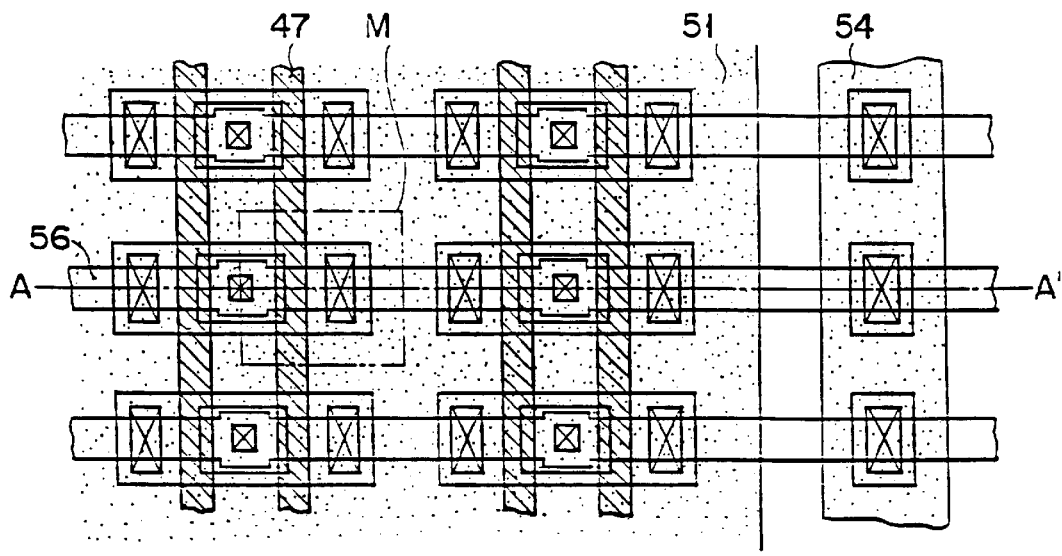
F I G. 44
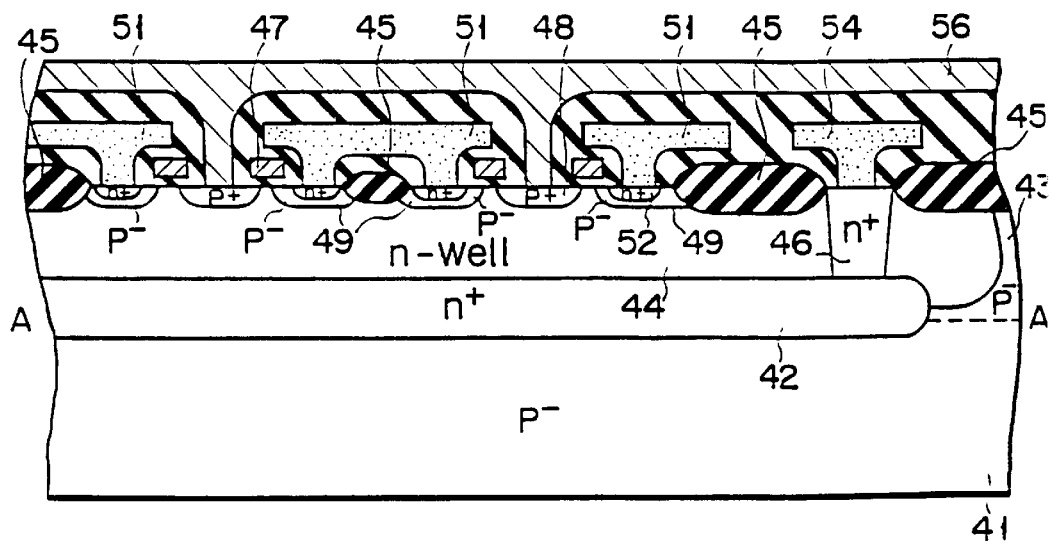
F I G. 45

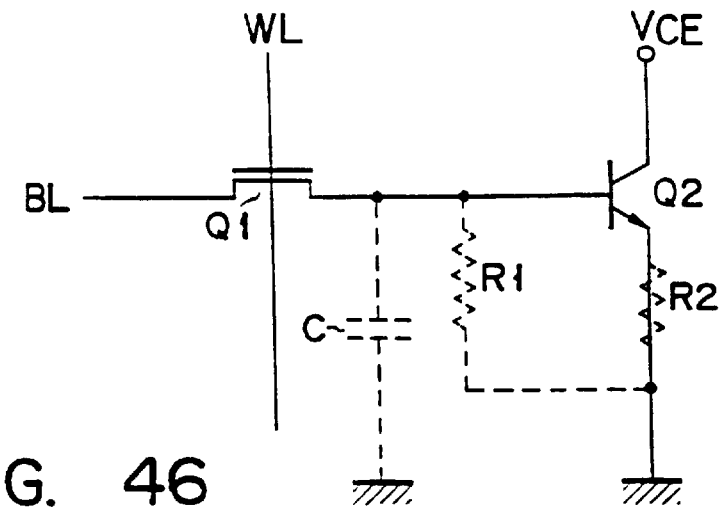
F I G. 46
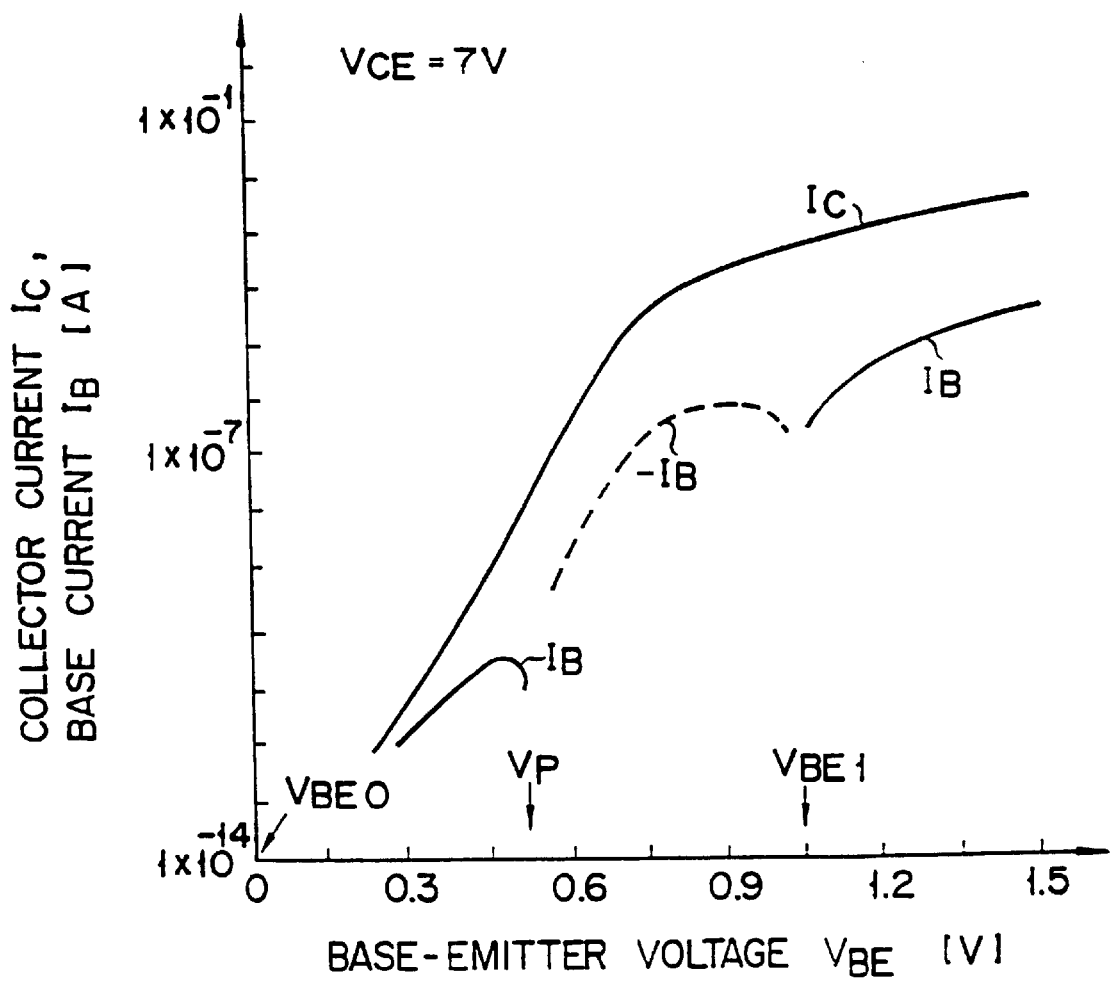
F I G. 47

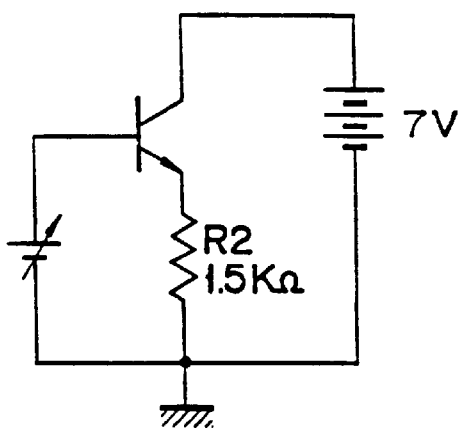
F I G. 49A
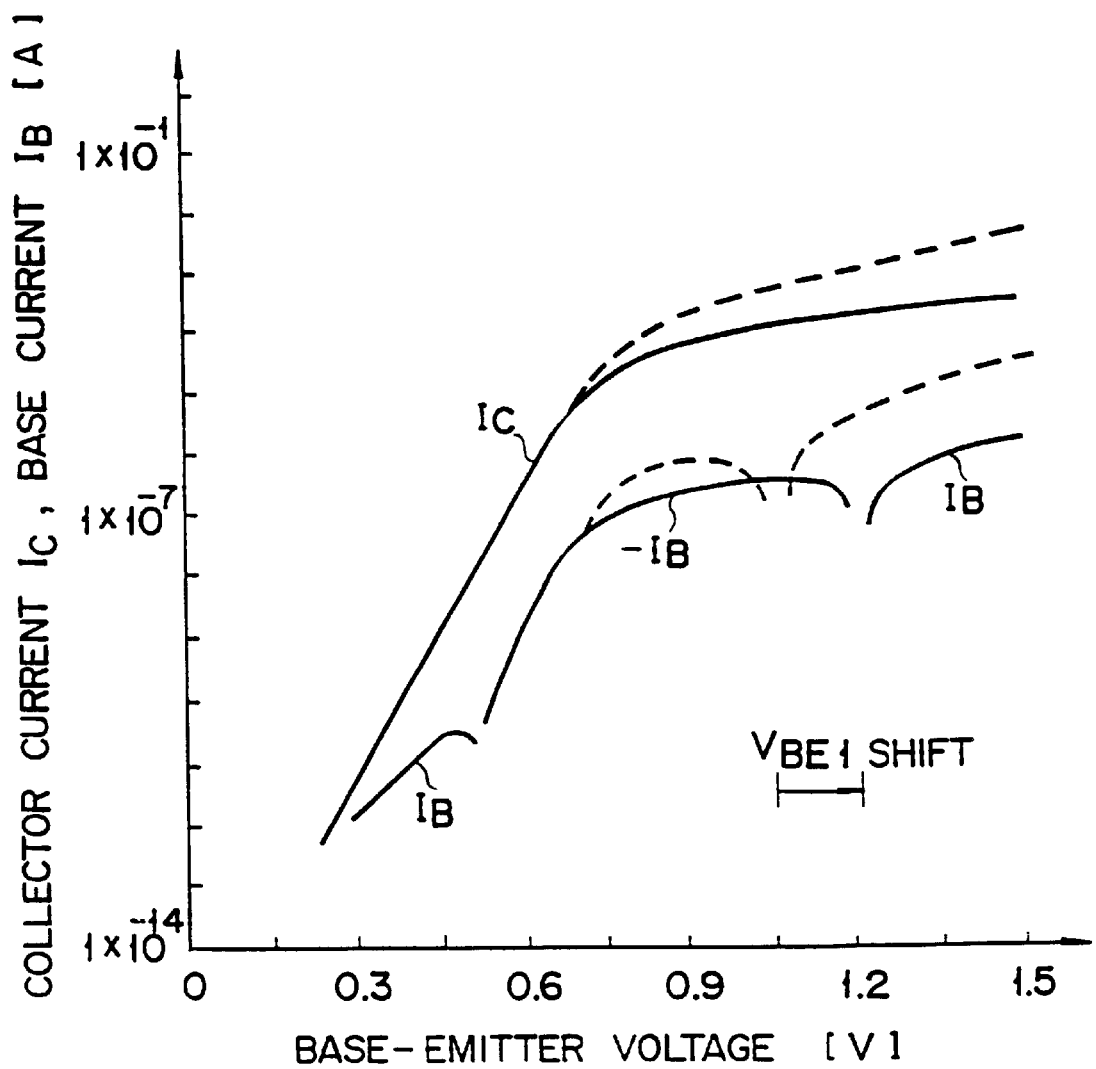
F I G. 49B

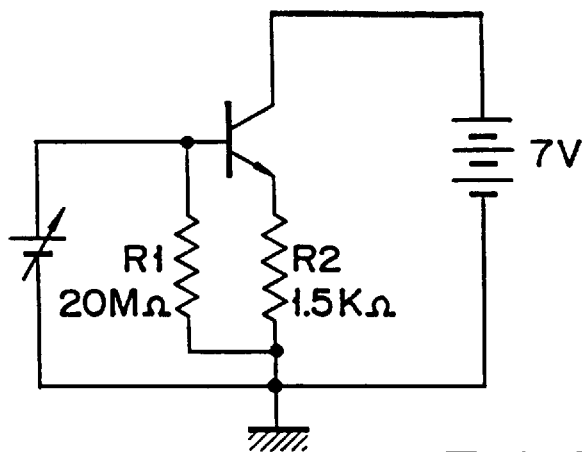
F I G. 50A
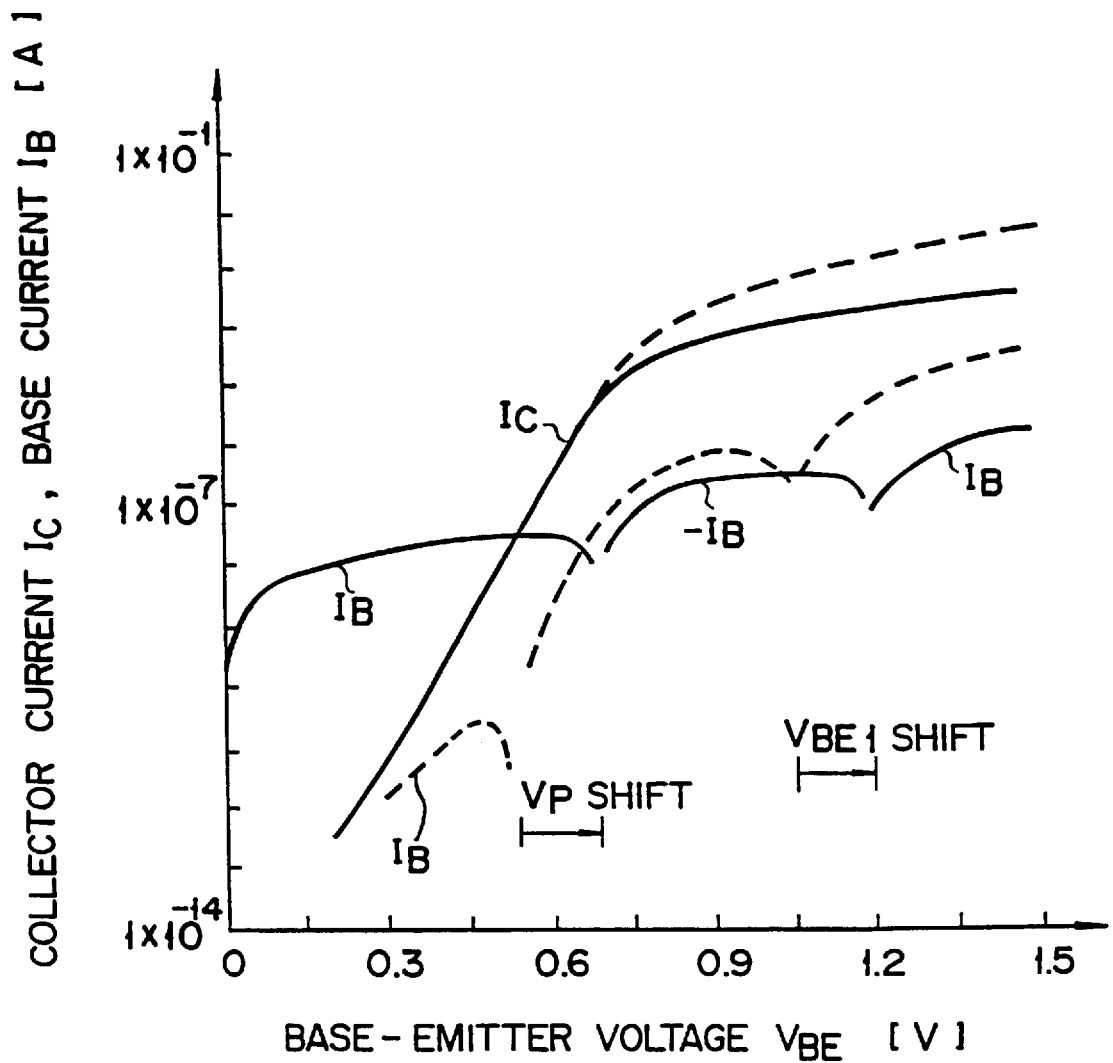
F I G. 50B

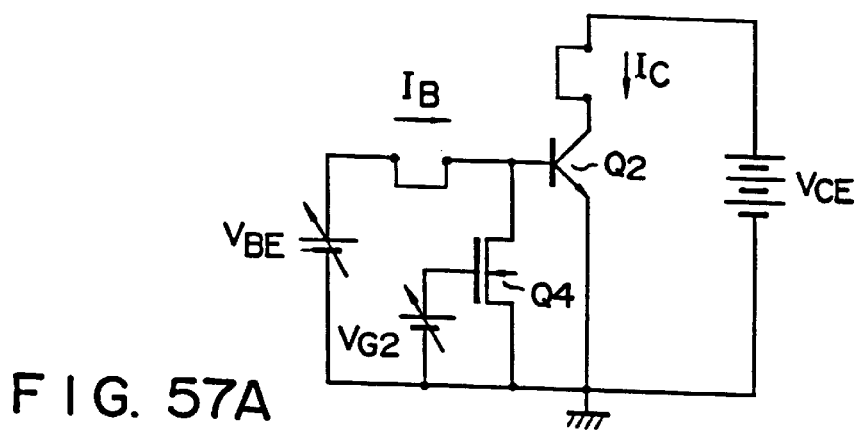
F I G. 57A
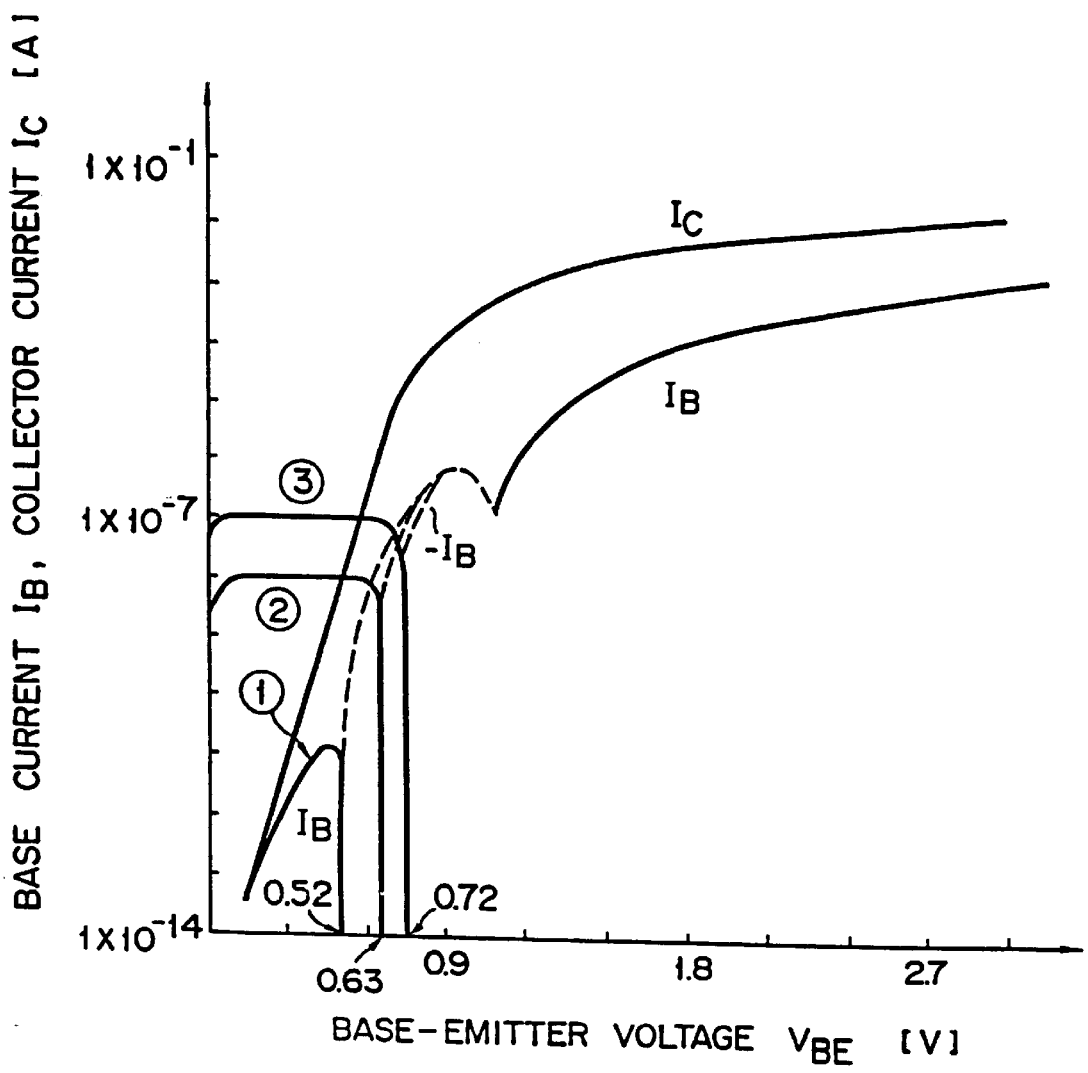
F I G. 57B

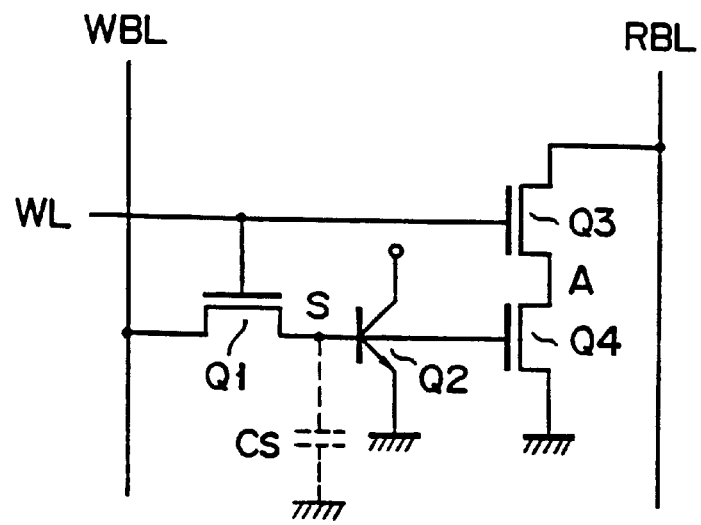
F I G. 61
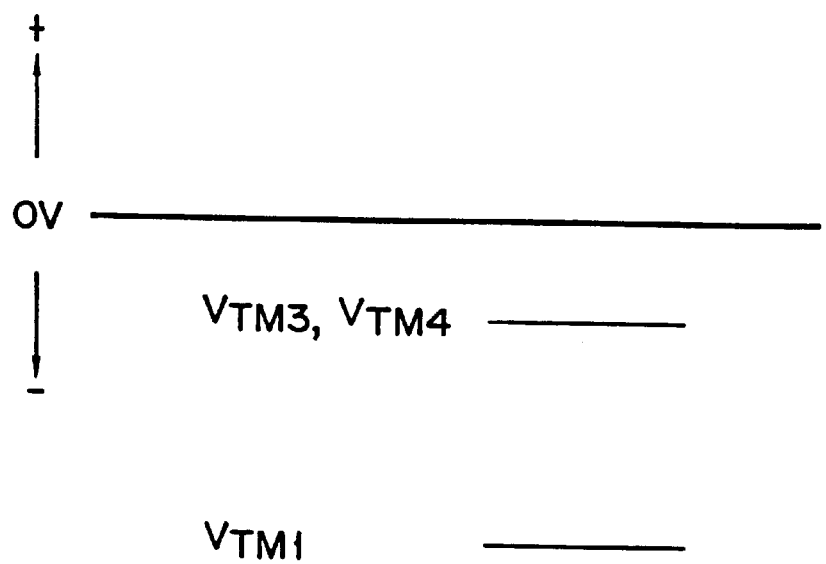
F I G. 62

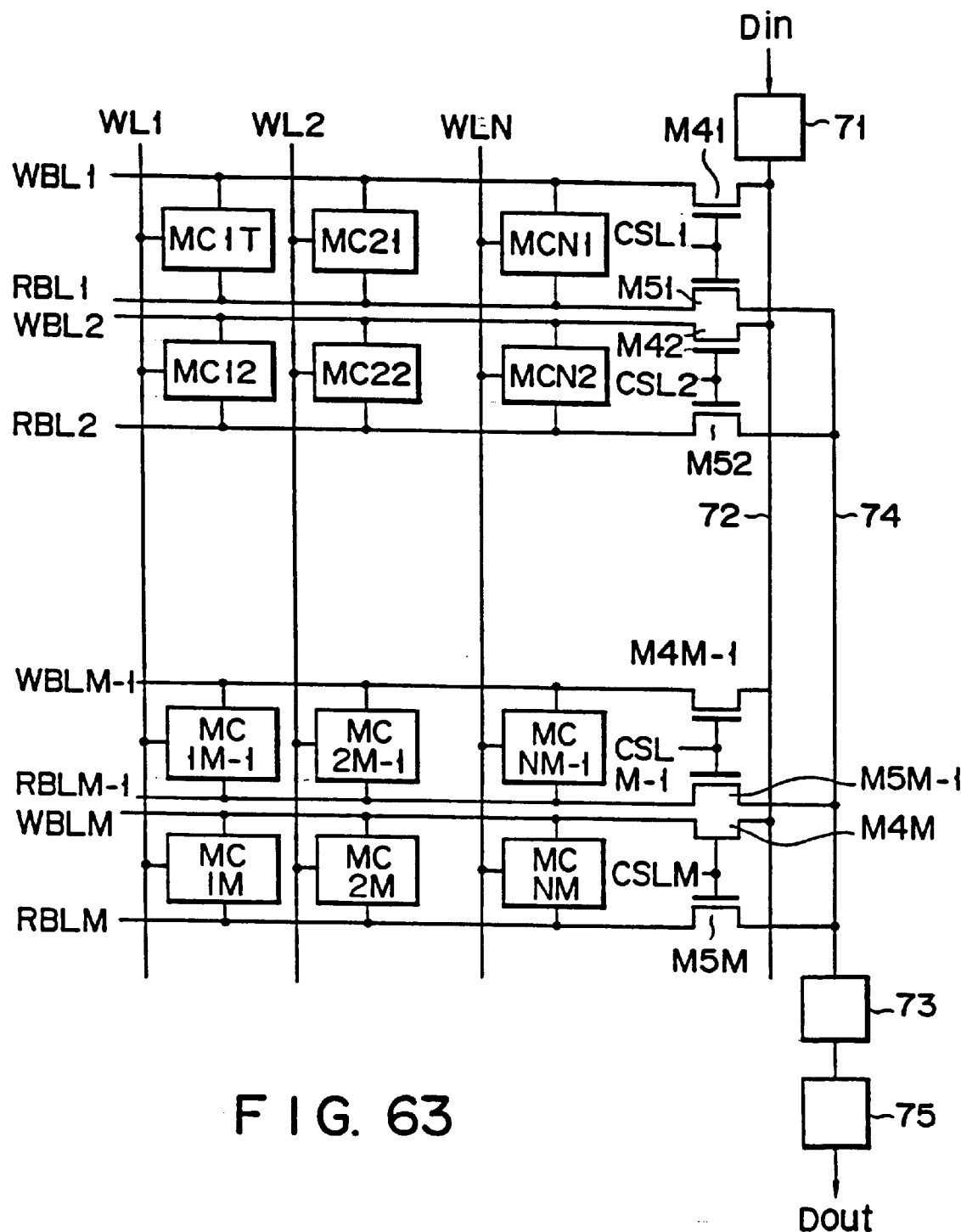
F I G. 63

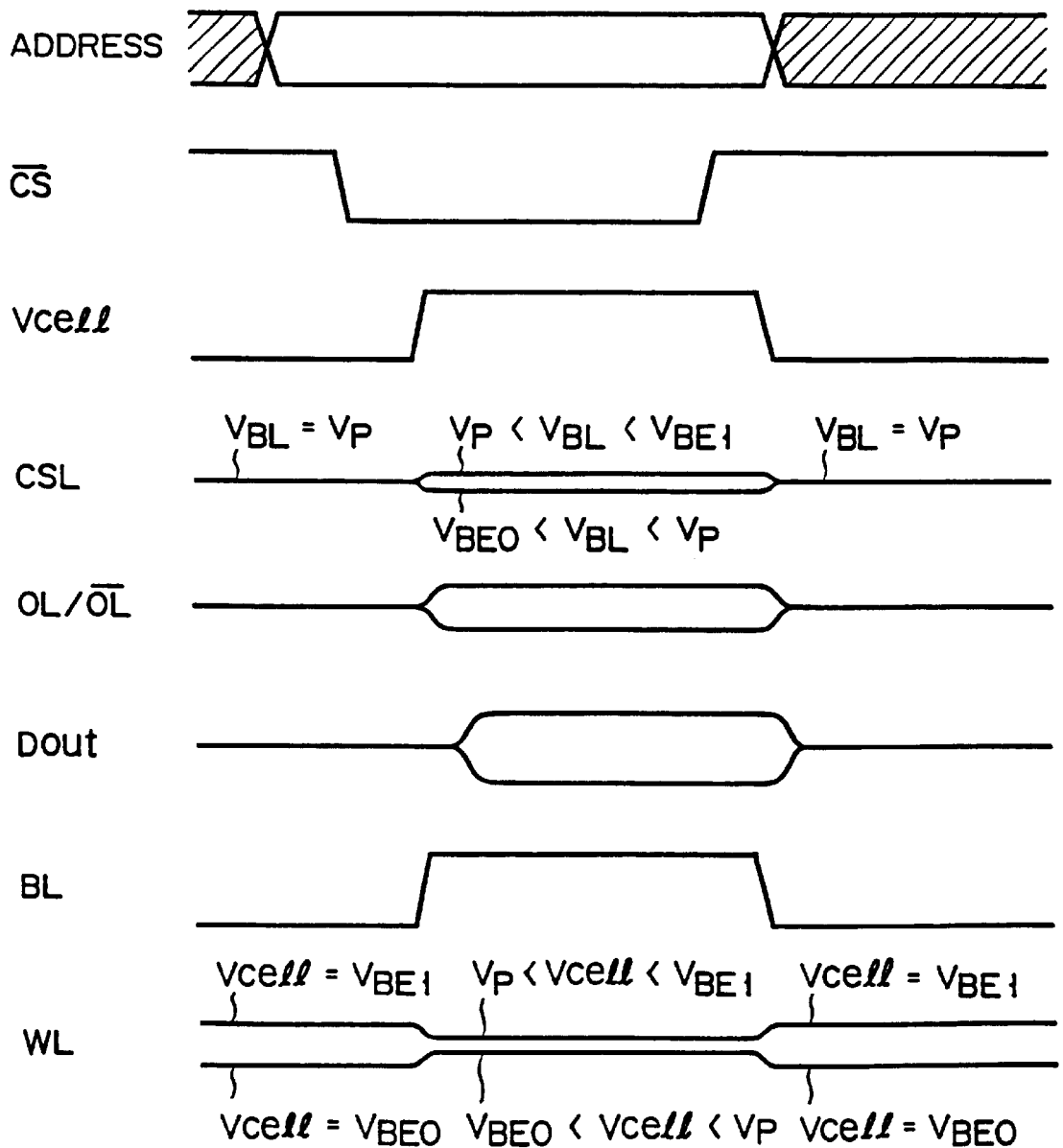
F I G. 67

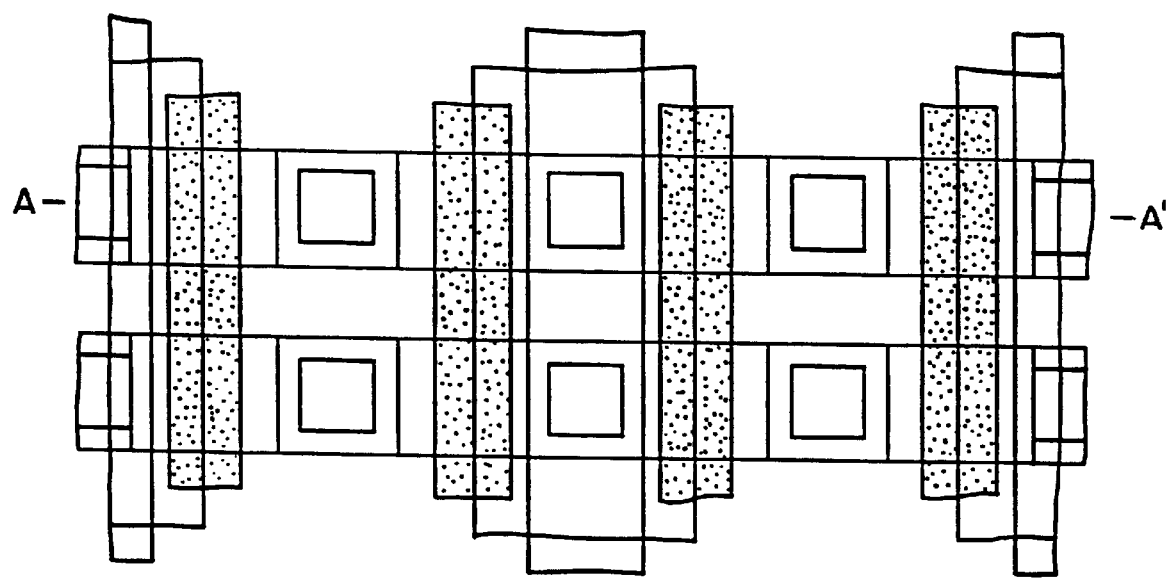
F I G. 76A
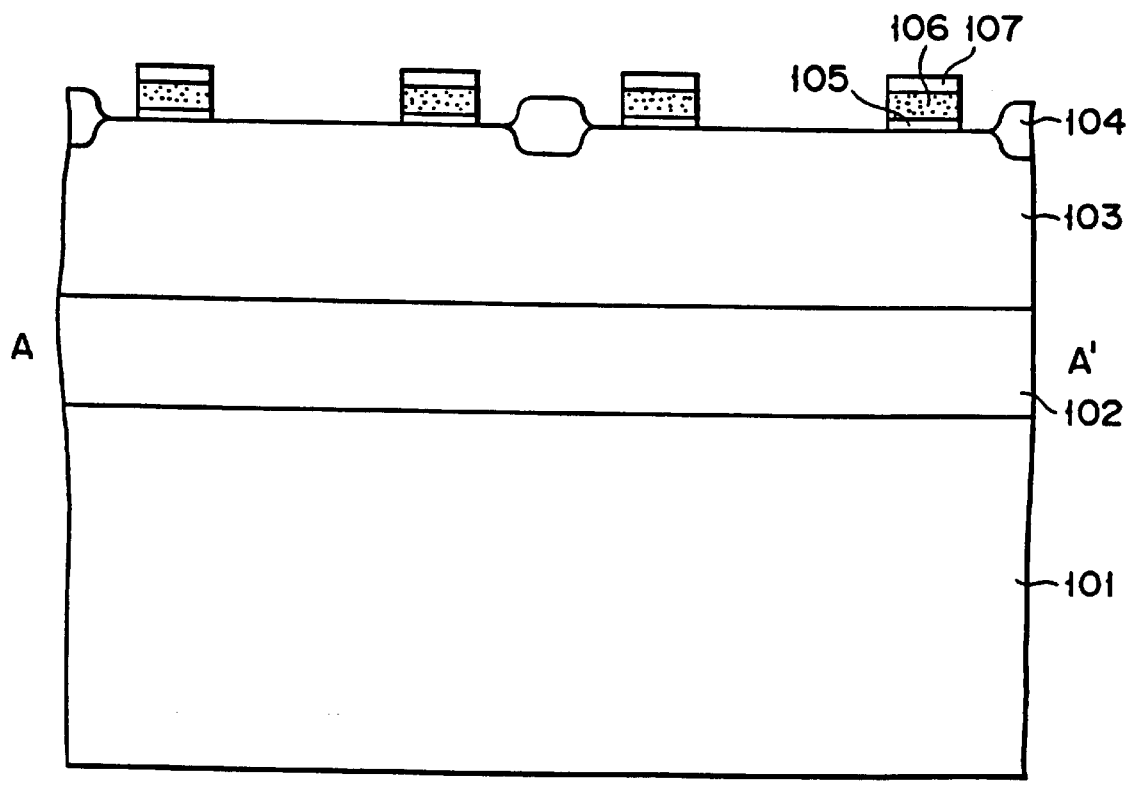
F I G. 76B

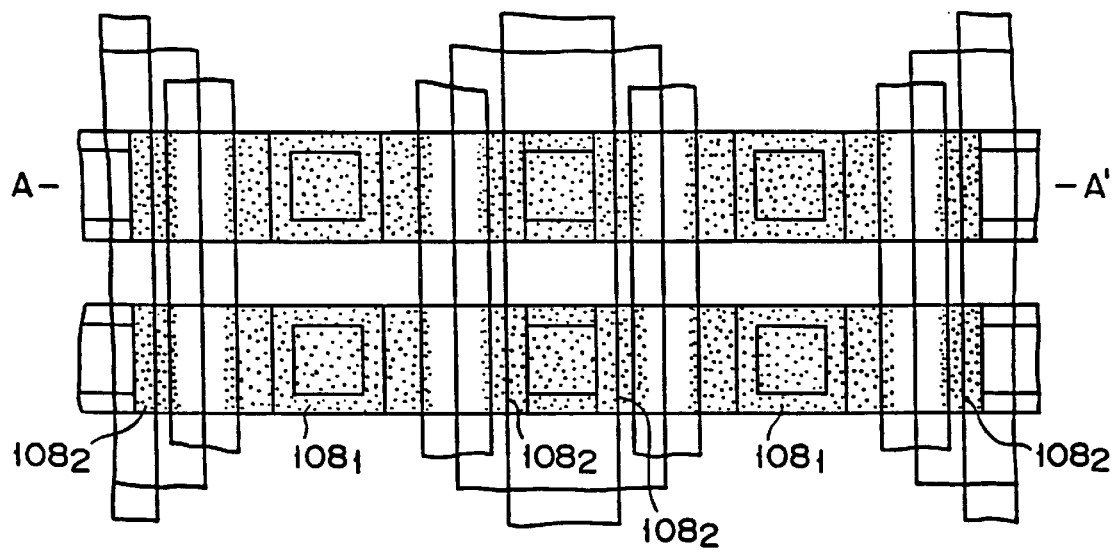
F I G. 77A
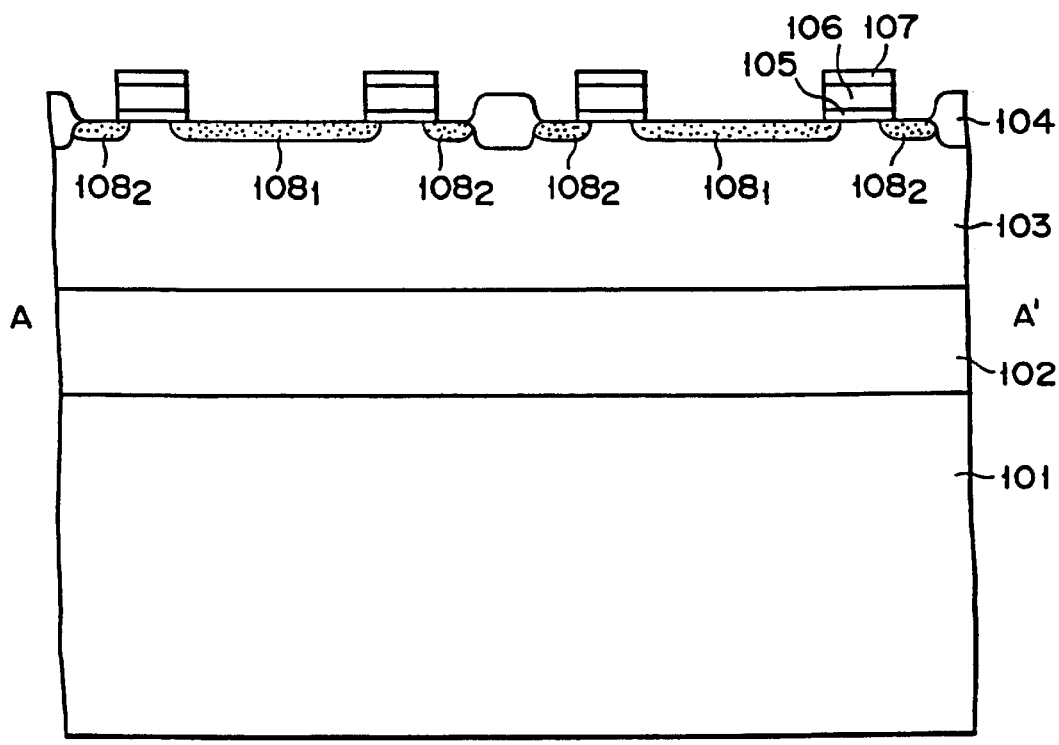
F I G. 77B

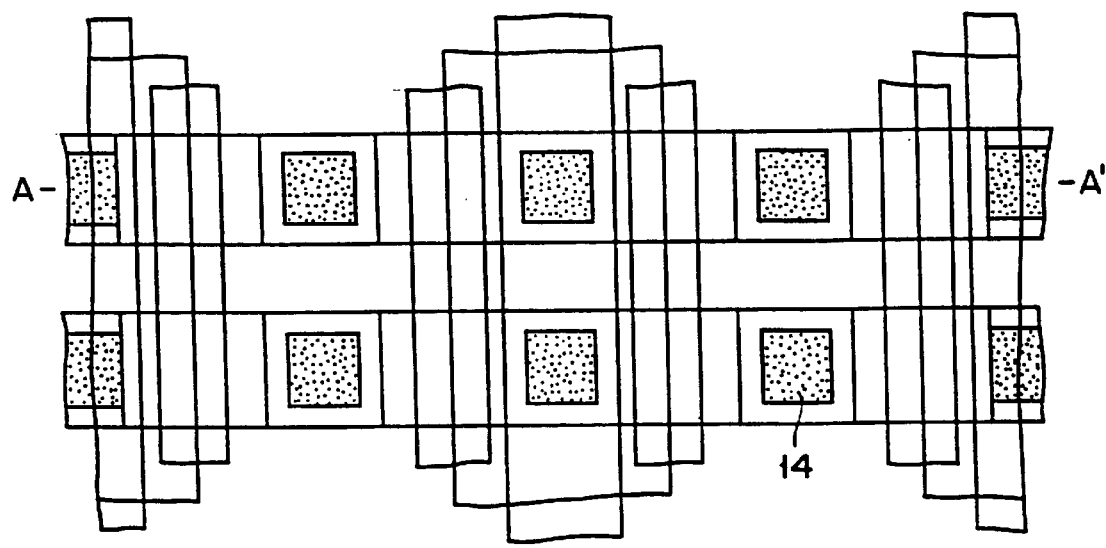
F I G. 79A
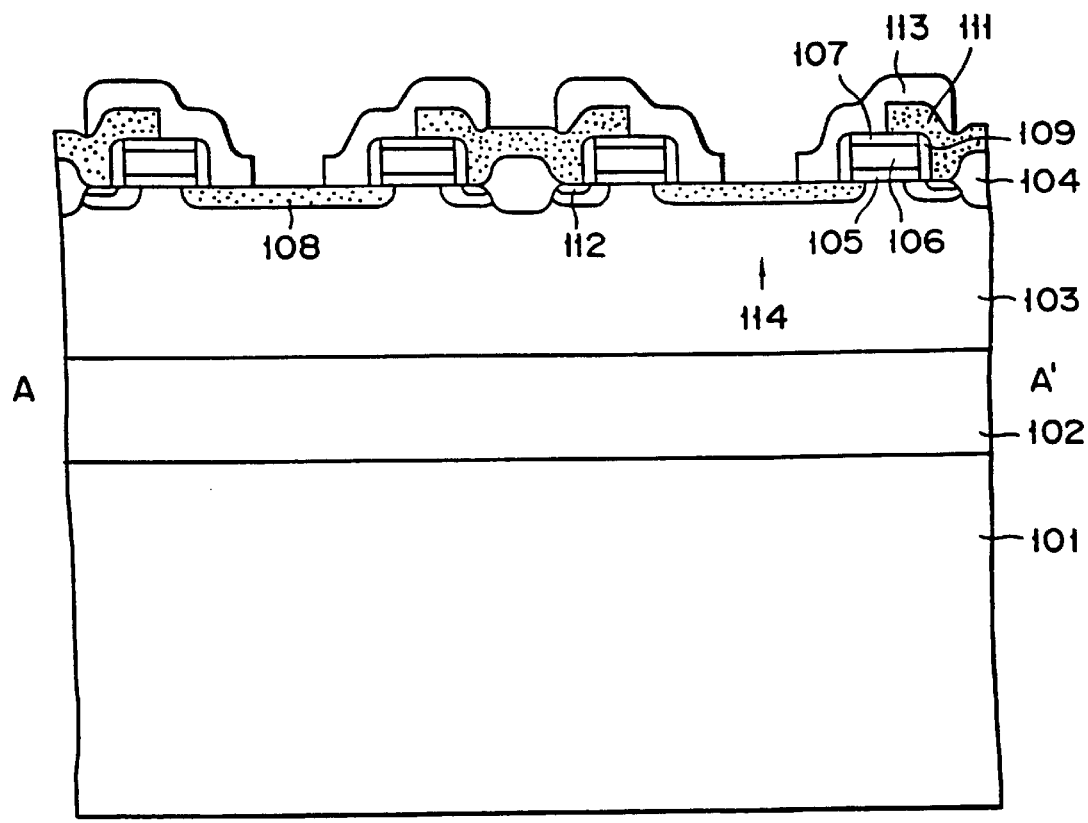
F I G. 79B

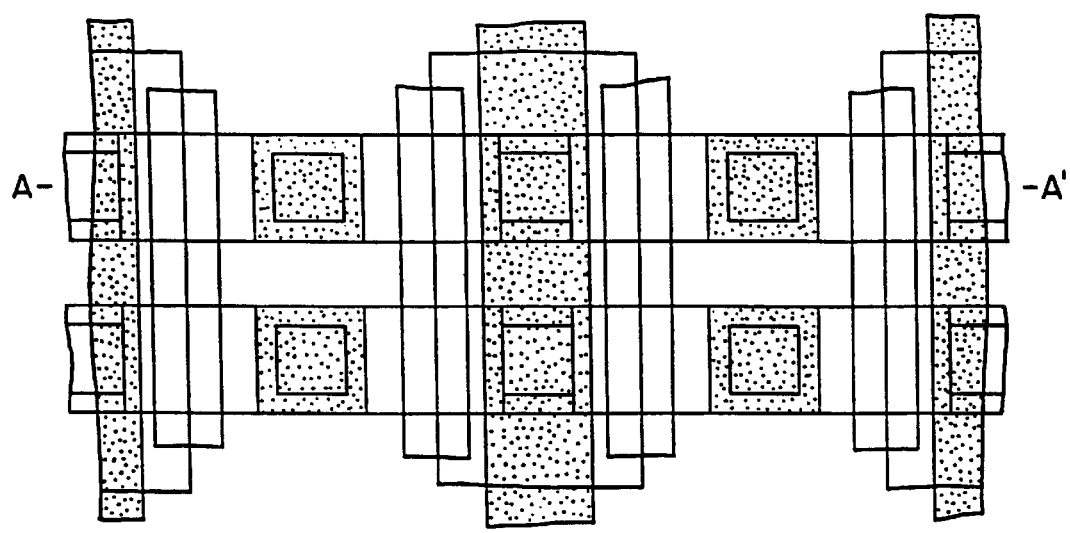
F I G. 80A
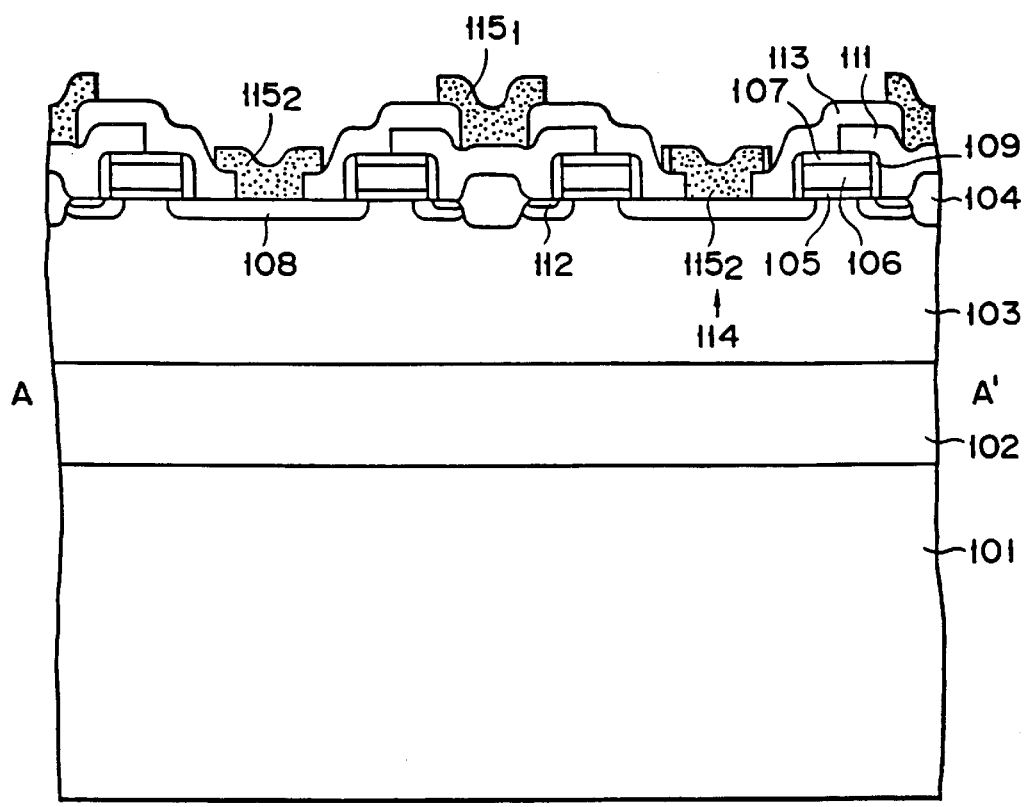
F I G. 80B

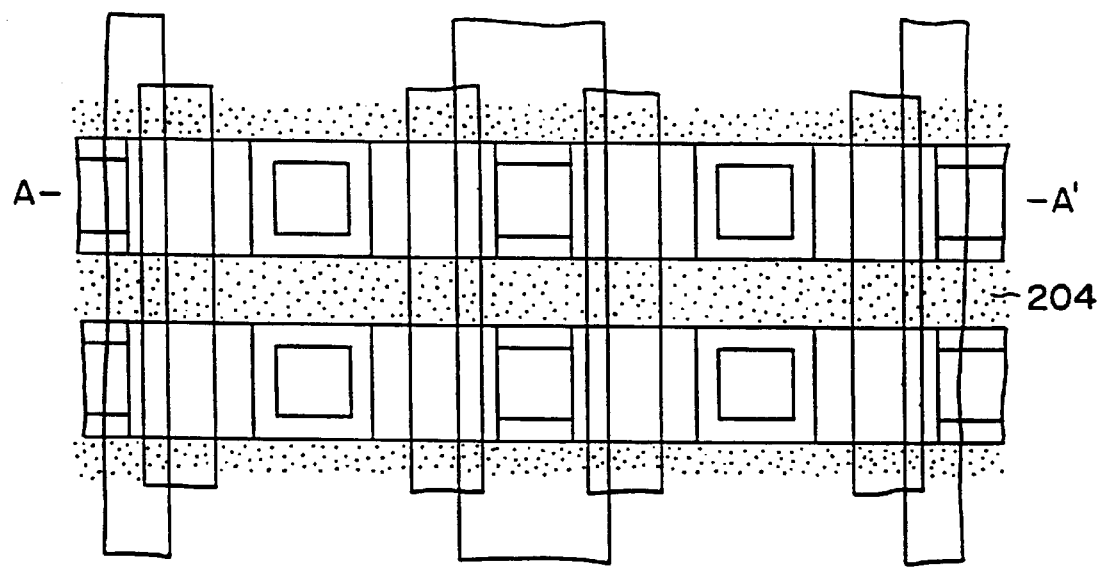
F I G. 83A
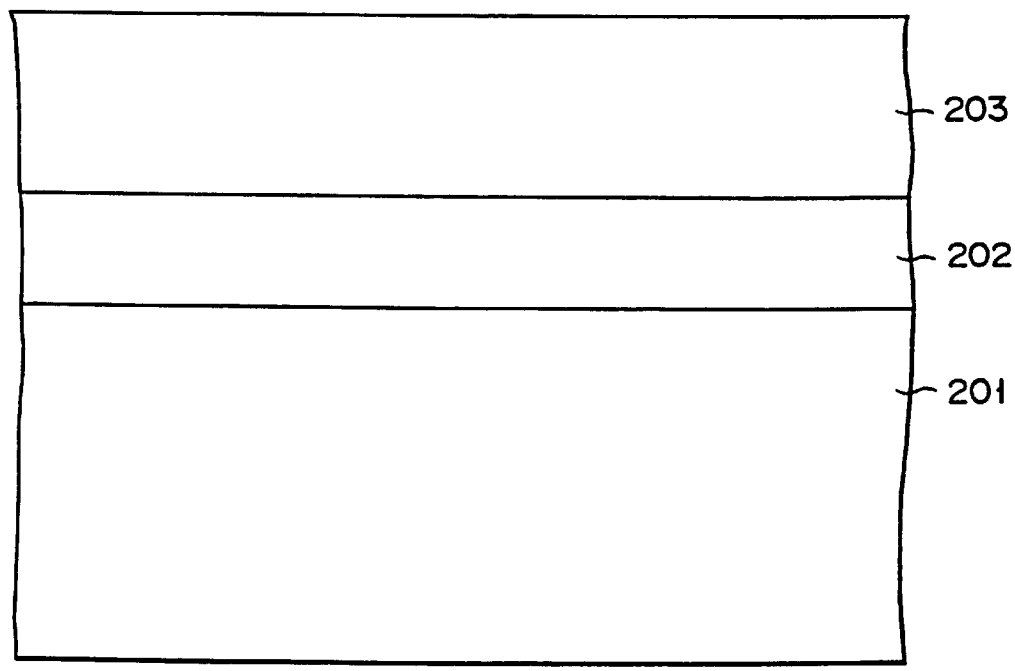
F I G. 83B

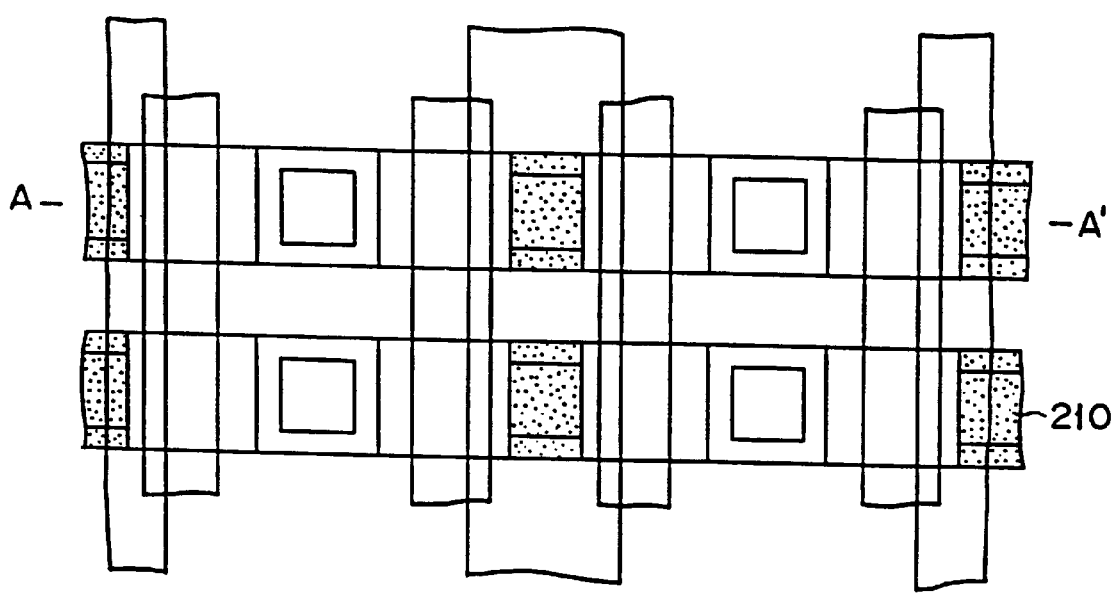
F I G. 86A
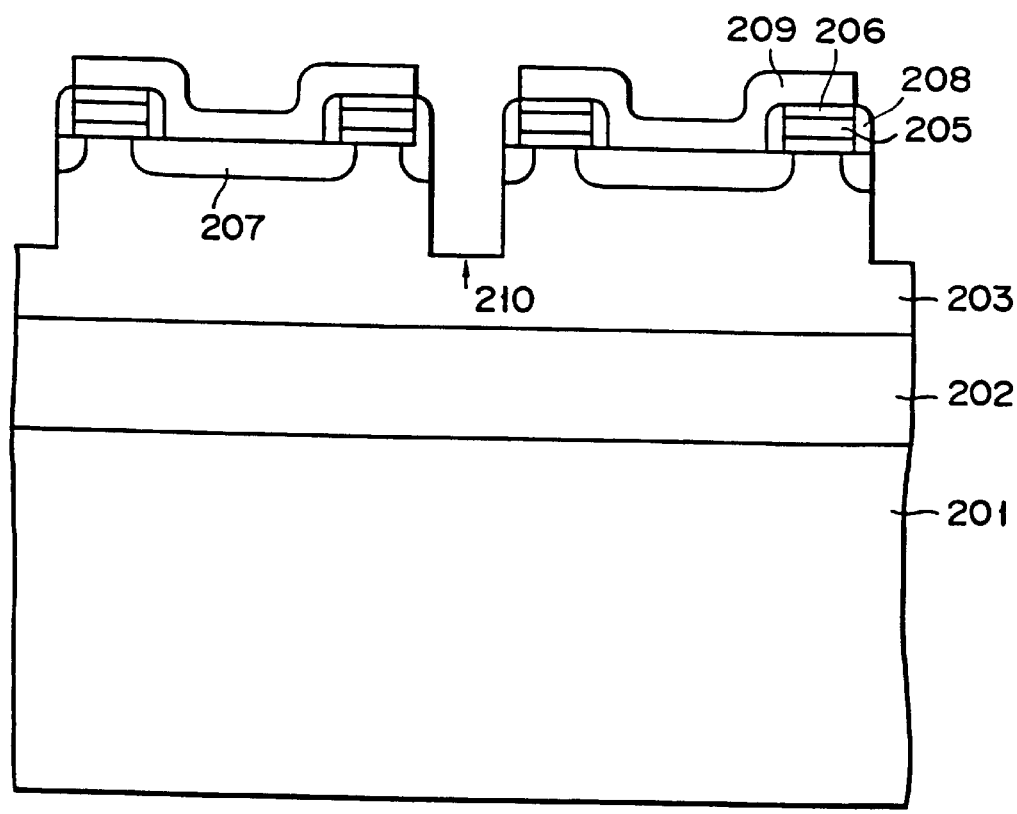
F I G. 86B

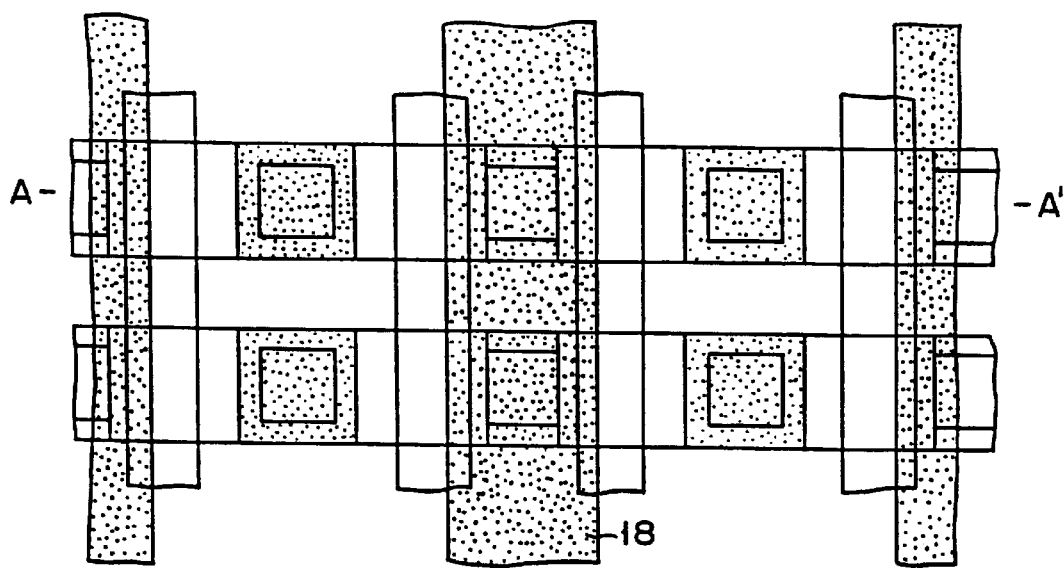
F I G. 90A
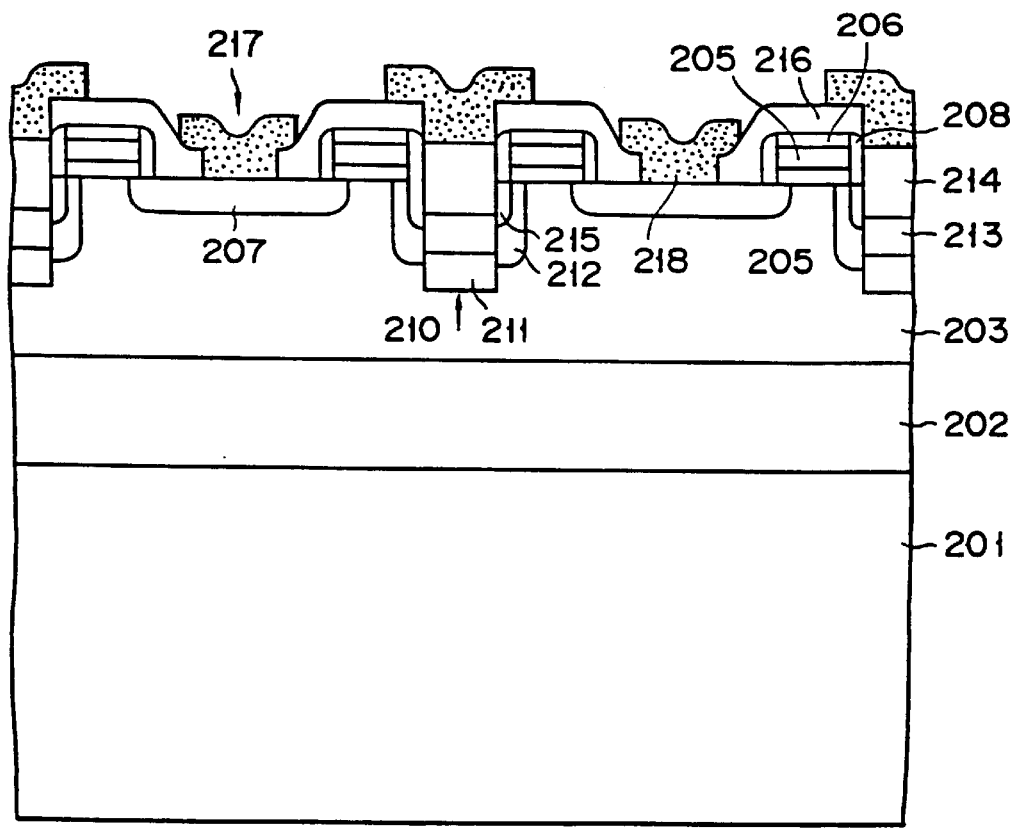
F I G. 90B

SEMICONDUCTOR DEVICE

This application is a Division of application Ser. No. 08/268,728 filed on Jun. 30, 1994, allowed, which is a continuation application of Ser. No. 08/035,205, filed on Mar. 22, 1993, abandoned, which is a continuation application of Ser. No. 07/660,982, filed Feb. 27, 1991, abandoned, which is a continuation of Ser. No. 07/293,807, filed Jan. 5, 1989, abandoned.

BACKGROUND OF THE INVENTION

1. Field of the Invention

The present invention relates to a semiconductor device using a bipolar transistor.

2. Description of the Related Art

Conventionally, a bipolar transistor has been employed as a current amplifying element which receives a base current as an input and outputs a collector current. For example, when positive collector-emitter voltage $V_{CE}$ and base-emitter voltage $V_{BE}$ ($V_{CE} > V_{BE}$) are applied to an npn bipolar transistor, collector current $I_C$ takes amplified positive values with respect to various values of base-emitter voltage $V_{BE}$, and in this case, base current $I_B$ is also positive.

Since the conventional bipolar transistor can only perform a predetermined operation, this transistor has a limited application range.

SUMMARY OF THE INVENTION

It is an object of the present invention to provide a semiconductor device using a novel bipolar transistor which can flow a negative base current in addition to a positive base current depending on a base potential.

According to the present invention, there is provided a semiconductor device using a bipolar transistor in which collector-emitter voltage $V_{CE}$ is set to satisfy condition $I_{BE} < I_{CB}$ where a forward base current in the base-emitter path is represented by $I_{BE}$ and a reverse base current in the collector-base path is represented by $I_{CB}$.

The bipolar transistor is connected to a field effect transistor (FET), and the source or drain of this FET and the base of the bipolar transistor are formed as a common region.

According to the present invention, there is provided a semiconductor device wherein the source or drain and the base of a bipolar transistor are formed adjacent to each other, and their lead electrodes are commonly provided.

According to the present invention, there is provided a semiconductor which uses a plurality of cells and a semiconductor substrate common to these cells is used as a collector region.

According to the present invention, there is provided a semiconductor device wherein a MOS transistor is formed in a base region of a bipolar transistor.

Furthermore, according to the present invention, there is provided a semiconductor device wherein in adjacent cells, their bases oppose each other through a field insulating film.

In each of the above-mentioned semiconductor devices, a collector-emitter voltage is set to be a high voltage, so that reverse base current $I_{CB}$ in the collector-base path larger than the forward base current $I_{BE}$ in the base-emitter path can flow upon a change in base potential, i.e., base-emitter voltage $V_{BE}$, and a transistor in which a base current has not only a positive region but also a negative region can be realized. The bipolar transistor and an FET can be combined to realize a semiconductor device with higher degree of integration.

BRIEF DESCRIPTION OF THE DRAWINGS

FIG. 2 is a sectional view of the bipolar transistor;

FIG. 3 is a graph showing an impurity profile of the transistor shown in FIG. 2;

FIG. 11 is a circuit diagram showing a semiconductor device using a PNP bipolar transistor;

FIG. 12 is a graph showing current characteristics in the operation of the circuit shown in FIG. 11;

FIG. 13 is a circuit diagram of a semiconductor device using two bipolar transistors according to another embodiment of the present invention;

FIG. 14 is a graph showing the relationship between input and output voltages in the circuit shown in FIG. 13;

FIG. 17 is a graph showing the relationship between input and output voltages in the circuit shown in FIG. 16;

FIG. 18 is a circuit diagram of a semiconductor circuit in which a capacitor is connected to the circuit shown in FIG. 16;

FIG. 19 is a circuit diagram of a device in which a MOS transistor is used in place of the bipolar transistor;

FIG. 20 is a circuit diagram of a device in which a diode is used in place of the bipolar transistor;

FIG. 21 is a circuit diagram of a device using two pnp bipolar transistors;

FIG. 22 is a circuit diagram of a semiconductor device to which a third transistor is added;

FIG. 23 is a graph showing the relationship between input and output voltages in the semiconductor device shown in FIG. 22;

FIG. 24A is a circuit diagram of a circuit portion of the third transistor in FIG. 22;

FIG. 24B is a graph showing the relationship between a current and a voltage in the circuit shown in FIG. 24A;

FIGS. 25A to 25D are graphs showing current characteristics corresponding to points (a) to (d) in FIG. 23, respectively;

FIG. 26 is a graph showing the relationship between the input and output voltages of a device when no third transistor is added;

FIG. 27 is a circuit diagram of a semiconductor device in which MOS transistors are used as first and third transistors;

FIG. 28 is a circuit diagram of a semiconductor device using a Schmitt trigger circuit;

FIG. 29 is a circuit diagram of a semiconductor device using a Schmitt trigger circuit using a PNP bipolar transistor;

FIG. 30 is a graph showing the relationship between the input and output voltages of the semiconductor device shown in FIG. 29;

FIG. 31 is a circuit diagram of a semiconductor device for inhibiting generation of a negative base current;

FIG. 32 is a timing chart of a voltage in the circuit of FIG. 31;

FIG. 33 is a circuit diagram of a memory to which the present invention is applied;

FIG. 34 is a graph showing the relationship among a collector current, a base current, and a base-emitter voltage;

FIG. 35 is a circuit diagram of a memory including a memory array and a peripheral circuit;

FIG. 36 is a circuit diagram of a sub sense amplifier;

FIG. 37 is a circuit diagram of a main sense amplifier;

FIG. 38 is a circuit diagram of a dummy cell;

FIG. 39 is a timing chart for explaining a read operation of the memory shown in FIG. 35;

FIG. 40 is a timing chart for explaining a write operation of the memory shown in FIG. 35;

FIG. 44 is a plan view of a memory cell array;

FIG. 45 is a sectional view of the memory cell array taken along a line A–A' in FIG. 44;

FIG. 46 is a circuit diagram of a memory cell;

FIG. 47 is a graph showing voltage-current characteristics of the memory cell shown in FIG. 46;

FIG. 49A is a circuit diagram of another memory cell with a resistor;

FIG. 49B is a graph showing voltage-current characteristics of the memory cell shown in FIG. 49A;

FIG. 50A is a circuit diagram of still another memory cell with a resistor;

FIG. 50B is a graph showing voltage-current characteristics of the memory cell shown in FIG. 50A;

FIG. 57A is a circuit diagram of another voltage holding circuit utilizing the circuit shown in FIG. 55;

FIG. 57B is a graph showing voltage-current characteristics of the circuit shown in FIG. 57A;

FIG. 61 is a circuit diagram of a memory cell using a MOS transistor;

FIG. 62 is a graph showing the relationship of threshold values of transistors used in FIG. 61;

FIG. 63 is a circuit diagram of a memory using the memory cell shown in FIG. 61;

FIG. 67 is a timing chart showing a write operation of the SRAM shown in FIG. 66;

FIGS. 75A to 82B are plan views and sectional views of semiconductor structures in the steps of manufacturing an SRAM employing the present invention;

FIGS. 83A to 92C are plan views and sectional views of semiconductor structures in the steps of manufacturing another SRPM employing the present invention.

DETAILED DESCRIPTION OF THE PREFERRED EMBODIMENTS

Figure 1:
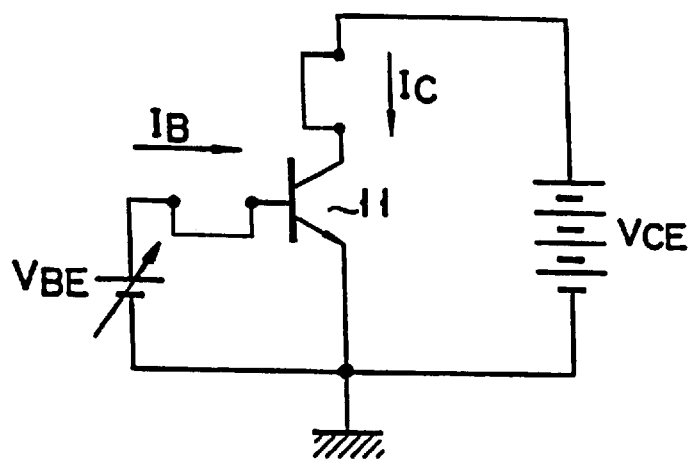
FIG. 1 is a circuit diagram of a semiconductor device using an npn bipolar transistor according to an embodiment of the present invention.

According to a the bipolar transistor shown in FIG. 2, $n^+$-type buried layer 22 for decreasing a collector resistance is formed on the surface of $p^-$-type silicon substrate 21. $P^-$-type epitaxial silicon layer 23 is formed on the surface of $p^-$-type silicon substrate 21. Phosphorus is doped in $p^-$-type epitaxial silicon layer 23 to form n-type well layer 24. Field oxide film 25 is formed on the surfaces of silicon layer 23 and n-type well layer 24, and collector lead layer 26 extending to $n^+$-type buried layer 22 is formed through one opening of field oxide film 25. $P^-$-type base region 27 is formed in n-type well layer 24 through the other opening of film 25. 2 $\mu m \times 5$ $\mu m$ $n^+$-type emitter region 28 is locally formed in $p^-$-type base region 27, and emitter polyside 29 is formed thereon. $P^+$-type layer 30 is self-aligned with emitter polyside 29 in $p^-$-type base region 27, and $n^+$-type layer 31 is formed on the surface of collector lead layer 26.

The above-mentioned semiconductor structure is covered with silicon oxide film 32, and collector, base, and emitter electrodes 35, 36, and 37 formed of Al—Si 34 are formed through Ti/TiN film 33 in contact holes formed in silicon oxide film 32.

In the manufacture of the semiconductor device described above, Sb is thermally diffused in p⁻-type silicon substrate 21 in an $Sb_2O_3$ atmosphere at 1,250° C. for 25 minutes, thereby forming n⁺-type buried layer 22. The resultant structure is then annealed in an $SiH_2Cl_2+B_2H_6$ atmosphere at 1,150° C. for 10 minutes, thereby growing p⁻-type epitaxial silicon layer 23. Thereafter, phosphorus is ion-implanted in silicon layer 23 at an acceleration voltage of 160 keV and a dose of $5\times10^{12}$ cm⁻², and the resultant structure is annealed in an $N_2$ atmosphere at 1,100° C. for 290 minutes. Thus, phosphorus is diffused in silicon layer 23, thereby forming n-type well layer 24.

Field oxide film 25 is formed on the surface of the above-mentioned semiconductor structure. Thereafter, phosphorus ions (p⁺) are implanted in n-type well layer 24, thereby forming n⁺-type collector lead layer 26. Furthermore, boron ions (B⁺) are implanted in n-type well layer 24 at an acceleration voltage of 30 keV and a dose of $5\times10^{13}$ cm⁻², thus forming p⁻-type base region 27. Thereafter, a thin silicon oxide film is formed on the surface of the semiconductor structure, and an opening is formed in the silicon oxide film. A 500-Å thick polysilicon film is deposited on base region 27 through this opening. Arsenic ions (As⁺) are implanted in the polysilicon film at an acceleration voltage of 60 keV and a dose of $5\times10^{15}$ cm⁻². An MoSi film is deposited on the surface of the polysilicon film and is patterned, thereby forming emitter polyside 29.

Boron ions (B⁺) are implanted in base region 27 to form p⁺-type layer 30. Arsenic ions (As⁺) are implanted in collector lead layer 26 to form n⁺-type layer 31. Thereafter, silicon oxide film 32 is deposited on the surface of the semiconductor structure formed in the above steps, and contact holes are formed in silicon oxide film 32. Ti/TiN film 33 is deposited on the bottom portion of each contact hole. Al—Si 34 is deposited on the surface of the semiconductor structure thus formed, and is patterned to form collector, base, and emitter electrodes 35, 36, and 37.

FIG. 3 shows an impurity profile of an npn bipolar transistor of the semiconductor device with the above structure.

The emitter has an impurity concentration of $1.5\times10^{20}$ cm⁻³ and a junction depth of 0.15 μm from the surface of p⁻-type epitaxial silicon layer 23. The base has an impurity concentration of $3\times10^{18}$ cm⁻³ and a junction depth of 0.3 μm, and the collector has an impurity concentration of about $4\times10^{16}$ cm⁻³ in the well region.

Figure 4:
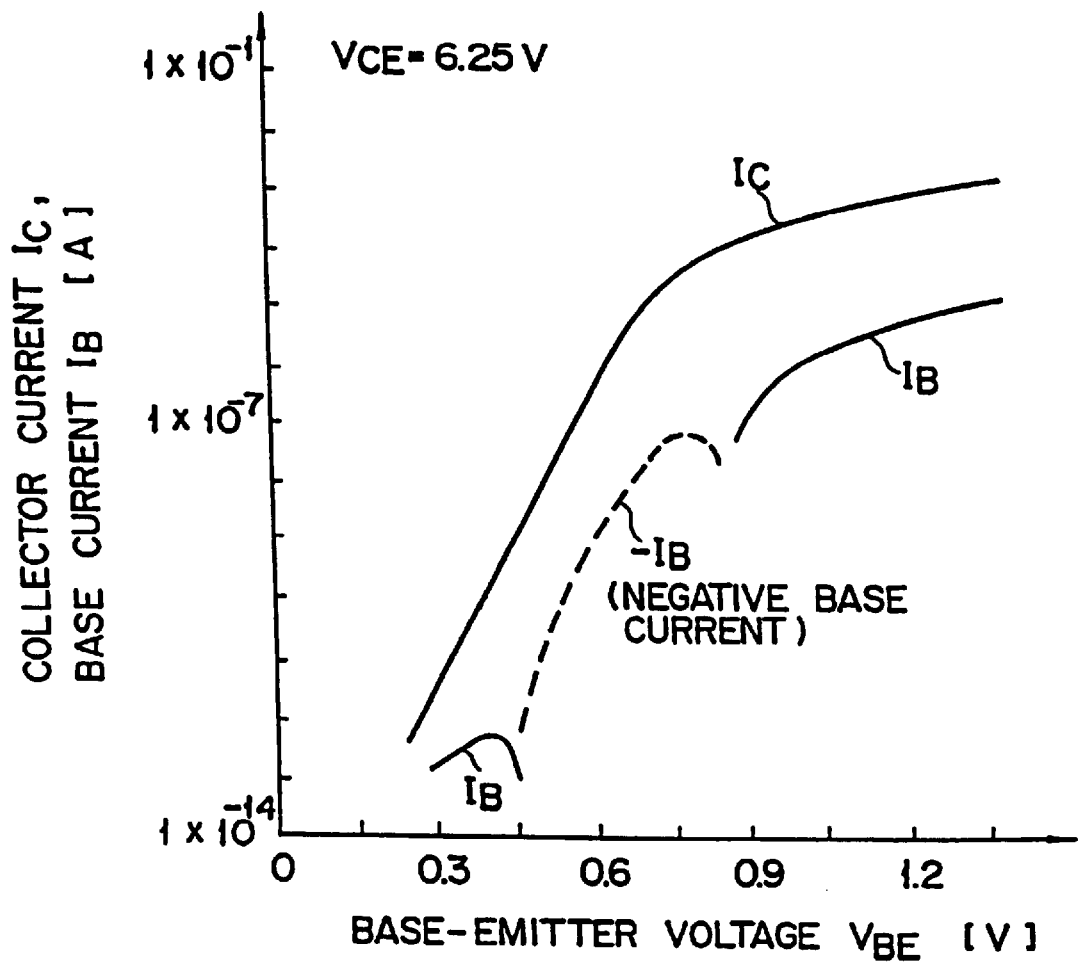
FIG. 4 is a graph showing characteristics of a base current when $V_{CE} = 6.25$ V.

With the semiconductor device, an npn bipolar transistor circuit shown in FIG. 1 can be formed. FIG. 4 shows collector current $I_C$ and base current $I_B$ with respect to base-emitter current $V_{BE}$ when a base-emitter voltage is represented by $V_{BE}$ and a collector-emitter voltage is represented by $V_{CE}$ in the circuit shown in FIG. 1.

FIG. 4 shows current characteristics when collector-emitter voltage $V_{CE}$=6.25 V. If $0 \text{ V} \leq V_{BE} < 0.45$ V, positive base current $I_B$ flowing into the base from a positive terminal of a power source of base-emitter voltage $V_{BE}$ exhibits characteristics represented by a solid curve. If $0.45 \text{ V} < V_{BE} < 0.87$ V, negative base current $-I_B$ flowing from the base to the positive terminal of the power source of base-emitter voltage $V_{BE}$ exhibits characteristics represented by a broken curve. If $0.87 \text{ V} < V_{BE}$, positive base current $I_B$ flowing from the $V_{BE}$ power source exhibits characteristics represented by the solid curve again.

Figure 5:
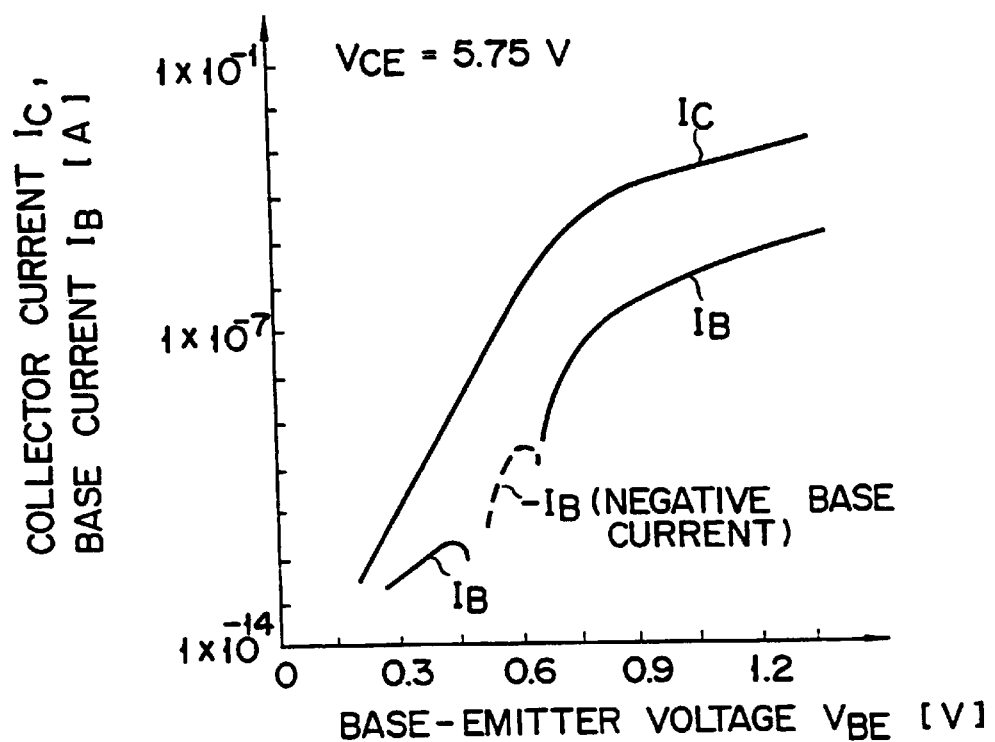
FIG. 5 is a graph showing characteristics of a base current when $V_{CE} = 5.75$ V.

FIG. 5 shows collector and base current characteristics when collector-emitter voltage $V_{CE}$=5.75 V. As can be seen from FIG. 5, the range of base-emitter voltage $V_{BE}$ making base current $I_B$ negative is $0.50 < V_{BE} < 0.66$ V.

Figure 6:
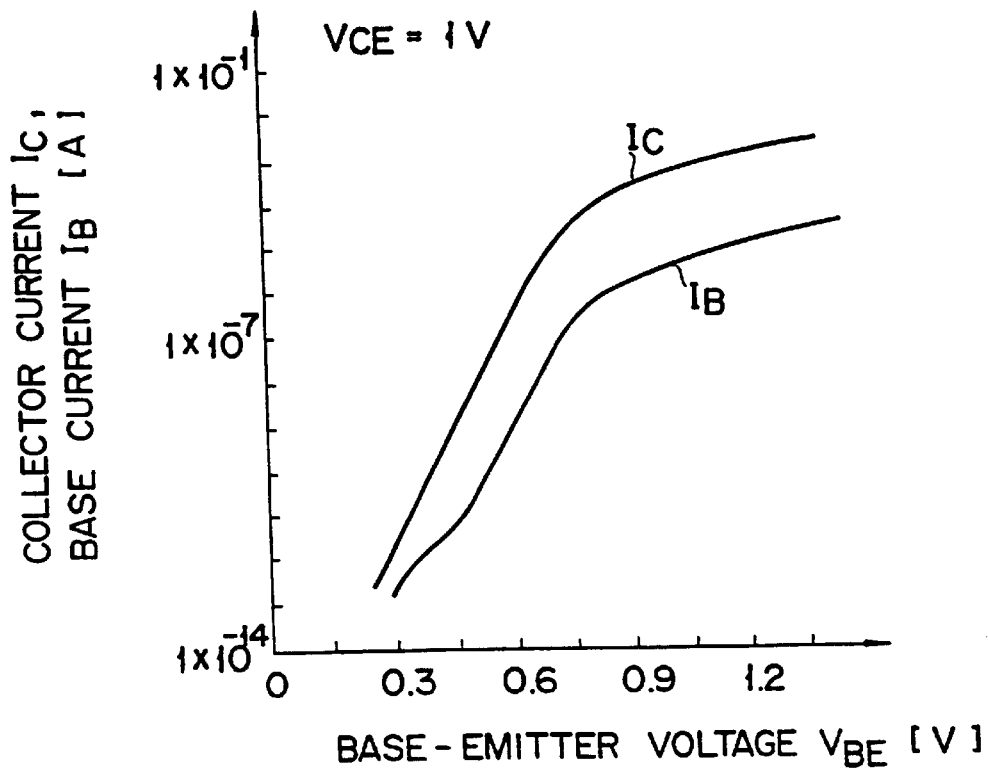
FIG. 6 is a graph showing characteristics of a base current when $V_{CE} = 1.0$ V.

FIG. 6 shows collector and base current characteristics when collector-emitter voltage $V_{CE}$=1 V. In this case, no negative base current is observed in the entire region ($V_{BE} \geq 0$) of base-emitter voltage $V_{BE}$, and base current $I_B$ is always positive.

A state wherein the negative base current flows will be described below with reference to FIG. 7.

The negative current is caused depending on the relationship between forward base current $I_{BE}$ (represented by $I_{BF}$ in FIG. 7 since it flows in a forward direction) flowing from the base to the emitter, and reverse base current $I_{CB}$ (represented by $I_{BR}$ in FIG. 7 since it flows in a reverse direction) in a collector-base path formed by carriers generated by impact ionization.

More specifically, if $|I_{BE}| > |I_{CB}|$, the base current becomes positive base current $I_B$, as observed in the ranges of 0 $V \leq V_{BE} < 0.45$ V and $0.87 \text{ V} < V_{BE}$ in FIG. 4. If $|I_{BE}| < |I_{CB}|$, the base current becomes negative base current $-I_B$, as observed in the range of $0.45 \text{ V} < V_{BE} < 0.87$ V.

When electrons injected from the emitter enter a depletion layer of the base-collector junction, these electrons produce electron-hole pairs by impact ionization since the collector voltage becomes a large voltage in a direction of avalanche breakdown. The produced electrons and holes are drifted toward the collector and base, respectively, by an electric field across the base and the collector. Positive base current $I_{BF}$ from the base to the emitter is limited by fixed base-emitter voltage $V_{BE}$, so that the holes drifted to the base form negative base current $I_{BR}$. As a result, if $I_{BR}$ is larger than $I_{BF}$, the reverse base current is observed. On the other hand, when the reverse base current appears, the produced electrons slightly contribute to the magnitude of the collector current since their electron current is smaller than that injected from the emitter. This state will be explained using the following relations.

In the Ebers-Moll model, in a normal transistor, collector current $I_{CO}$ and base current $I_{BF}$ are represented by relations (1) and (2):

$$I_{CO} = \alpha F \cdot I_{ES}\{\exp(qV_{BE}/kt)-1\} - I_{CS}\{\exp(qV_{BC}/kT)-1\} \quad (1)$$

$$I_{BF} = (1-\alpha F)I_{ES}\{\exp(qV_{BE}/kT)-1\} - (1-\alpha R)I_{CS}\{\exp(qV_{BC}/kT)-1\} \quad (2)$$

where $I_{ES}$ is the reverse saturation current of the emitter-base junction; $I_{CS}$ is the reverse saturation current of the collector-base junction; αF is the ratio of a current component reaching the collector of the current flowing across the emitter-base junction; αR is the ratio of a current component reaching the emitter of the current flowing across the collector-base junction; k is the Boltzmann constant; T is the absolute temperature; and q is the charge amount. When collector-base current $V_{CE}$ is high and impact ionization in the base-collector PN junction cannot be neglected, collector current $I_C$ is represented by the following relation:

$$I_C = M I_{CO} \quad (3)$$

$$M = 1/\{1-(V_{CB}/BV_{CBO})n\} \quad (4)$$

where $I_{CO}$ is the collector current when impact ionization is neglected; n is a coefficient; and $BV_{CBO}$ is the emitter-open base-collector breakdown voltage.

Figure 7:
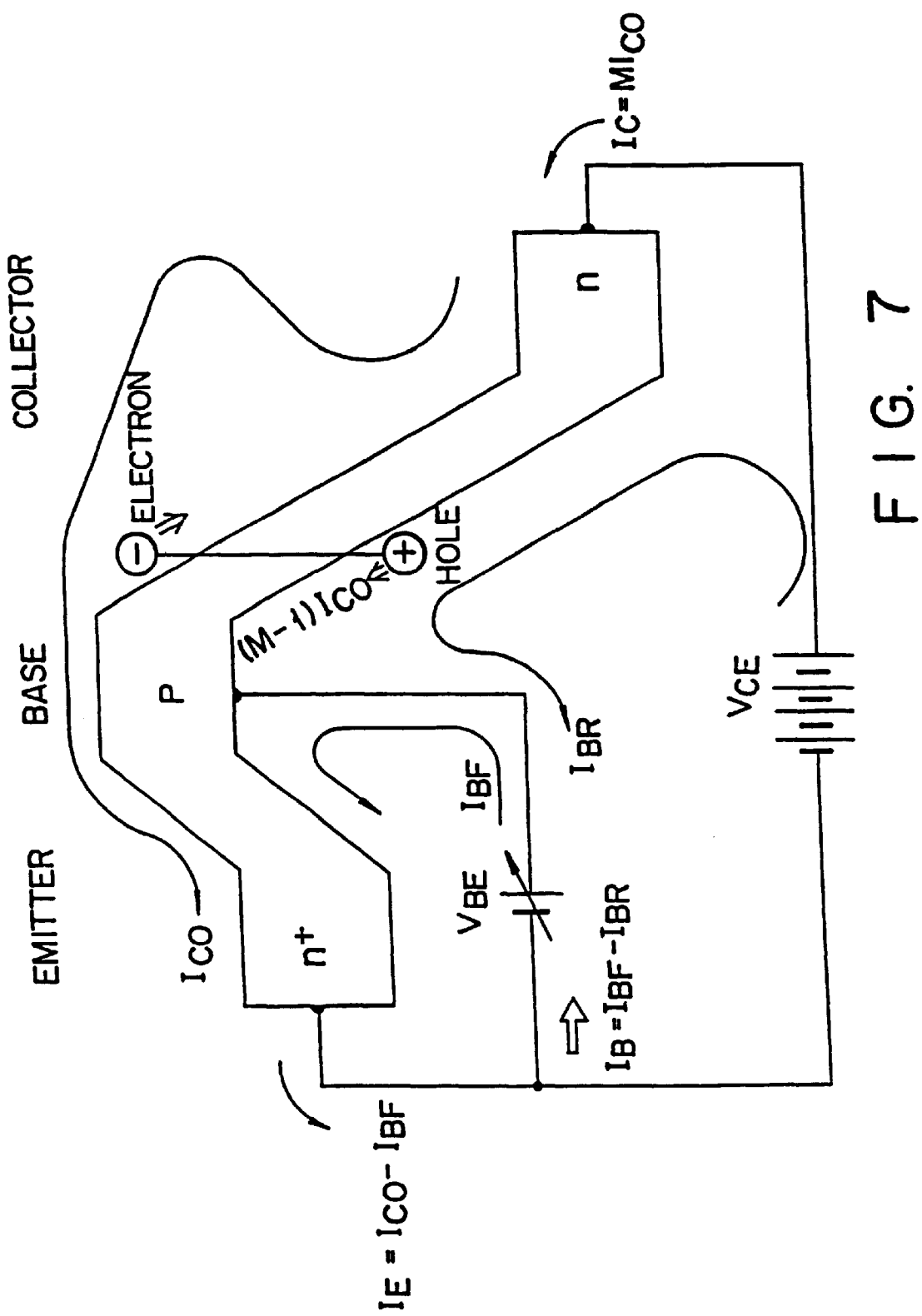
FIG. 7 is a circuit diagram for explaining the operation of FIG. 1.

As shown in FIG. 7, holes produced by impact ionization flow into the base due to the presence of the electric field, and become reverse base current $I_{BR}$.

Therefore, $I_{BR}$ can be obtained by the following relation:

$$I_{BR}=(M-1)I_{CO} \qquad (5)$$

More specifically, base current $I_B$ can be represented by a difference between forward base current $I_{BF}$ and reverse base current $I_{BR}$ as follows:

$$I_B = I_{BF} - I_{BR} = I_{BF} - (M-1)I_{CO} \qquad (6)$$

$$= \{1 - (M-1)hFE\}I_{BF}$$

Note that emitter current $I_E$ is represented by $I_E=I_{CO}+I_{BE}$. In relation (6), hFE represents a current gain (hFE=$I_{CO}/I_{BF}$).

Note that this operation also applies to a pnp bipolar transistor as well as the npn bipolar transistor.

The bipolar transistor providing the negative base current has a new application field. For example, the transistor can be applied to a flip-flop known as a voltage holding device. However, since the flip-flop is constituted by six elements, a problem of high integration is posed.

In the bipolar transistor shown in FIG. 1, assuming that a capacitive load is present between the base and emitter, if base voltage VBE falls in the range of 0 V$\leq V_{BE}$<0.45 V, charges accumulated in the load flow out from the base toward the emitter. Therefore, voltage $V_{BE}$ across the load is decreased and comes closer to 0 V. On the other hand, if voltage $V_{BE}$ falls in the range of 0.45 V<$V_{BE}$<0.87 V, since a charges are accumulated in the load by the reverse base current, voltage $V_{BE}$ across the load is increased and approaches 0.87 V. If $V_{BE}$>0.87 V, the potential of the load flows out from the base toward the emitter by the positive base current. Thus, voltage $V_{BE}$ across the load is decreased and also comes closer to 0.87 V. As described above, since voltage $V_{BE}$ is held at 0 V or 0.87 V, voltage holding with a self amplification function can be achieved.

Figure 8:
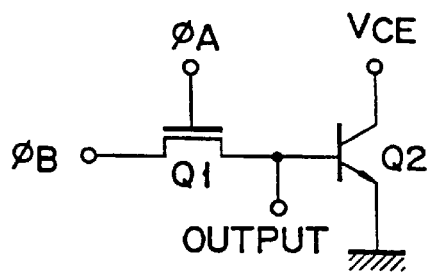
FIG. 8 is a circuit diagram of a voltage holding circuit to which the present invention is applied.

FIG. 8 shows a voltage holding circuit utilizing the above-mentioned voltage holding function.

With this circuit, n-channel MOS transistor Q1 is used as a switching element, and the drain or source of this transistor is connected to the base of npn bipolar transistor Q2. Clock φA is applied to the gate of MOS transistor Q1, and clock φB is applied to the source or drain. In this circuit, a capacitive load is formed by a base-emitter junction capacitance and a collector-base junction capacitance.

Figure 9:
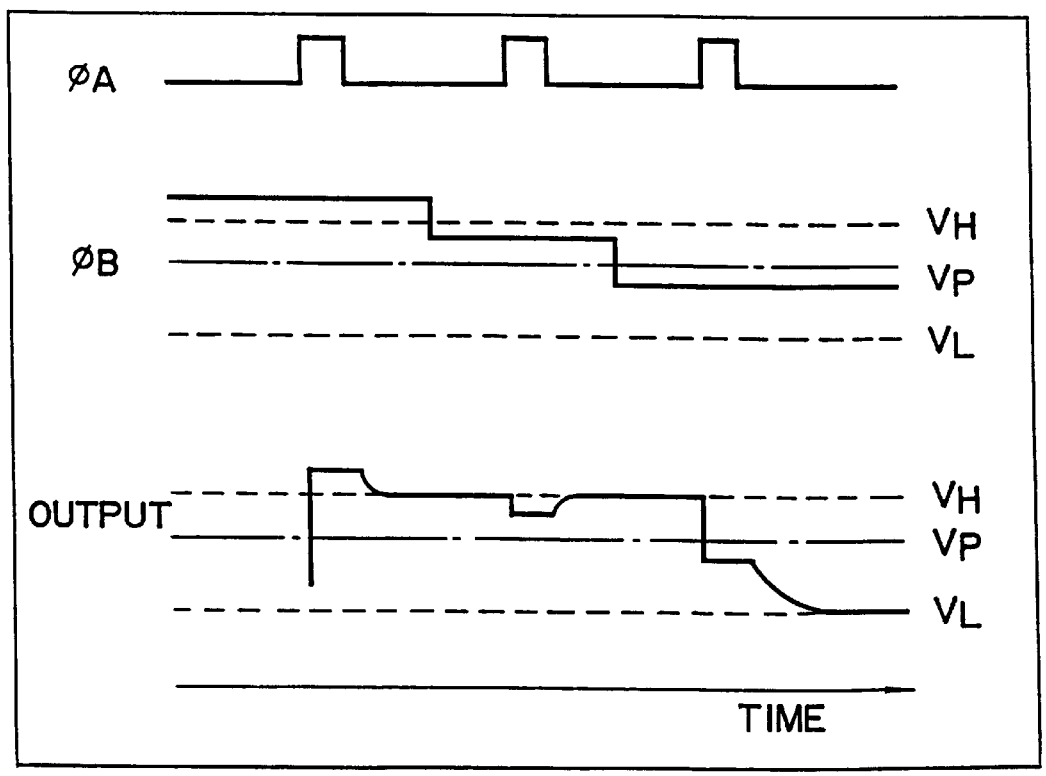
FIG. 9 is a timing chart for explaining the operation of the voltage holding circuit shown in FIG. 8.

FIG. 9 shows control clock φA and input clock φB of MOS transistor Q1, and a voltage level of an output terminal arranged at the node between MOS transistor Q1 and bipolar transistor Q2 in FIG. 8. $V_H$ represents 0.87 V, $V_p$ represents 0.45 V, and $V_L$ represents 0 V.

In FIG. 8, when clock φA goes to HIGH level, MOS transistor Q1 is turned on. In this case, φB>$V_H$ (0.87 V) is input to the base of bipolar transistor Q2, and the capacitive load is charged to $V_H$ or higher. Thereafter, when clock φA goes to LOW level and MOS transistor Q1 is turned off, the voltage of $V_H$ or higher charged in the capacitive load, which is applied to the base, is discharged through the base-emitter path of transistor Q2, i.e., the positive base current flows through the base. Thus, the base voltage is maintained at 0.87 V. When clock φB (0.45 V<φB<0.87 V) is applied to the base, the negative base current flows into the capacitive load through the collector-base path of transistor Q2, and the output voltage, i.e., the base voltage increases to 0.87 V. If φB<0.45 V is applied to the base of transistor Q2 through MOS transistor Q1, the positive base current flows out through the base-emitter path, and the base current becomes 0. More specifically, when φB>0.45 V, 0.87 V as a boundary potential is held, and when φB<0.45 V, 0 V is held.

With the above operation, the circuit shown in FIG. 8 can be used as a voltage holding circuit replacing a flip-flop. In this case, the flip-flop can be constituted by elements less than those of the conventional flip-flop.

The above-mentioned bipolar transistor can form the voltage holding circuit since the negative current flows through the base. As shown in FIG. 6, if collector-emitter voltage $V_{CE}$=1 V, since the positive base current flows through the base for all the values of base-emitter voltage $V_{BE}$, the circuit of transistor Q2 is always set in a discharging mode, and no voltage can be held in the base. In FIG. 9, the node between MOS transistor Q1 and bipolar transistor Q2 serves as the output terminal. However, MOS transistor Q1 is turned on again after voltage holding, so that the input terminal of clock φB can serve as the output terminal.

Figure 10:
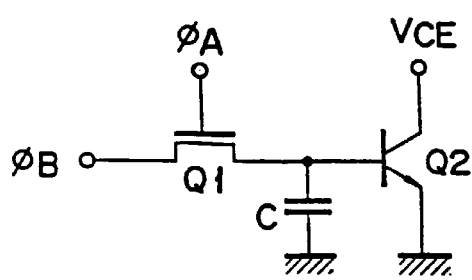
FIG. 10 is a circuit diagram showing another voltage holding circuit.

FIG. 10 shows a circuit in which capacitive element C such as a MOS capacitor is connected to the circuit shown in FIG. 8 in addition to bipolar transistor Q2. With this circuit, charging/discharging is positively performed by capacitive element C through the base. In this case, the input terminal of clock φB is used as the output terminal. However, the output terminal may be arranged at the node between the bases of transistors Q1 and Q2.

In the above embodiment, the npn bipolar transistor has been described. However, the present invention can be applied to a pnp transistor. FIG. 11 shows an embodiment using the pnp transistor.

According to this embodiment, when collector-emitter voltage $V_{CE}$ is at a predetermined negative voltage (–V volt) and when base-emitter voltage $V_{BE}$ is applied to a transistor as shown in FIG. 12, negative base current –$I_B$ can flow through the base.

When the above-mentioned voltage holding circuit is constituted by using the pnp transistor, the negative voltage is held in the base, as can be understood from FIGS. 10 and 11.

The voltage holding circuit described above can be applied to a latch circuit, a reference potential generating circuit, and a memory such as an SRAM. An oscillator, a sense amplifier, and a switching circuit can be formed by using the bipolar transistor which can flow the negative base current.

In the embodiment shown in FIG. 13, input voltage $V_{IN}$ is input to a first node as the base of first NPN bipolar transistor TR1, and the emitter is connected to the base of second NPN bipolar transistor TR2. The node between the first and second transistors serves as a second node, and the output voltage can be observed at the second node.

FIG. 14 shows the relationship between input voltage $V_{IN}$ and output $V_{OUT}$ when collector voltages Vcc1 and Vcc2 of bipolar transistors TR1 and TR2 are at 8 V.

Figure 15:
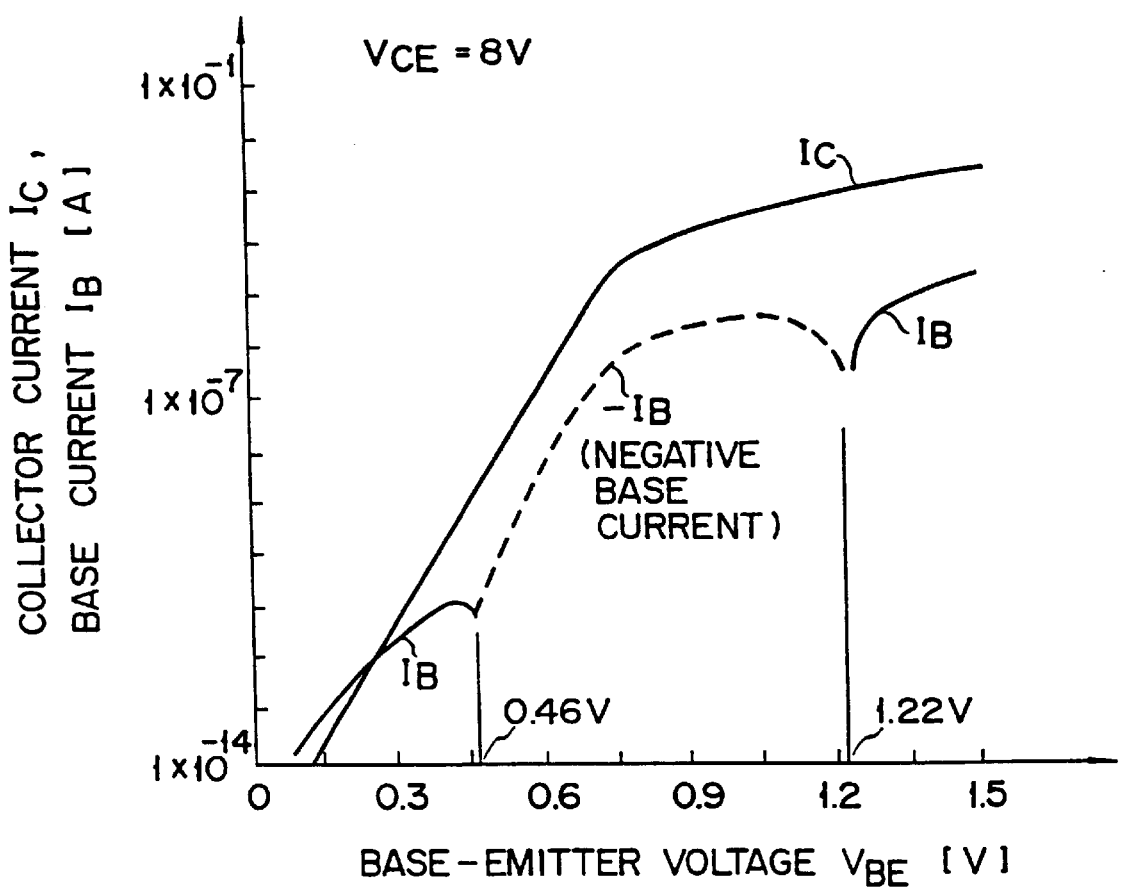
FIG. 15 is a graph showing current characteristics of the circuit shown in FIG. 13.

FIG. 15 shows the relationship among base-emitter voltage $V_{BE}$, base current $I_B$, and collector current $I_C$ of bipolar transistor TR2. This embodiment employs transistor TR2 which was manufactured under the condition using the same processes and parameters as those described with reference to FIG. 2. Transistor TR1 was manufactured based on the same processes and parameters as those for transistor TR2, and its collector voltage was set to be Vcc2=8 V.

Transistor TR1 has a function of a charging means. When input voltage $V_{IN}$ is increased from 0 V, output voltage $V_{OUT}$ increases while maintaining a difference between emitter current $I_E$ of transistor TR1 and the positive base current of transistor TR2 to be zero ($I_{CB}+I_E=I_{BE}$), as shown in FIG. 14. However, as shown in FIG. 15, if 0.46 V<$V_{BE}$<1.22 V, since the forward bass current of transistor TR2 becomes larger than the reverse base current, the circuit shown in FIG. 13 is set in a charging mode to have input voltage VIN=0.81 V obtained when output voltage $V_{OUT}$ is near 0.46 V (V1) as a boundary. In this case, the junction capacitances of the base-emitter junction and base-collector function of transistor TR2 are charged, and output voltage $V_{OUT}$ immediately raises to V2 (≈1.22 V). According to the circuit shown in FIG. 13, since emitter current $I_E$ flows through transistor TR1 in practice, voltages V1 and V2 shown in FIG. 14 provide values near boundary potentials 0.45 V and 1.22 V between $I_B$ and $-I_B$ in FIG. 15, respectively. Arrows illustrated in the graph of FIG. 14 represent characteristics when voltage $V_{IN}$ is increased and characteristics when voltage $V_{IN}$ is decreased. If input voltage $V_{IN}$ is increased to a region higher than 0.81 V, output voltage $V_{OUT}$ is latched at V2. More specifically, the circuit shown in FIG. 13 can be used as a memory, a voltage detector, an A/D converter, and the like.

When collector voltage Vcc2 is set to be 1 V, since no reverse base current flows through transistor TR2, output voltage $V_{OUT}$ continuously changes with respect to the input voltage, as indicated by a broken curve in FIG. 14, and no immediate change appears in output voltage $V_{OUT}$.

Figure 16:
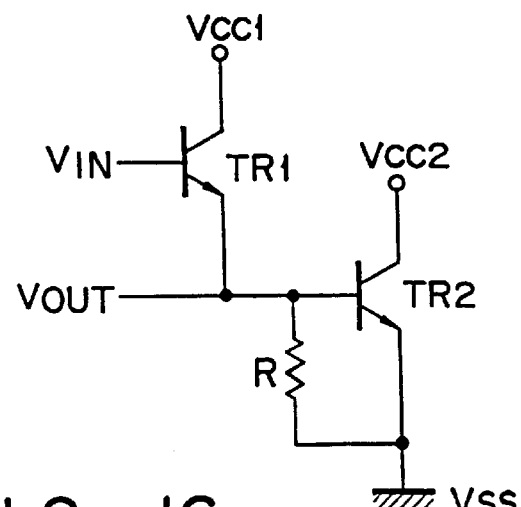
FIG. 16 is a circuit diagram of a semiconductor circuit in which a resistor is connected to the circuit shown in FIG. 13.

FIG. 16 shows a circuit in which resistor R is connected between the base and emitter of transistor TR2 in FIG. 13. FIG. 17 shows input/output characteristics when the resistance of resistor R is 1 MΩ. When resistor R is connected to transistor TR2, an absolute amount of an immediate change of output voltage is changed from the state shown in FIG. 14 to the state shown in FIG. 17. More specifically, output voltage $V_{OUT}$ is changed from 0.76 (=1.22−0.46) V when no resistor R is connected, to 0.44 (=1.20−0.76) V when resistor R is connected. In this case, input voltage $V_{IN}$ is changed from 0.81 V to 1.81 V. Resistor R may be replaced with a high-resistance polysilicon, a MOS transistor, a bipolar transistor, or the like.

FIG. 18 shows a circuit in which capacitive element C is connected between the base and emitter of transistor TR2 in the circuit shown in FIG. 16. With this circuit, output voltage $V_{OUT}$ changes at a predetermined time constant with respect to input voltage $V_{IN}$. More specifically, transistor TR1 has the same reverse base current characteristics as those of transistor TR2. However, transistor TR1 need only comprise a transistor having a function of increasing emitter current $I_E$ as input voltage $V_{IN}$ increases. Transistor TR1 may comprise a normal npn bipolar transistor in which collector-emitter voltage $V_{CE}$ is lowered and no negative base current can flow, as shown in FIG. 6. In this case, a capacitive element used can be formed by a MOS capacitor or a junction capacitance of the PN junction. MOS transistor TR3 may be connected to the base of transistor TR2 in place of transistor TR1, as shown in FIG. 19. In this case, the MOS transistor may be of either n- or p-type. As shown in FIG. 20, diode D1 may be connected to the base of transistor TR2 in place of transistor TR1.

In the above embodiment, both transistors TR1 and TR2 employ npn bipolar transistors. However, as shown in FIG. 21, they can employ pnp bipolar transistors. In this case, a negative voltage of, e.g., 8 V is applied as Vcc2, and input voltage $V_{IN}$ is also a negative voltage. Thus, output voltage $V_{OUT}$ becomes a negative voltage.

According to a circuit of an embodiment shown in FIG. 22, pnp transistor TR3 is connected between a terminal of output voltage $V_{OUT}$ and a terminal of ground voltage Vss. With this circuit, input/output characteristics exhibit a curve illustrated in FIG. 23. More specifically, when input voltage $V_{IN}$ is gradually increased from 0 V, the input/output characteristics draw curve (1). When $V_{IN}<V_{IH}$ and when input voltage $V_{IN}$ is gradually decreased from HIGH level, the input/output characteristics draw a curve in a direction opposite to curve (1). When $V_{IN}>V_{IH}$ and input voltage $V_{IN}$ is gradually decreased from HIGH level, the input/output characteristics exhibit hysteresis characteristics along curve (2). In this manner, when $V_{IN}<V_{IL}$ and $V_{IN}>V_{IH}$, the circuit shown in FIG. 22 functions as a Schmitt trigger circuit. More specifically, as shown in FIG. 15, if $V_{CE}$=8 V (Vcc2=8 V), negative base current $-I_B$ indicated by a broken curve flows through transistor TR2 in the range of $V_{CE}$=0.46 V to 1.22 V. For other $V_{CE}$ values, positive base current $I_B$ indicated by a solid curve flows through transistor TR2.

As shown in FIG. 24A, when voltage $V_C$ is applied to a series circuit of transistors TR1 and TR3 and input voltage $V_{IN}$ is at 0 V, a current at the node between transistors TR1 and TR3 with respect to voltage $V_{BE}$ exhibits characteristics illustrated in FIG. 24B. In this case, transistor TR1 serves as a charging means, and transistor TR3 serves as a discharging means. If $V_{BE}<V_{IN}(=0)$, that is, if $V_{BE}$ is negative, current $-I_O$ corresponding to the emitter current of transistor TR1 and indicated by a broken curve appears at the node between transistors TR1 and TR3. If $V_{BE}$ is positive, current $I_O$ corresponding to the emitter current of transistor TR1 and indicated by a solid curve appears at the node.

The characteristic curves shown in FIG. 23 can be combined with FIGS. 15 and 24A, thus obtaining characteristics shown in FIGS. 25A to 25D. Note that FIGS. 25A to 25D correspond to characteristic curves a to d in FIG. 23. In FIGS. 25A to 25D, a broken curve represents that the base current of transistor TR2 flows in a direction of charging the $V_{OUT}$ terminal, and a solid curve represents that the base current flows in a discharging direction through the base of transistor TR2. Therefore, voltage $V_{OUT}$ is stabilized at a potential equivalent to the magnitude of all the current components charging and discharging the base of transistor TR2.

FIG. 25A shows characteristics of a current input to and output from the $V_{OUT}$ terminal with respect to base potential $V_{BE}$ of transistor TR2 when input voltage $V_{IN}$ is increased from 0 V and reaches 0.4 V. When $V_{IN}$=0 V, $V_{OUT}$ is 0 V. When input voltage $V_{IN}$ is increased, output voltage $V_{OUT}$ increases to obtain a lower stable point, i.e., a potential at which $-I_O$ is equal to $I_B$, as shown in FIG. 25A. However, if voltage $V_{IN}$ exceeds $V_{IN}$=0.76 V, since a current flows in a charging direction even if $V_{BE}$ takes any value in the range of 0 V to 1.22 V, as shown in FIG. 25B, voltage $V_{BE}$ is immediately increased and is stabilized at 1.22 V to be $V_{OUT}$.

Figure 25C:
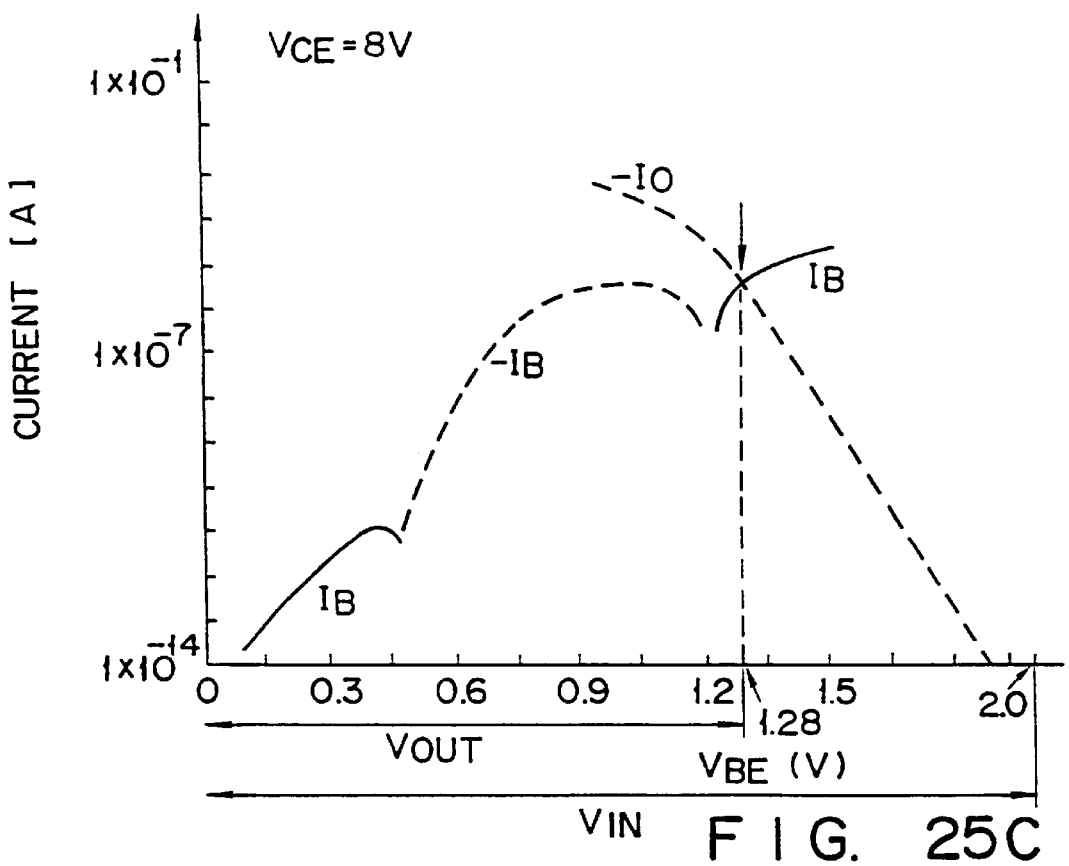
Figure 25D:
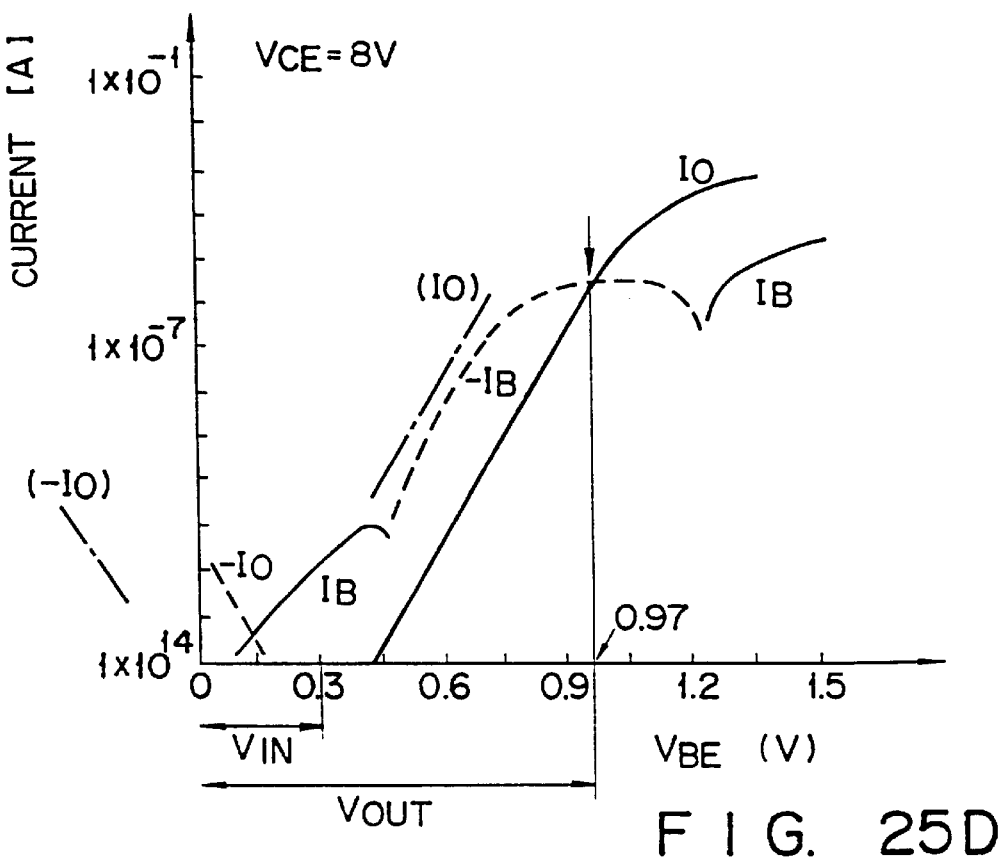

If input voltage $V_{IN}$ is further increased, stable voltage $V_{OUT}$ increases to a point where the entire current in the charging direction becomes equal to the entire current in the discharging direction, and $V_{OUT}$ becomes 1.28 V when $V_{IN}$=2 V, as shown in FIG. 25C. When input voltage $V_{IN}$ is decreased from 2 V, output voltage $V_{OUT}$ is decreased to obtain a potential at which the currents in the charging and discharging directions are equal to each other. FIG. 25D illustrates a state wherein $V_{IN}$=0.3 V. Current $I_O$ by the emitter of transistor TR3 functions to cancel the negative base current of transistor TR2. Therefore, when no transistor TR3 is provided to the circuit, even if input voltage $V_{IN}$ is decreased to 0 V, voltage $V_{OUT}$ is latched at 1.22 V, as shown in FIG. 26 and is not decreased to $V_{OUT}$=0 V. When input voltage $V_{IN}$ is further decreased from 0.3 V and becomes lower than 0.1 V, current $I_O$ falls out negative base current $-I_B$, as indicated by an alternate long and short dashed curve in FIG. 25D, and immediately decreases to a potential at which the currents in the charging and discharging directions are equal to each other, i.e., a potential at which LOW-level base current $I_B$ is changed to current $-I_O$. An immediate decrease in current changes the base potential of transistor TR3 to change emitter current $I_O$, so that the magnitude of current $I_O$ becomes smaller than that of negative base current $-I_B$.

More specifically, the base potential of transistor TR2 latched at 1.22 V is controlled so that current $I_O$ (discharging current) having an absolute value larger than that of negative base current $-I_B$ flowing through transistor TR2 flows through transistor TR3, thereby resetting the latch level of transistor TR3. As shown in FIG. 27, when the npn bipolar transistor constituting transistor TRI shown in FIG. 22 is replaced with an n-type MOS transistor and the pnp transistor of transistor TR3 is replaced with an n-type MOS transistor, the circuit can exhibit the same characteristics as those shown in FIGS. 25A to 25D.

FIG. 28 shows a circuit when the present invention is applied to a Schmitt trigger circuit, and FIG. 29 shows a Schmitt trigger circuit constituted by using a pnp bipolar transistor. The circuit shown in FIG. 29 is operated while both voltages $V_{IN}$ and $V_{OUT}$ have negative potentials, as shown in FIG. 30.

FIG. 31 shows a circuit which inhibits generation of a negative base current by changing value $V_C$. With this circuit, as shown in FIG. 32, when input voltage $V_H$=1.4 V is input from a $V_{IN}$ terminal through the switching element comprising an n-type MOS transistor, as shown in FIG. 32, output voltage $V_{OUT}$ is latched at 1.22 V as a boundary potential between the HIGH-level positive and negative base currents. However, if $V_C$ is changed from 8 V to 0 V, the base potential at which the negative base current flows disappears. For this reason, output voltage $V_{OUT}$ decreases from 1.22 V as a latched voltage to 0 V. This function can be used as a reset function of a memory element.

An embodiment wherein the present invention is applied to a memory will be described hereinafter with reference to FIGS. 33 to 40. According to a memory cell shown in FIG. 33, the source or drain of MOS transistor Q1 as a switching element is connected to the base of bipolar transistor Q2. Transistor Q1 comprises a p-channel (or n-channel) MOS transistor, and transistor Q2 comprises npn bipolar transistor. The gate of MOS transistor Q1 is connected to word line WLn and the drain or source is connected to bit line BLn. The node between transistors Q1 and Q2 serves as storage node S of the cell, and at this node, storage capacitor $C_S$ ($C_S = C_{BE} + C_{BC}$) including junction capacitance $C_{BE}$ across the base and emitter of transistor Q2 and junction capacitance $C_{BC}$ across the base and collector is present. Capacitive element Cl such as a MOS capacitor may be added to storage capacitor $C_S$. When capacitive element Cl is arranged, an appropriate plate potential or substrate or well potential is applied to the other end of the capacitive element. Resistor R may be connected between the base and emitter.

FIG. 34 shows operation characteristics of the circuit shown in FIG. 33, and represents the relationship between the base-emitter voltage and the base current on the storage node S shown in FIG. 33.

HIGH-level side boundary potential $V_{BE1}$ represents a storage state "1", and a range between VBE0=0 V represents a storage state "0". A write access is performed by writing voltage $V_{BE1}$ or 0 V in the cell node. A read access is performed by transferring a charge on storage capacitor $C_S$ to bit line BLn and amplifying the potential of storage capacitor $C_S$.

FIG. 35 is a circuit diagram of a memory including a memory cell array and a peripheral circuit.

With this memory, N×N=N' memory cells M/C each having an arrangement as shown in FIG. 33 are arrayed. In this case, N memory cells are arrayed in the horizontal direction, and M memory cells are arrayed in the vertical direction, thus forming a plurality of memory blocks each including N×M memory cells. Bit lines BL1 to BLM, . . . , BL(N–1M+1) to BLN are connected to sub I/O lines (preI/O1 to preI/ON/M) provided for each memory block through transfer gates, e.g., n-channel MOS transistors T1 which are turned on/off by column selection signals CSL1 to CSLM, . . . , CSL(N–M+1) to CSLN. Each block includes one sub I/O sense amplifier (preI/O,S/A).

In this embodiment, dummy cell D/C is connected to each memory block. Dummy cells D/C are controlled by a signal on dummy word line DWL. Dummy cells D/C are connected to bit lines $\overline{BLM}'$ to $\overline{BLM}'$, and are connected to sub I/O lines ($\overline{preI/O1}$, . . . , $\overline{preI/ON/M}$) arranged parallel to the sub I/O lines (preI/O1 to preI/ON/M) in the same manner as memory cells M/C.

Sub I/O sense amplifiers (preI/O,S/A) are connected to the corresponding sub I/O and $\overline{I/O}$ lines, and amplified potentials appearing on the sub I/O and $\overline{I/O}$ lines are transmitted to input/output lines I/O and $\overline{I/O}$ through the corresponding transfer gates, e.g., n-channel MOS transistors T2 controlled by column selection signals CSLM'D, . . . , CSLN'D.

The I/O and I/O lines are connected to a data input (DIN) buffer circuit. and a main I/O sense amplifier (I/O,S/A). The main I/O sense amplifier outputs an output signal through an internal data output (Dout) buffer circuit (not shown) from a Dout terminal.

Each sub I/O sense amplifier (preI/O,S/A) comprises three MOS transistors, as shown in FIG. 36, and similarly, the main I/O sense amplifier (I/O,S/A) comprises three MOS transistors, as shown in FIG. 37. Each dummy cell D/C comprises two MOS transistors and a capacitor, as shown in FIG. 38.

The semiconductor memory shown in FIG. 35 has an active state and a precharge state, and these states are selected by row address strobe RAS or (chip select $C_S$).

In this embodiment, the operation of the memory chip is basically determined by a control signal input to one terminal. However, an address multiplex method wherein row and column addresses are offset along the time base and data is fetched using strobe signals $\overline{RAS}$ and $\overline{CAS}$ may be employed like in a conventional DRAM.

As shown in the timing chart of FIG. 39, in the precharge state wherein signal $\overline{RAS}$ is at "H" level, MOS transistor Q1 of memory cell M/C is turned off by setting word line WLn (n=1, . . . , N) at "H" level. In this case, bit lineE BL1 to BLM, . . . , BL(N–M+1) to BLN, $\overline{BLM}'$ to $\overline{BLN}'$ and sub I/O and $\overline{I/O}$ lines (preI/O1 to preI/ON/M and $\overline{preI/O1}$ to pre $\overline{I/ON/M}$), and I/O and $\overline{I/O}$ lines are precharged at a Vp potential shown in FIG. 34. In this case, the Vp potential is written in dummy cell D/C.

When signal $\overline{RAS}$ goes to "L" level, an address is fetched, and, for example, memory cell A in FIG. 35 is selected, word line WL1 and column selection line CSLM are enabled. Thus, charge $V_{BE1} \times C_S$ ($C_S$ is the capacitance of storage capacitor C) is transferred to bit line BLM and preI/O1 line. If the parasitic capacitance of bit line BLM is represented by $C_B$ and the parasitic capacitance of the wiring of the sub I/O line (preI/O1) is represented by CpreI/O, when data "1" is written in memory cell A, the potential of the sub I/O line (preI/O1) is increased by the potential given by the following relation:

$$\Delta V = (V_{BE1} - Vp) / \{1 + (C_B + CpreI/O) / CS\}$$

The potential of the sub I/O line is further increased by the negative base current by ΔV' (up to a maximum of $V_{BE1}$-VP).

In this case, dummy word line DWL is simultaneously selected. However, the potentials of dummy bit line $\overline{BLM}'$ and pre$\overline{I/O1}$ line remain at Vp. Therefore, the potential difference between the preI/Ol line and pre$\overline{I/O1}$ line is ΔV'.

Potential difference ΔV' is amplified by setting signal SAN (FIG. 36) input to the sub I/O sense amplifier (preI/O,S/A) as a dynamic sense amplifier at "H" level so as to be a larger potential difference, and appears between lines preI/Ol and pre$\overline{I/O1}$.

Line CSLM' is set at "H" level, and data (ΔV') is transferred to the I/O and $\overline{I/O}$ lines. Similarly, the main sense amplifier (I/O,S/A) connected to the I/O and $\overline{I/O}$ lines is enabled when clock φ1 (FIG. 38) is set at "H" level, and outputs Dout buffer data from the data output buffer circuit:. The Dout buffer data is transferred to an external circuit through the Dout terminal.

If the minimum sensitivity of the sub I/O sense amplifier (preI/O,S/A) is set to be about ~10 mV, $C_S$ can be, e.g., 20 fF or more when $V_{BE1}$-Vp=0.5 V, $C_B$=0.5 pF, and CpreI/O=0.5 pF. The bit lines can be directly connected to the I/O and $\overline{I/O}$ lines through MOS transistors T1 without going through the sub I/O sense amplifiers, and the bit lines can be directly sensed by the main sense amplifier (I/O,S/A), as needed.

A memory cell subjected to a read access recovers original data "1" or "0" since bipolar transistor Q2 has two stable points $V_{BEO}$ and $V_{BE1}$. On the other hand, the potential of storage node S of a memory cell which is selected by the word line but is not subjected to a read access by the sense amplifier is varied with respect to Vp by +ΔV if it is "1" or by −ΔV if it is "0". After the word line is turned off, this potential is returned to $V_{BE1}$ or $V_{BE0}$ to 0 V by negative base current $(-)I_B$ if it is "1" or by positive base current $I_B$ if it is "0". In this manner, since the memory cell has a self amplification function, this memory cell serves as a nondestructive read memory. Therefore, in the memory using the memory cell, a sense amplifier need not be arranged for each bit line pair unlike a DRAM.

A write operation will be explained below with reference to the timing chart of FIG. 40.

When signal $\overline{RAS}$ and write enable signal $\overline{WE}$ are set at "L" level, a predetermined potential is written in a memory cell selected by the word line, e.g., memory cell A, by an output from the DIN buffer through the I/O line, the preI/O line, and the bit line. The current supply capacity of the DIN buffer is set to output a current larger than base current $I_B$ which can flow through the npn transistor of the memory cell. When write data is "1", $V_{BE1}$ is forcibly written in storage node S, and when it is "0", $V_{BE0}$ is written. When write data is "1", a potential larger than Vp may be written in node S, and when it is "0", a potential smaller than Vp may be written in node S.

Figure 41:
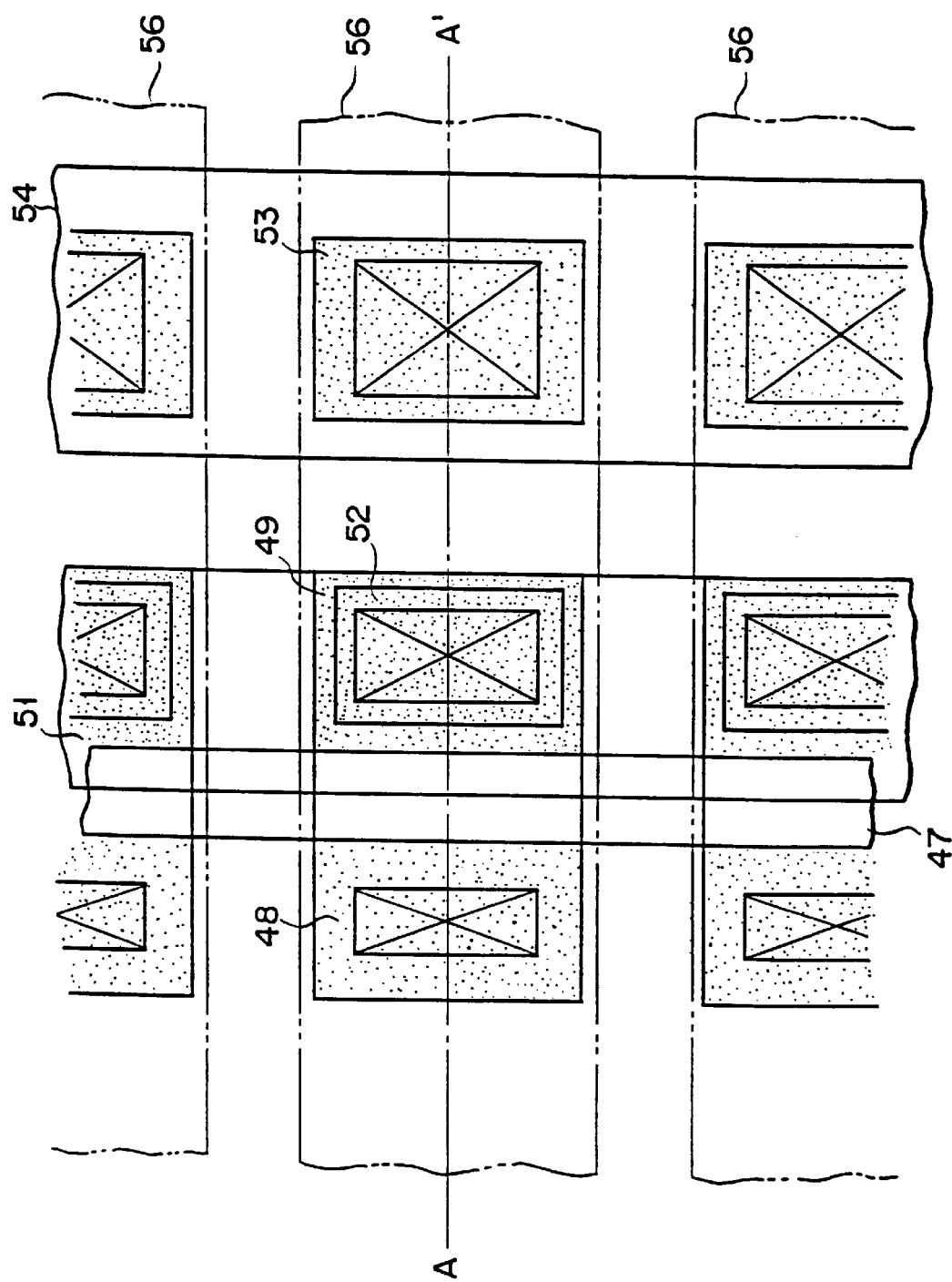
FIG. 41 is a plan view of a memory cell.
Figure 42:
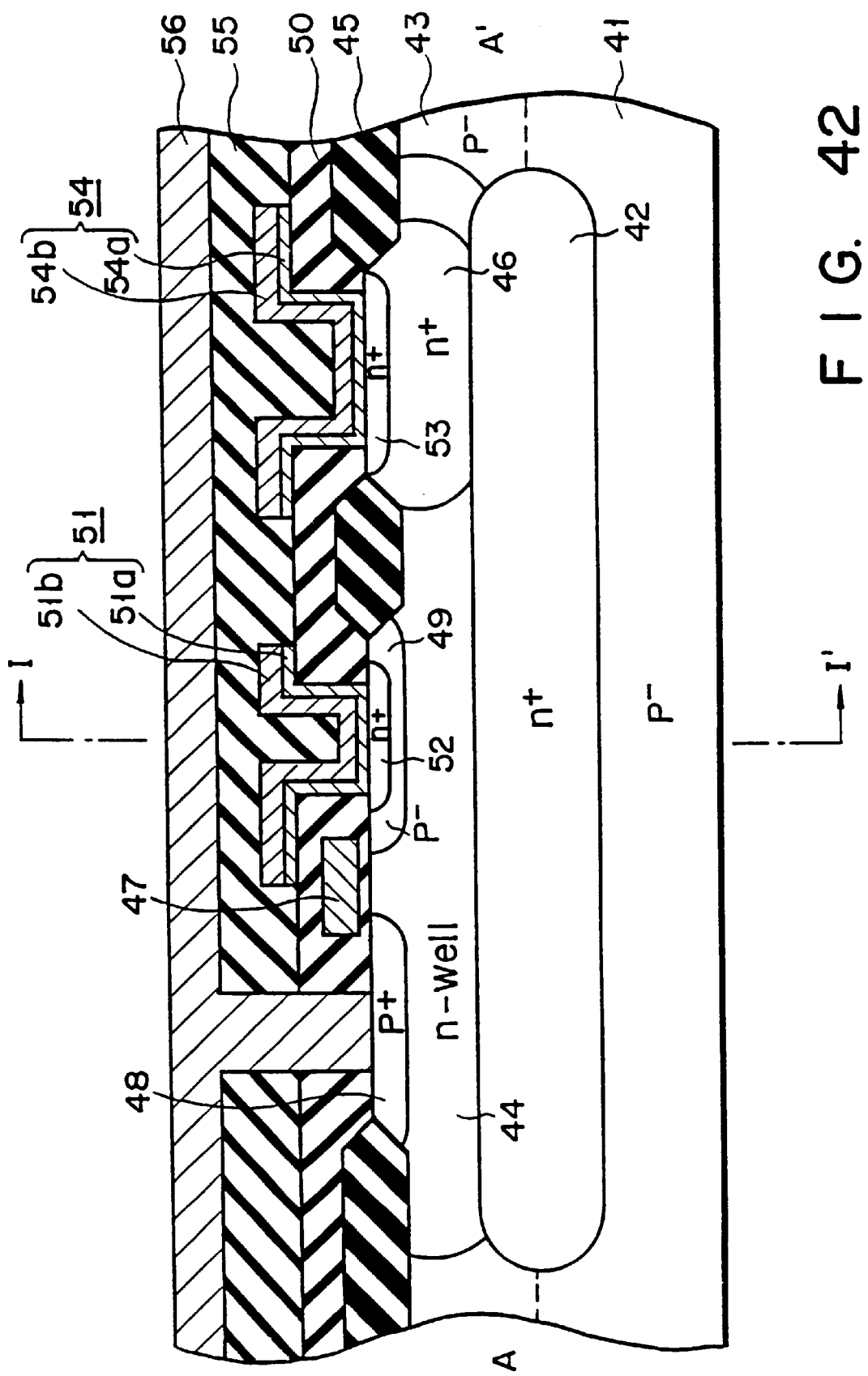
FIG. 42 is a sectional view of the memory cell taken along a line A–A' in FIG. 41.

The memory is arranged, as shown in FIGS. 41 and 42. Referring to FIG. 42, n$^+$-type buried layer 42 is formed on the surface of p$^-$-type silicon substrate 41 so as to reduce a collector resistance, and p$^-$-type epitaxial silicon layer 43 having a boron concentration of about $1\times10^{15}$ cm$^{-3}$ and a thickness of, e.g., 2.5 μm is formed thereon. Phosphorus ions are doped into p$^-$-type epitaxial silicon layer 43 to form n-type well layer 44 having an impurity concentration of about $4\times10^{16}$ cm$^{-3}$. Field oxide film 45 is formed on the surfaces of n-type well layer 44 and epitaxial silicon layer 43. Collector lead layer 46 extending to n$^+$-type buried layer 42 is formed through one of openings selectively formed in field oxide film 45. Phosphorus-doped polysilicon gate 47 of p-channel MOS transistor Q1 is formed on another opening. Gate electrode 47 serves as the word line of the memory cell array. P$^+$-type layer 48 and p$^-$-layer 49 serving as the source and drain of the MOS transistor are formed in n-type well layer 44 by self alignment using gate electrode 47 as a mask. Layers 48 and 49 can be formed in a single process. In this embodiment, these layers are formed in separate processes to have different concentrations. P$^-$-type layer 49 also serves as the base of npn bipolar transistor Q2.

SiO$_2$ film 50 is deposited on the entire surface of the semiconductor structure formed as described above by CVD (chemical vapor deposition), and emitter and collector openings are formed in SiO$_2$ film 50. Polysilicon film 51a having a thickness of 500 to 1,000 Å is formed on the openings. Arsenic ions are doped in regions 46 and 49 through the openings and polysilicon film 51, thereby forming n$^+$-type emitter 52 and n$^+$-type layer 53 in regions 46 and 49. N$^+$-type emitter 52 has an impurity concentration of $2\times10^{20}$ cm$^{-3}$, and a junction depth of 0.15 μm, and p$^-$-type base 49 has an impurity concentration of $3\times10^{18}$ cm$^{-3}$ and a junction depth of 0.3 μm. 3,000-Å thick MoSi film 51b is deposited on polysilicon film 51a formed on the openings, and is patterned to form emitter electrode 51 and collector electrode 54.

Silicon oxide film 55 is deposited on the entire surface of the resultant semiconductor structure, bit line contact holes are formed therein, and Al—Cu—Si bit line layer 56 is formed on the semiconductor structure.

In the memory with the above structure, as shown in FIG. 41, emitter and collector electrodes 51 and 54 are arranged commonly to cells arrayed in the word line direction, and bit lines 56 are arranged commonly to cells arrayed in a direction perpendicular to emitter and collector electrodes 51 and 54.

Figure 43:
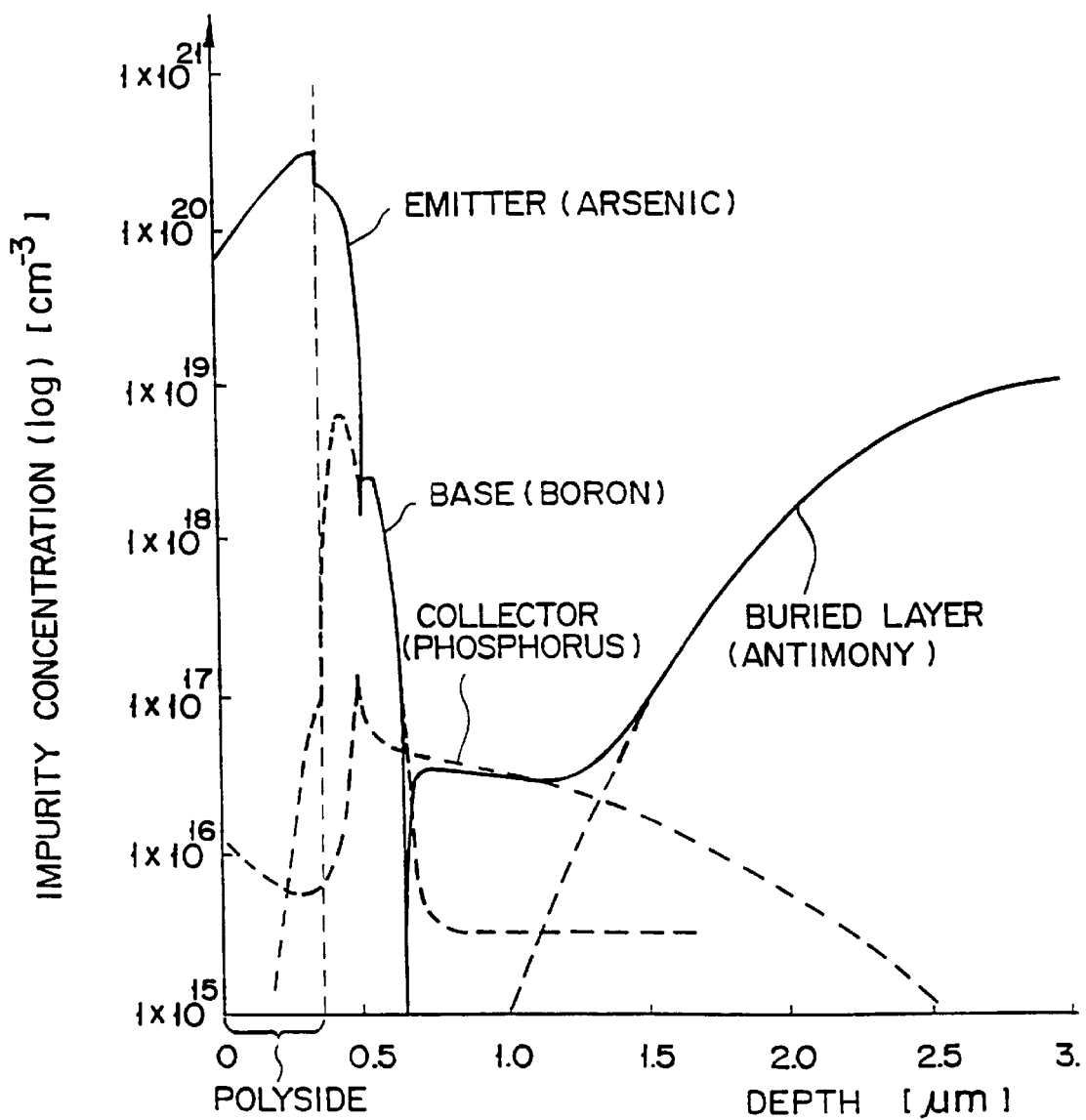
FIG. 43 is a graph showing an impurity profile taken along a line I–I' of the memory cell shown in FIG. 42.

FIG. 43 shows an impurity profile along a line I—I' of the memory cell shown in FIG. 42.

When the above-mentioned memory is manufactured, p$^-$-type silicon substrate 41 is annealed in an Sb$_2$O$_3$ gas atmosphere at 250° C. for 25 minutes to diffuse Sb in the surface of p$^-$-type silicon substrate 41, thereby forming n$^+$-type buried layer 42 therein. Thereafter, p$^-$-type silicon substrate 41 is annealed in an SiH$_2$Cl$_2$+B$_2$H$_6$ gas mixture atmosphere at 1,150° C. for 10 minutes, thereby forming 2.5-μm thick epitaxial silicon layer 43 on the buried layer. Phosphorus ions (P$^+$) are implanted in an upper portion of buried layer 42 at an acceleration voltage of 160 keV and a dose of $5\times10^{12}$ cm$^{-2}$ using the photolithography technique, and boron ions (B$^+$) are implanted in a portion other than the upper portion of buried layer 44 at an acceleration voltage of 100 keV and a dose of $6\times10^{12}$ cm$^{-2}$. The resultant structure is annealed in an N$_2$ atmosphere at 1,100° C. for 290 minutes. Thus, the boron ions are diffused in silicon layer 43 to form n-type well 44 and a p-type well (not shown) in silicon layer 43. 8,000-Å thick field oxide film 45 is formed on n-type (or p-type) well 44 and silicon layer 43 by, e.g., a LOCOS method. Openings are selectively formed in field oxide film 45, and phosphorus ions (P$^+$) are selectively implanted through the openings at an acceleration voltage of 60 keV and a dose of $1\times10^{16}$ cm$^{-2}$. Then, a 200-Å thick gate oxide film is formed on n-type well 44, and thereafter, gate polysilicon film 47 is formed on the gate oxide film. After phosphorus is diffused in gate polysilicon film 47, film 47 is patterned.

Boron ions (BF$_2^+$) are implanted in a portion at one side of the gate at an acceleration voltage of 30 keV and a dose of $2\times10^{15}$ cm$^{-2}$, thereby forming p$^+$-type layer 48 in n-type well 44. Thereafter, boron ions (B+) are selectively implanted at an acceleration voltage of 30 keV and a dose of 1×10$^{14}$ cm$^{-2}$, thereby forming p$^-$-type layer 49 serving as a base in n-type well 44.

3,000-Å thick SiO$_2$ film 50 is deposited on the entire surface of semiconductor structure by VOD, and emitter and collector portion openings are formed in SiO$_2$ film 50. Polysilicon layer 51a having a thickness of 500 to 1,000 Å is deposited on the entire surface of the semiconductor structure, and arsenic ions (As$^+$) are implanted in polysilicon layer 51 at an acceleration voltage of 60 keV and a dose of 1×10$^{16}$ cm$^{-2}$. The arsenic is diffused in the substrate by annealing, and 3,000-Å thick MoSi film 51b is deposited on polysilicon film 51a by, e.g., sputtering.

Then, silicon oxide film 55 is deposited on the entire surface of the resultant semiconductor structure, and bit line contact holes are selectively formed in silicon oxide film 55. Thereafter, an 8,000-Å thick Al—Cu—Si film is deposited on silicon oxide film 55. The Al—Cu—Si layer is etched to have a predetermined pattern.

According to the above-mentioned semiconductor device, i.e., memory,, the source or drain of MOS transistor Q1 is connected to the base of bipolar transistor Q2. One diffusion layer of transistor Q1 is used as the base of bipolar transistor Q2, and the emitter is formed in this diffusion layer, thus achieving a structure suitable for high integration.

FIGS. 44 and 45 show modifications of the memory cell array. In FIGS. 44 and 45, each memory cell is illustrated as region M.

One characteristic feature of this embodiment is that a plurality of memory cells constituting the memory cell array are commonly formed in n-type well 44, n$^+$-type collector lead regions 46 are arrayed at the right end of FIG. 46, and collector electrode 54 is commonly formed in the word line direction. N$^+$-type collector lead regions 46 can be formed as a continuous region in an extending direction of collector electrode 54. Another feature of this embodiment is that two adjacent memory cells in the bit line direction commonly use p$^+$-type layer 48, thus reducing a bit line contact.

Still another feature of this embodiment is that emitter electrode 51 is formed as a common plate for the memory cell array, and bit line contact holes are formed therein. Emitter electrode 53 is formed into a stripe shape, and can be commonly formed for memory cells arrayed in the word line direction. Stripe emitter electrodes 51 each having a section shown in FIG. 45 are disposed in the word line direction. More specifically, emitter electrodes 51 formed to sandwich field oxide film 45 therebetween can be commonly arranged in the word line direction.

According to the embodiment shown in FIGS. 44 and 45, the semiconductor device can achieve higher integration.

FIG. 46 shows a circuit of a memory cell which is applied to a semiconductor memory. With this circuit, n-channel (or p-channel) MOS transistor Q1 and NPN bipolar transistor Q2 are connected to each other like in FIG. 8. The gate of MOS transistor Q1 is connected to word line WL and the source or drain is connected to bit line BL. Base-emitter junction capacitance C$_{BE}$ and base-collector junction capacitance C$_{BC}$ of bipolar transistor Q2 are used as storage capacitor C$_S$. Storage capacitive element C such as a MOS capacitor may be arranged at the node between transistors Q1 and Q2, as indicated by a broken line in FIG. 46.

FIG. 47 shows the relationship among base-emitter voltage V$_{BE}$, collector current I$_C$, and base current I$_B$ of the npn bipolar transistor when V$_{CE}$=7 V in the transistor shown in FIG. 2. As can be seen from FIG. 47, two stable points V$_{BE0}$=0 V and V$_{BE1}$=1.05 V can be obtained in the same manner as described above.

When data is written in the memory cell, the bit line potential is set at V$_{BE0}$ or V$_{BE1}$ to turn on word line WL, so that V$_{BE0}$ or V$_{BE1}$ is written in the connecting portion between transistors Q1 and Q2, i.e., the cell node. In a read mode, bit line BL is precharged to the Vp potential, and word line WL is then turned on. Thus, a charge is divided between storage capacitor C$_S$ of the cell and wiring capacitance C$_B$ of bit line BL, and small potential change ΔV occurs in bit line BL. The potential change is enhanced by the positive and negative base currents, and is further amplified by a sense amplifier.

In the memory cell as described above, assume that resistor R1 is connected between the base and emitter of the bipolar transistor, or resistor R2 is connected to the emitter, or both resistors R1 and R2 are connected.

Figure 48A:
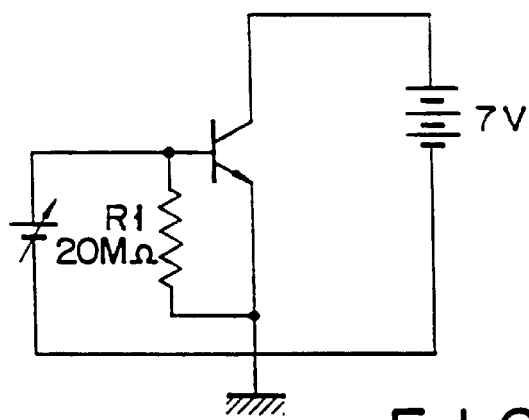
FIG. 48A is a circuit diagram of a memory cell with a resistor.
Figure 48B:
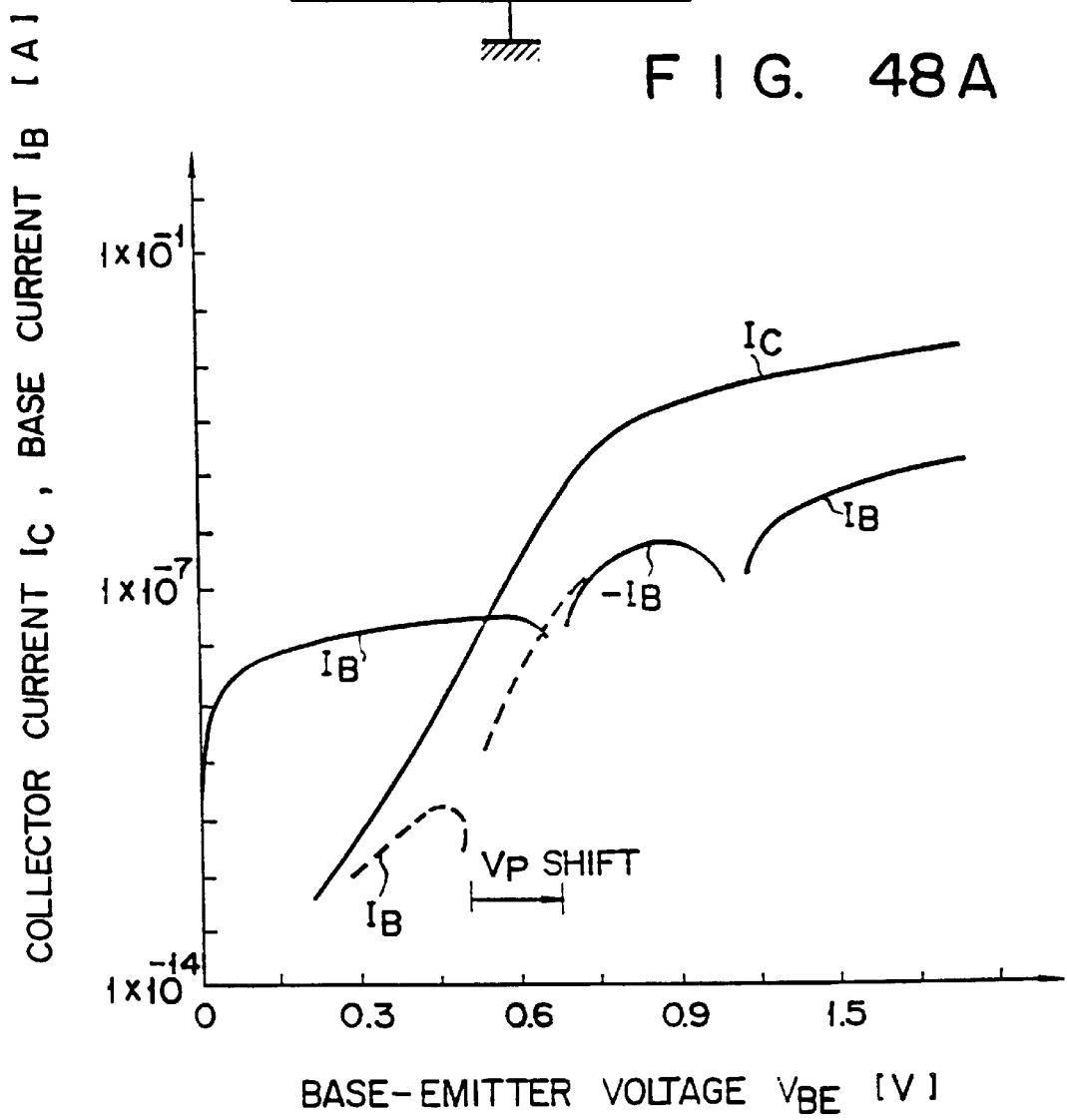
FIG. 48B is a graph showing voltage-current characteristics of the memory cell shown in FIG. 48A.

FIG. 48A shows a circuit in which resistor R1=20 MΩ is connected between the base and emitter, and FIG. 48B shows current characteristics of this circuit. In FIG. 48B, a broken curve represents current characteristics when no resistor is connected. As can be seen from FIG. 48B, when resistor R1 is connected, a LOW-level side positive base current is increased, and a Vp level is shifted in the positive direction since a current flowing through resistor R1, i.e., I=V$_{BE}$/R1, is apparently added to the base current. An increase in LOW-level side positive base current I$_B$ can increase write or read access speed of V$_{BE0}$.

FIGS. 49A and 49B show an embodiment wherein resistor R2=1.5 kΩ is connected to the emitter. According to this embodiment, the levels of high V$_{BE}$ side collector current I$_C$ and base current are decreased, and stable potential V$_{BE1}$ is shifted in the positive direction. More specifically, the level of V$_{BE1}$ can be controlled, and margins of "1" and "0" can be increased in the memory.

FIGS. 50A and 50B show an embodiment wherein resistors R1=20 MΩ and R2=1.5 kΩ are connected. According to this embodiment, the effects of the above two embodiments can be simultaneously provided. This embodiment can employ MOS transistors in addition to polysilicon resistors as resistors R1 and R2, and can be applied to a latch circuit, a reference potential generating circuit, and the like as well as a memory. Furthermore, this embodiment can be applied to a semiconductor device using a pnp bipolar transistor in place of an npn bipolar transistor.

Figure 51A:
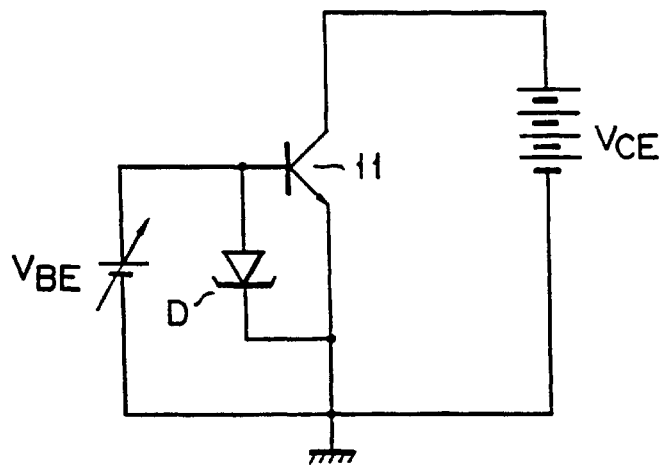
FIG. 51A is a circuit diagram of a memory cell with a tunnel diode.

FIG. 51A shows an embodiment wherein a diode is connected to a memory cell. According to this embodiment, power source V$_{CE}$ is connected between the collector and emitter of bipolar transistor 11, and a parallel circuit of tunnel diode D and power source V$_{BE}$ is connected between the base and emitter. When tunnel diode D is connected, current-voltage characteristics shown in FIG. 51B can be obtained. In the characteristics shown in FIG. 51B, a broken curve represents characteristics when no diode D is connected.

Figure 51B:
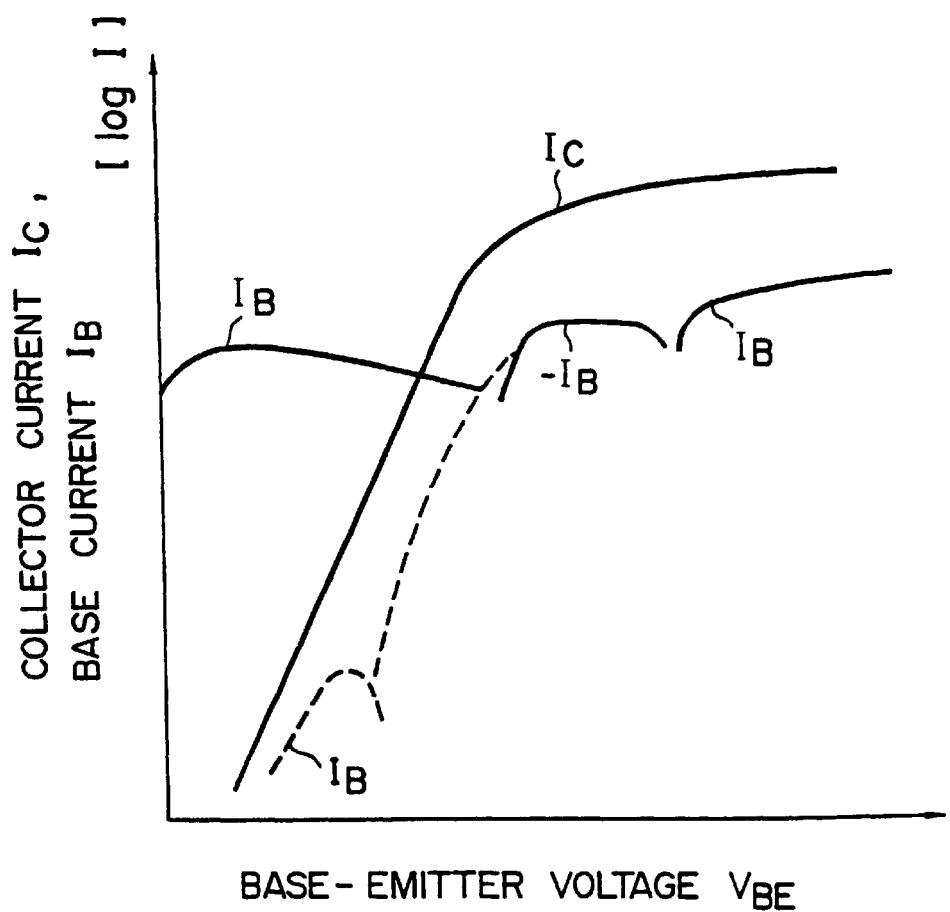
FIG. 51B is a graph showing voltage-current characteristics of the memory cell shown in FIG. 51A.
Figure 52A:
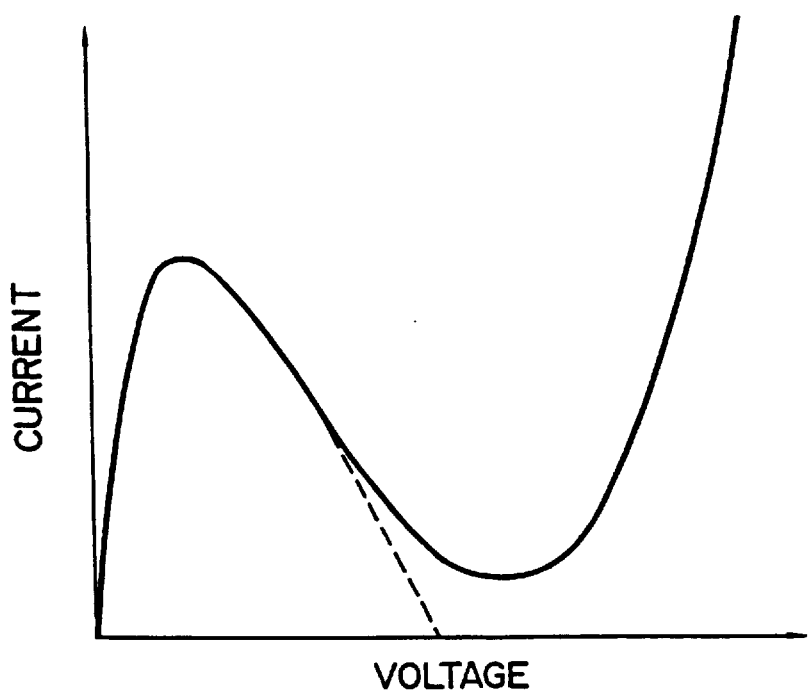
FIG. 52A is a graph showing voltage-current characteristics of the diode.
Figure 52B:
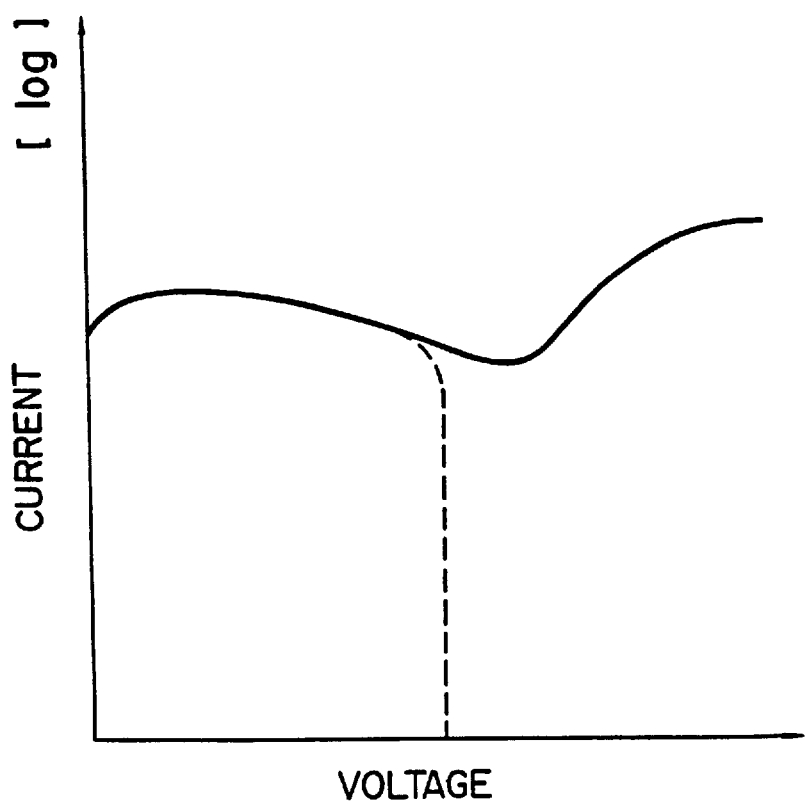
FIG. 52B is a graph showing logarithmic characteristics of the characteristic shown in FIG. 52A.

FIG. 52A shows current-voltage characteristics of the diode, and FIG. 52B shows characteristics taking the logarithm of the current of the diode. In FIG. 52A, a broken curve represents a tunnel current. The characteristics of the tunnel diode shown in FIG. 52B are changed to those shown in FIG. 51B by connecting the tunnel diode between the base and emitter of a bipolar transistor having reverse base current characteristics. Thus, in a region where the base-emitter current is at LOW level, a forward base current increases, and a potential for inverting the polarity of the base current can be drifted. An increase in forward base current value at LOW level side can increase write and read access speeds of V$_{BE0}$.

Figure 53:
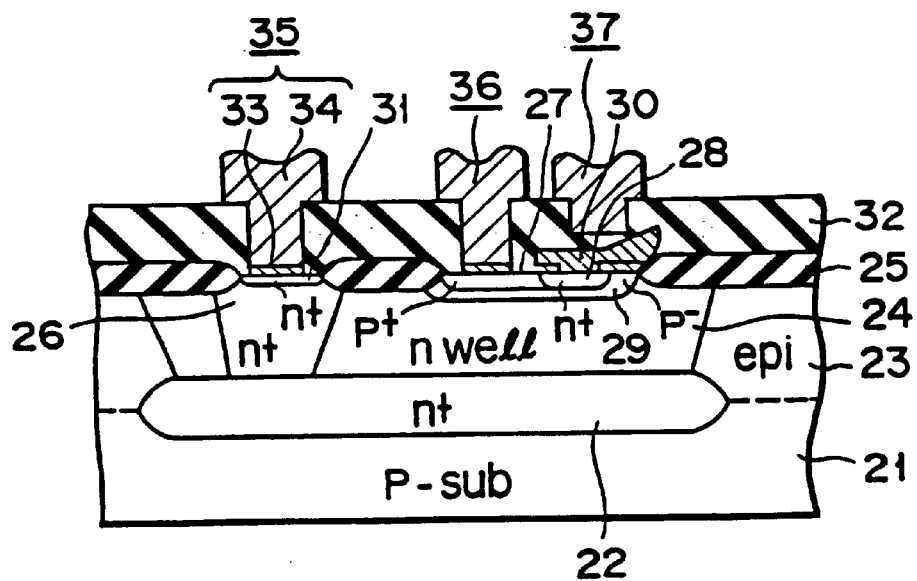
FIG. 53 is a sectional view of a semiconductor device having the circuit shown in FIG. 51A.

FIG. 53 shows a structure of a semiconductor device having the circuit shown in FIG. 51A. Referring to FIG. 53, n+-type buried layer 22 is formed on the surface of p−-type silicon substrate 21 so as to reduce a collector resistance. P−-type epitaxial silicon layer 23 is formed on buried layer 22. Phosphorus is doped in p−-type epitaxial silicon layer 23 to form n-type well layer 24. Field oxide film 25 is formed on the surfaces of n-type well layer 24 and epitaxial layer 23. Collector lead layer 26 extending to n+-type buried layer 22 and p−-type base region 29 are formed in an opening of field oxide film 25. P+-type base layer 28 is locally formed in p−-type base region 29, and n+-type emitter region 28 is formed in p−-type base region 29 to be in contact with p+-type layer 27. Emitter polyside layer 30 is formed on n+-type emitter region 28. Tunnel diode D is formed by p+-type layer 27 and emitter region 28. N+-type layer 31 is formed on the surface of collector lead layer 26.

The surface of the semiconductor structure as described above is covered with silicon oxide film 32, collector, base, and emitter electrodes 35, 36, and 37 formed of Al—Si layer 34 are formed in contact holes through Ti/TiN film 33.

Figure 54:
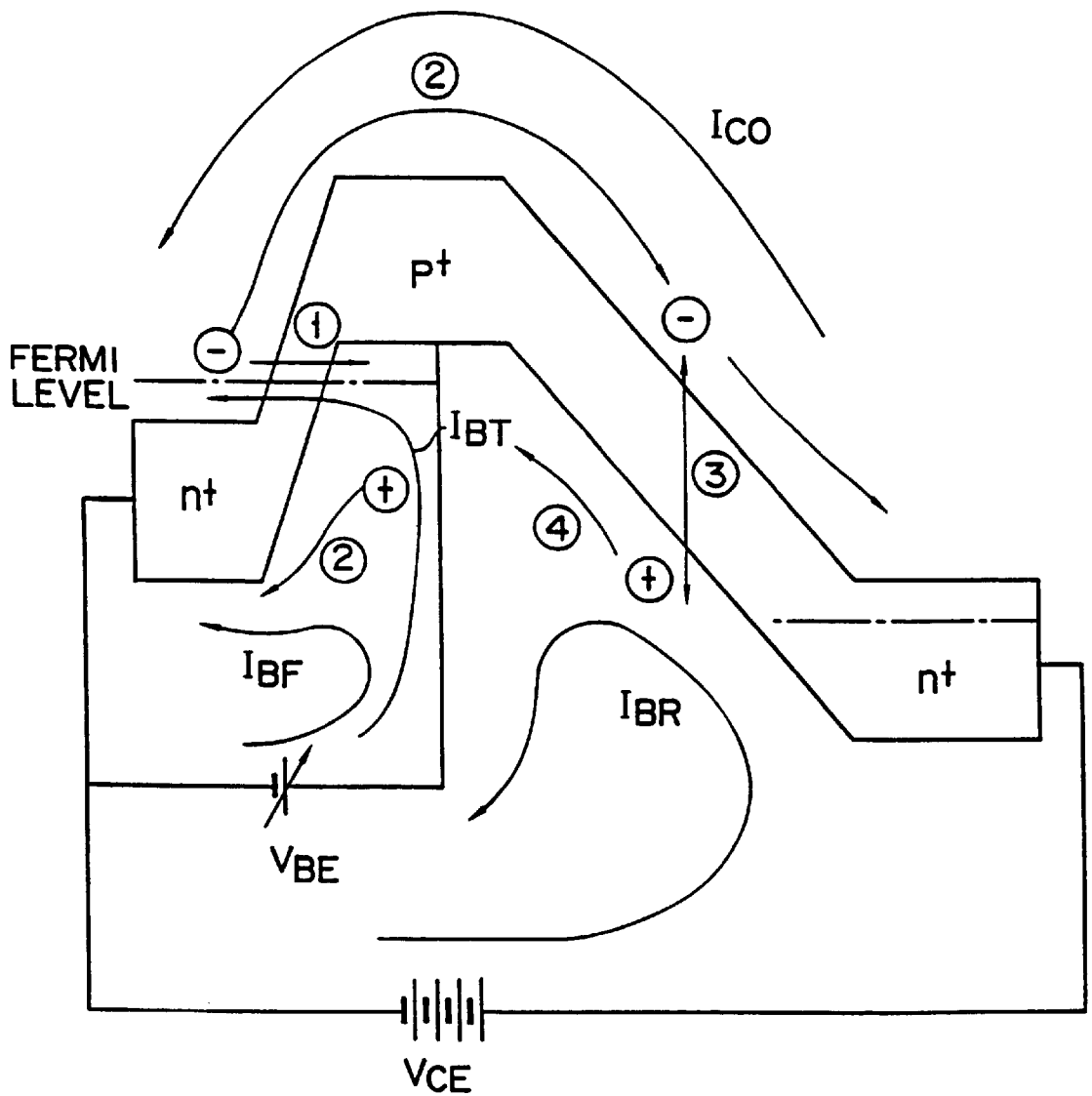
FIG. 54 is a circuit diagram for explaining an operation of the semiconductor device shown in FIG. 53.

The characteristics shown in FIG. 51B can be obtained by using a bipolar transistor in which an impurity is doped at a high concentration to cause contraction of the base of the bipolar transistor as well as the emitter. This will be explained with reference to FIG. 54.

When an impurity is doped in the base and emitter to cause contraction and when base-emitter voltage $V_{BE}$ is small, tunnel current $I_{BT}(1)$ indicated by broken curves in FIGS. 52A and 52B flows from the base to emitter more dominantly than diffusion current (2) (the sum of diffusion currents of holes from the emitter to the base). However, when base-emitter voltage $V_{BE}$ is further increased, electrons injected from the emitter to the base of the tunnel current cause negative base current $-I_B$ by the impact ionization phenomenon ((3) in FIG. 54) between the base and collector according to the same principle as described with reference to FIG. 7. The tunnel current based on this phenomenon can be expressed by the following relation:

$$I_{BE} = I_T ex[A2(V-VV)] \quad (7)$$

where $I_T$ is the valley current, VV is the valley voltage, and A2 is a constant.

Base current $I_B$ can be expressed by the following relation by adding relation (6) to relation (7):

$$I_{B'} = I_B + I_{BT} = \{1-(M-1)hfe)I_{BF}\} + I_T \exp[A2(V-VV)] \quad (8)$$

The device of this embodiment using the diode can be applied to a memory, a latch circuit, and the like, and can employ a pnp transistor in place of an NPN bipolar transistor.

Figure 55:
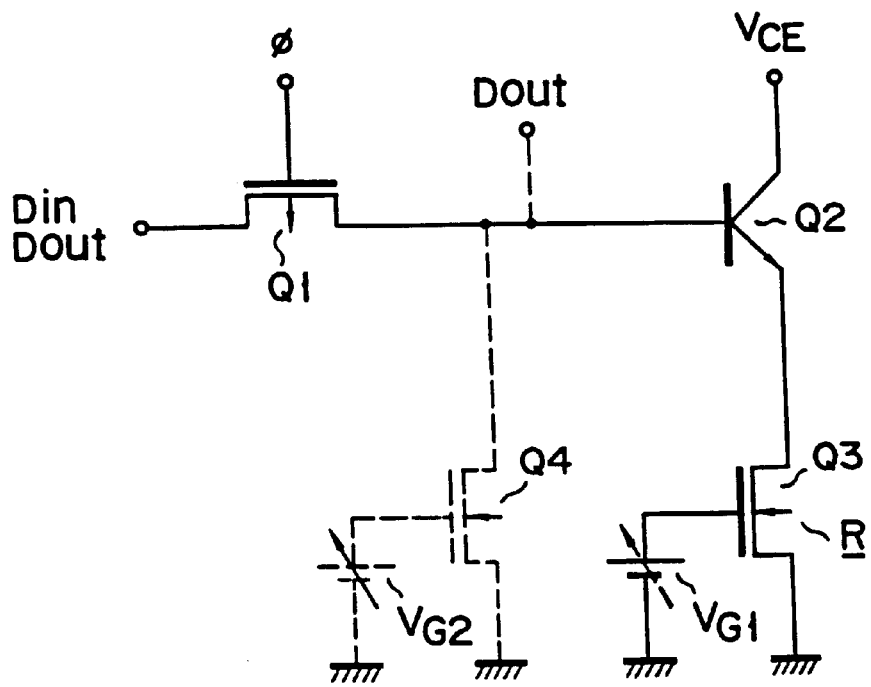
FIG. 55 is a principle circuit diagram of another modification of a voltage holding circuit.

FIG. 55 shows another modification of an embodiment of a voltage holding circuit. According to this modification, p-channel MOS transistor Q1 is connected to NPN bipolar transistor Q2, and the emitter of transistor Q2 is connected to variable resistor circuit R comprising n-channel MOS transistor Q3 and variable power source $V_{G1}$. Variable resistor circuit R may be connected not to the emitter but to the base, as indicated by a broken line.

In the above circuit, when a clock is input to transistor Q1 to turn it on, the potential at a Din terminal is written in the voltage holding circuit. In this case, if the potential at the Din terminal is larger than Vp, potential $V_H$ is latched by the base of transistor Q2 after clock φ is disabled. If the potential at the Din terminal is smaller than Vp, $V_L$ to 0 V is latched by the base of transistor Q2 after clock is disabled. Output Dout can be derived from the Din terminal or the node between transistors Q1 and Q2.

Figure 56A:
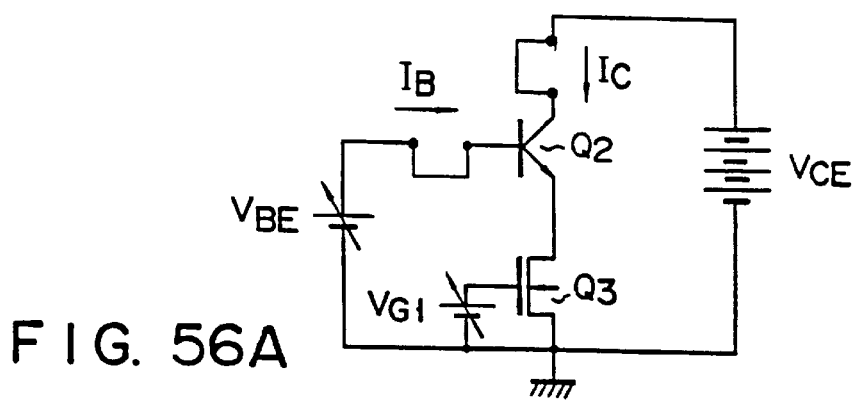
FIG. 56A is a circuit diagram of a voltage holding circuit utilizing the circuit shown in FIG. 55.
Figure 56B:
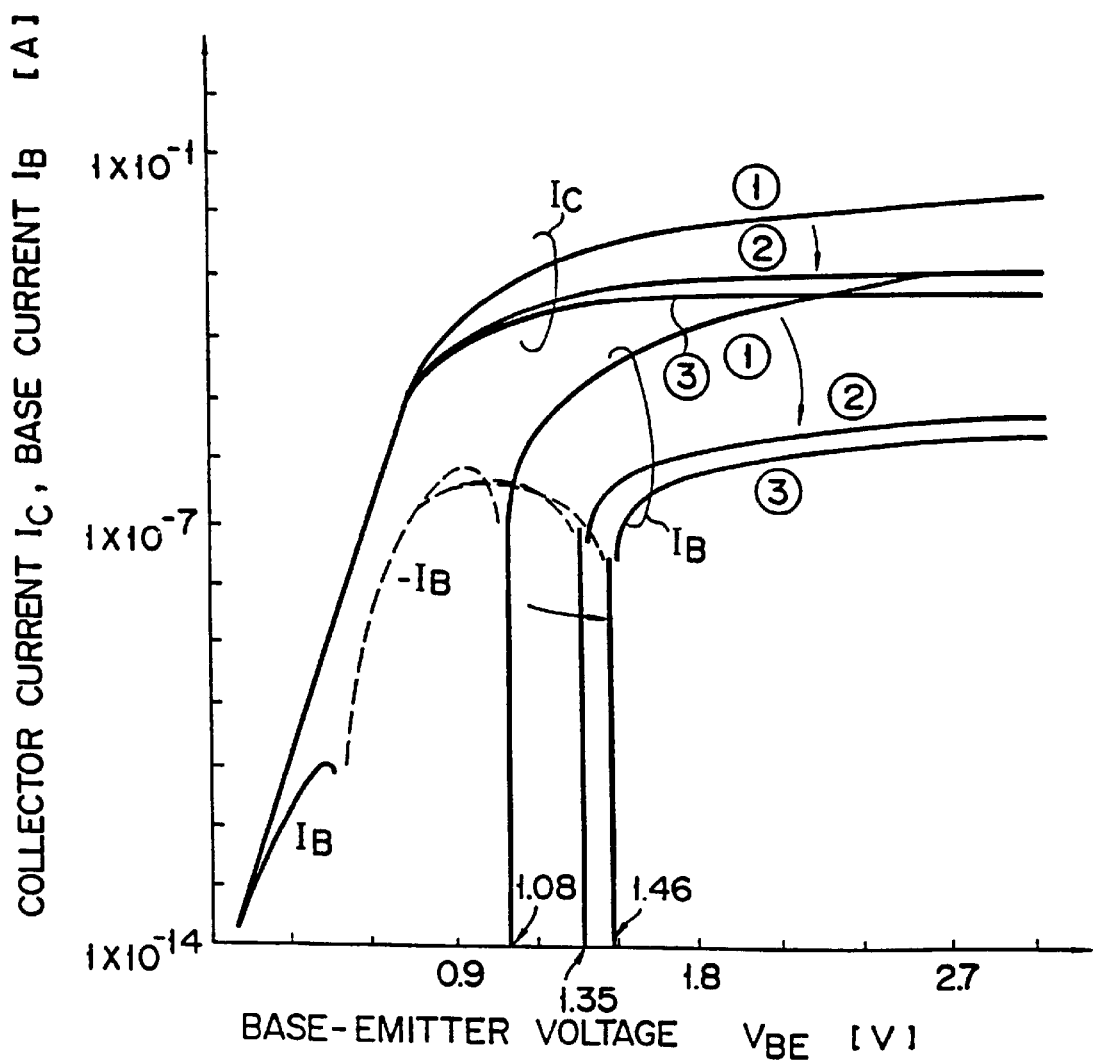
FIG. 56B is a graph showing voltage-current characteristics of the circuit shown in FIG. 56A.

In a circuit shown in FIG. 56A, when $V_{CE}$=7 V and no resistor circuit R is connected, voltage-current characteristics (1) can be obtained, as shown in FIG. 56B. In contrast to this, when the gate voltage of transistor Q3 is set to be 2.5 V or 5V, characteristics (2) or (3) can be obtained. In this case, the $V_H$ levels are respectively 1.08 V, 1.35 V, and 1.46 V. More specifically, when variable resistor element R is connected to the emitter write level $V_H$ can be desirably set.

In a circuit shown in FIG. 57A, resistor circuit R is connected to the base of bipolar transistor Q2. In this case, when $V_{G2}$=0.02 V, characteristics (2) shown in FIG. 57A are obtained. When $V_{G2}$=0.1 V, characteristics (3) are obtained. In this case, LOW-level side positive base current $I_B$ is increased. More specifically, in a LOW-level region, a write access speed can be desirably set.

In FIG. 55, at least one of transistors Q3 and Q4 can comprise a p-channel transistor. Transistor Q2 may comprise an npn transistor. Furthermore, transistor Q2 may comprise an npn transistor, and one or both of transistors Q3 and Q4 may comprise a p-channel transistor.

Figure 58:
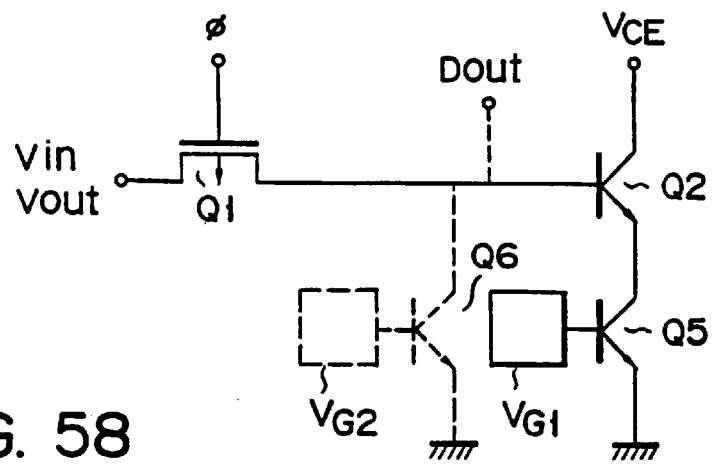
FIGS. 58, 59, and 60 are circuit diagrams of three voltage holding circuits according to other modifications.

FIG. 58 shows a circuit wherein npn transistors Q5 and Q6 are used in place of transistors Q3 and Q4. In FIG. 58, $V_{G1}$ and $V_{G2}$ represent variable power sources.

In this circuit, one of transistors Q2, Q5, and Q6 may comprise an npn or pnp transistor, and the remaining two transistors may comprise pnp or npn transistors. Alternatively, all transistors Q2, Q5, and Q6 may comprise PNP transistors. The types of transistor can be changed by arranging transistors Q5 and Q6.

Figure 59:
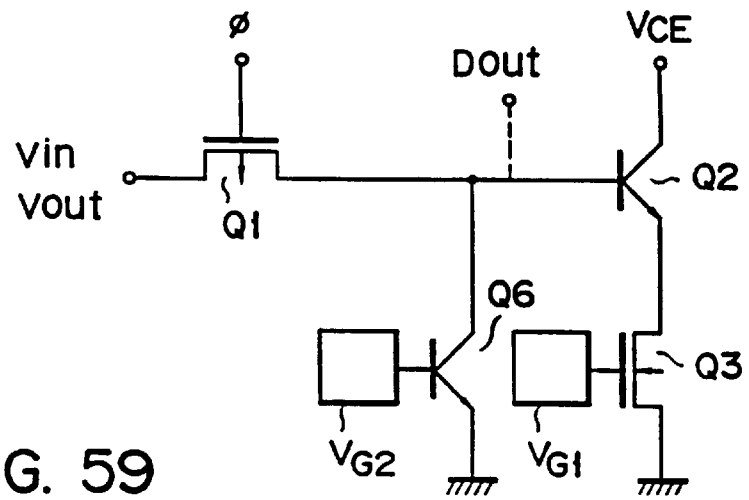

FIG. 59 shows a circuit wherein the emitter of bipolar transistor Q2 is connected to n-channel MOS transistor Q3, and the base of transistor Q2 is connected to npn bipolar transistor Q6. With this circuit, transistor Q3 may comprise a p-channel MOS transistor, and/or transistor Q6 may comprise a pnp transistor. Transistor Q2 may comprise a pnp transistor. Furthermore, transistor Q2 may comprise a pnp transistor, transistor Q3 may comprise a p-channel MOS transistor, and/or transistor Q6 may comprise an npn transistor.

Figure 60:
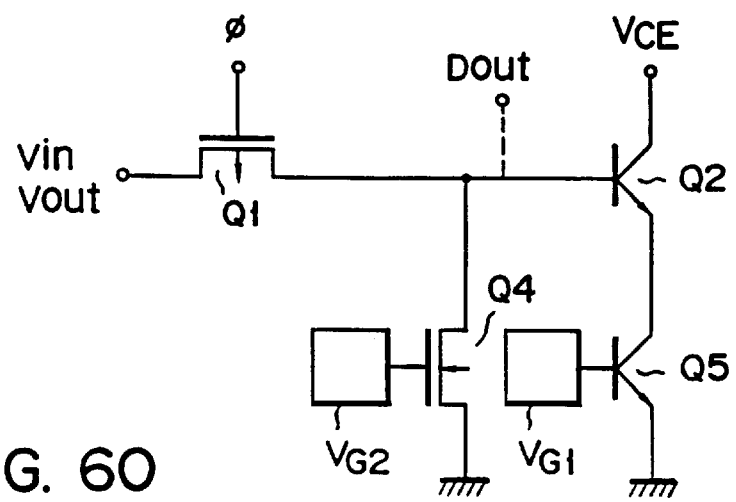

FIG. 60 shows an embodiment of a circuit wherein the emitter of bipolar transistor Q2 is connected to npn bipolar transistor Q5, and the base of transistor Q2 is connected to n-channel MOS transistor Q4. In this circuit, transistor Q5 may comprise a pnp transistor and/or transistor Q4 may comprise a p-channel MOS transistor. Transistor Q2 may comprise a pnp bipolar transistor. Transistor Q5 may comprise a pnp transistor, or transistor Q4 may comprise a p-channel MOS transistor. Furthermore, transistor Q1 may comprise an n-channel MOS transistor in place of p-channel MOS transistor.

FIGS. 61 to 65 show another embodiment when the present invention is applied to a memory.

According to the memory cell circuit shown in FIG. 61, the source or drain of MOS transistor (write transistor) Q1 as the switching element is connected to the base of bipolar transistor Q2 described above. The gate of transistor Q1 is connected to word line WL, and is also connected to the gate of MOS transistor (read transistor) Q3. The source of MOS transistor Q3 is connected to the drain of MOS transistor (read transistor) Q4, and the gate of transistor Q4 is connected to the base of bipolar transistor Q2. The drain or source of transistor Q1 is connected to write bit line WBL, and the drain of transistor Q3 is connected to read bit line RBL. MOS transistors; Q1, Q3, and Q4 are of p-channel type (or n-channel type), and bipolar transistor Q2 is of an npn type in this embodiment.

Threshold voltage value $V_{TM1}$ of MOS transistor Q1 is set to be lower than threshold voltage value $V_{TM3}$ of transistor Q3, e.g., $V_{TM1}$=−3 V and $V_{TM3}$=−1 V. Threshold voltage value $V_{TM4}$ of transistor Q4 is set to be equal to, e.g., $V_{TM3}$ (FIG. 62).

The memory cell shown in FIG. 61 operates to have two stable points $V_{BE0}$ and $V_{BE1}$ in the same manner as that shown in FIG. 34. With this memory cell, base-emitter capacitor $C_{BE}$, base-collector capacitor $C_{BC}$, and gate-source capacitor $C_{GS}$ of MOS transistor Q3 are present, and storage capacitor $C_S$ ($C_S$=$C_{BE}$+$C_{BC}$+$C_{GS}$) is formed at storage node S of the cell.

When data is written in the memory cell, the potential of word line WL decreases below $V_{TM1}$, and transistor Q1 is enabled. In this case, when $V_{BE0}$ for "0" data or $V_{BE1}$ for "1" data is applied from write bit line WBL to storage node S, corresponding data "0" or "1" is written in storage node S.

When data is read out from the memory cell, potential $V_{WL}$ of word line WL is set to satisfy $V_{TM1}$<$V_{WL}$<$V_{TM3}$. In this case, MOS transistor Q1 is disabled, and transistor Q3 is enabled. Therefore, if the potential at node S is $V_{BE0}$, the potential at node A is given by $V_{BE0}$+|$V_{TM4}$|. If the potential at node S is $V_{BE1}$, the potential at node A is given by $V_{BE1}$+|$V_{TM4}$|. Therefore, this potential $V_{BE1}$+|$V_{TM4}$| is output onto read bit line RBL.

FIG. 63 shows a memory constituted by a memory cell array and a peripheral circuit using N×M memory cells MCij (i=1 to N, j=1 to M) each having the arrangement shown in FIG. 61. According to this memory, N word lines (row direction), M write bit lines WBL and M read bit lines RBL (column direction) are arranged.

Selection signal CSLj controls a transfer gate, which is enabled when a column is selected, i.e., an n-channel MOS transistor. Input buffer circuit 71 is arranged to write input data onto write line 72, and output buffer circuit 73 is arranged to amplify and output data from read line 74.

Figure 64:
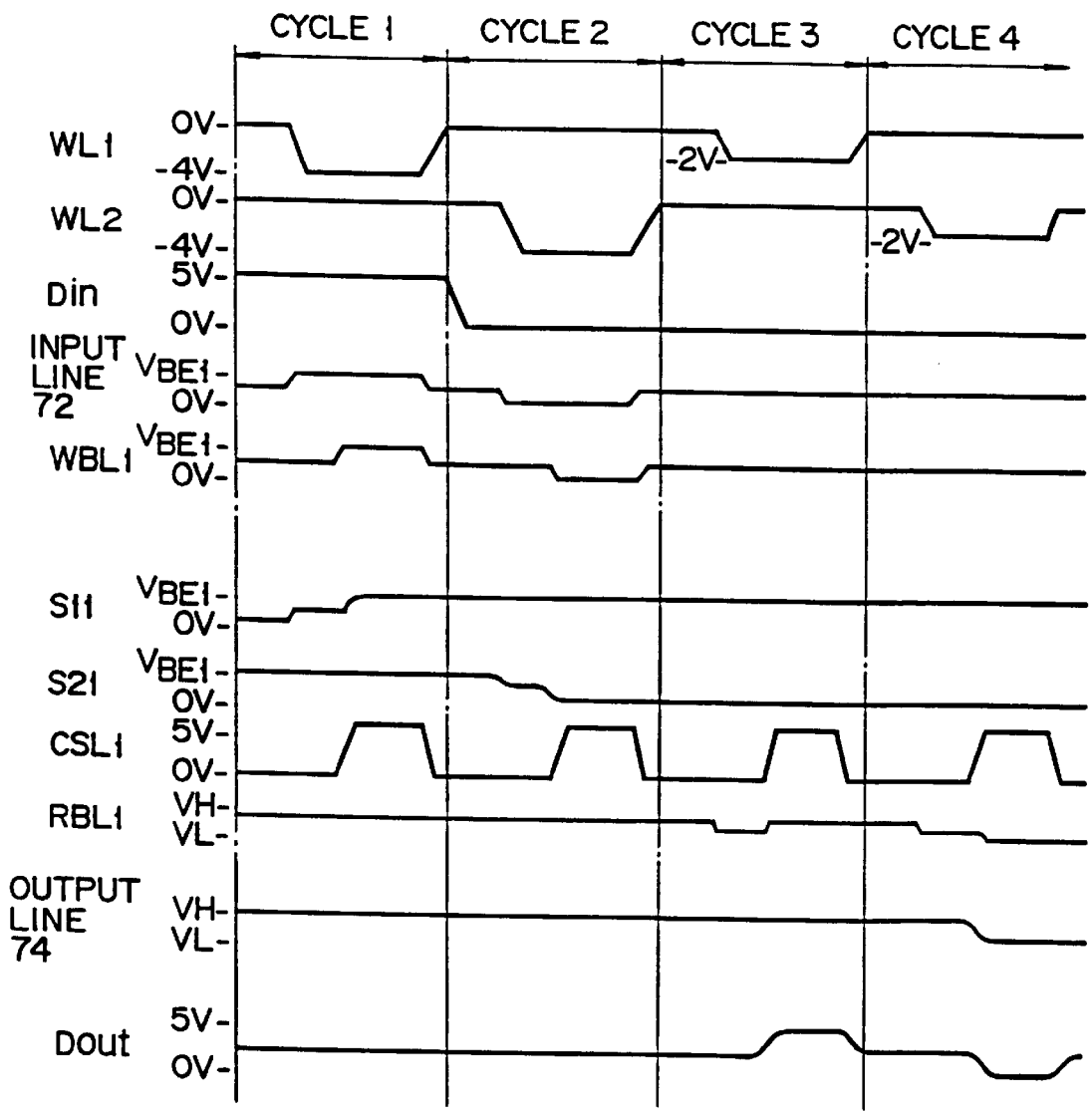
FIG. 64 is a timing chart for explaining the operation of the circuit shown in FIG. 63.

FIG. 64 is a timing chart for explaining a read/write access of the memory shown in FIG. 63. This timing chart illustrates an operation wherein data "1" is written in memory cell MC11, data "0" is written in cell MC21, data is read out from cell MC11, and data is then read out from cell MC21. Nodes S11 and S21 are storage nodes S of memory cells MC11 and MC21, respectively.

In cycle 1 for writing data "1" in cell MC11, word line WL1 is selected by a row address, and word line WL1 is set to be −4 V. In this case, data input Din is at "H" level (5 V), and $V_{BE1}$=0.87 V as a "1" write level is written from input buffer circuit 71 in input signal line 72. When signal CSL1 for selecting bit line WBL1 goes to "H" level in correspondence with a column selection address, transfer gate M41 is enabled. Therefore, the level=0.87 V of input signal line 72 is written in storage node S11 of memory cell MC11 through transfer gate M41 and write bit line BL1. Thereafter, word line WL1 is disabled.

The level written in input signal line 72 can be a level higher than a $V_{BE1}$ level since the potential at node S11 is stabilized at $V_{BE1}$ by positive base current IB after write word line WL1 to storage node S11 is disabled. In other words, the write level can be any value equal to or lower than Vp.

In cycle 2 for writing data "0" in cell MC21, word line WL2 is selected, and input signal line 72 is set at 0 V as a "0" write level. When signal CSL2 goes to "H" level, bit line WBLL1 is set at 0 V, and 0 V is written in storage node S21 of memory cell MC21. Thereafter, word line WL2 is disabled. The write level need not always be 0 V but can be any value equal to or lower than Vp. That is, if the write level is equal to or lower than Vp, node S21 can be stabilized at 0 V by positive base current $I_B$ after the word line is disabled.

Note that the read bit line and output signal line 74 are left precharged at $V_H$ in a write mode, and are not floated.

In cycle 3 for reading out data from cell MC11, word line WL1 is selected and is set at −2 V. This level is an intermediate value between threshold levels $V_{TM1}$ and $V_{TM3}$. In this case, since transistors Q1 and Q3 are of p-channel type, transistor Q1 is turned off and transistor Q3 is turned on. Since potential $V_{BE1}$ is held at storage node S11 of memory cell MC11, $V_H$ level equal to $V_{BE1}$+|$V_{TM4}$| appears at node A. $V_{BE1}$+|$V_{TM4}$| appears on read bit line $R_{BL1}$.

In cycles 3 and 4, read bit line RBL and output signal line 74 are precharged to $V_H$ before access. When signal CSL1 goes to "H" level in correspondence with a column selection address, $V_H$ data is transferred from read bit line RBL1 to output signal line 74. The VH data is sensed by amplifier 73, output signal line 74 is maintained at $V_H$, and read bit line RBL1 is set at VH. The VH data is amplified to 5 V by output buffer circuit 75, and is output as data Dout.

In cycle 4 for reading out data from cell MC21, word line WL2 is selected, and is set at −2 V. Thus, transistor Q1 is turned off and transistor Q3 is turned on. Since the potential at storage node S21 is ∼0 V corresponding to "0" data, VL data (=0 to 1 V) concerning threshold value voltage VTM4 of transistor Q4 is output onto read bit line RBL. The VL data is transferred onto output signal line 74 when signal CSL2 is selected. The VL data is sensed by amplifier 73 to be $V_L$, and output signal line 74 and read bit line RBL1 are set at $V_L$. The VL data is converted to 0 V by output buffer circuit 73, and is output as data Dout.

Figure 65:
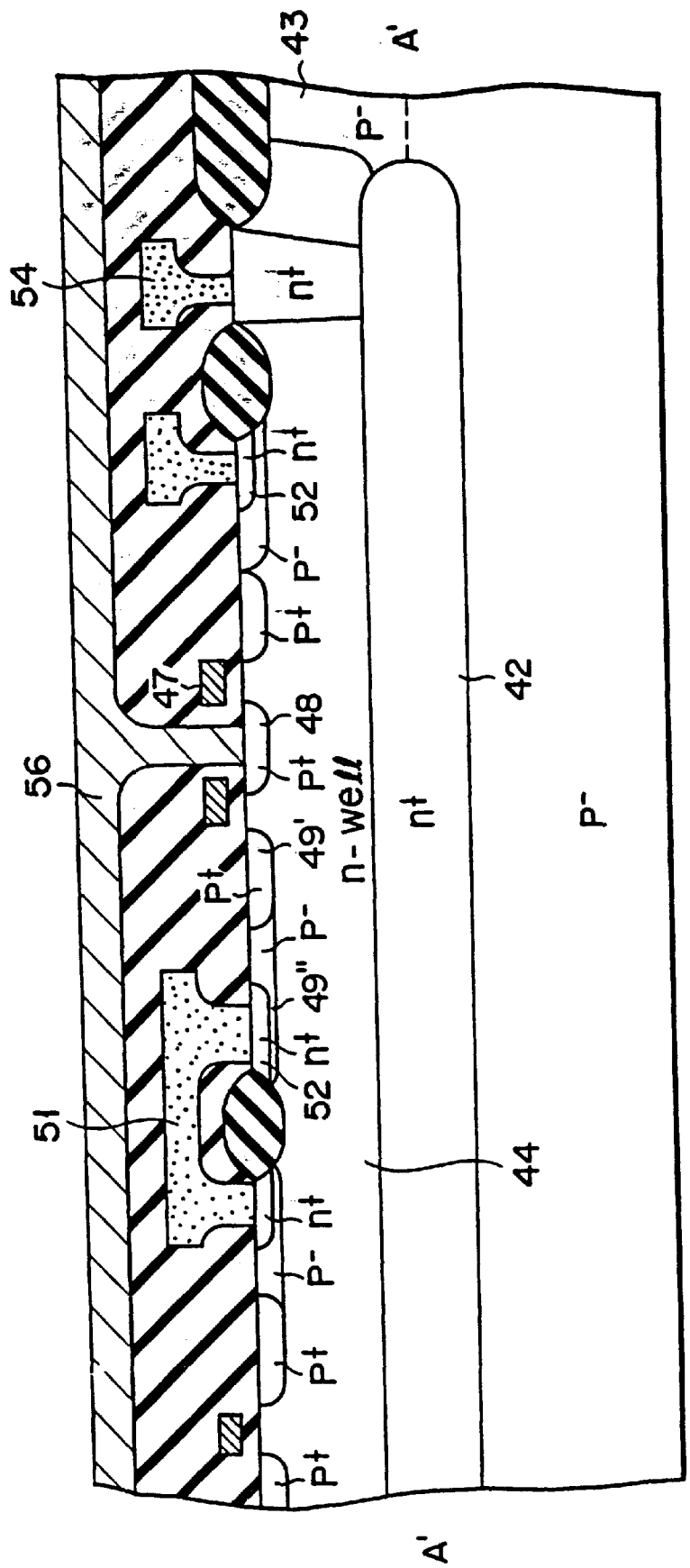
FIG. 65 is a sectional view of a semiconductor device according the modification shown in FIG. 45.

FIG. 65 shows a modification of FIG. 45. With this modification, emitter 52 is formed in p⁻-type base region 49" to be separate from source and drain regions 48 and 49'. Emitter electrode 53 is commonly used by emitters adjacent to each other through a field oxide film, and extends in a word line extending direction.

Source or drain region 49' is formed adjacent to p⁻-type base region 49". With this structure, an electrode for connecting these regions can be omitted.

FIGS. 41 to 45 and FIG. 65 show the semiconductor devices using the p-channel MOS transistor and the npn bipolar transistor. However, an n-channel MOS transistor and a pnp bipolar transistor may be employed. The semiconductor device can be applied to a latch circuit, a reference potential generating circuit, and the like as well as the memory.

In the above embodiment, the emitter resistance and base-emitter resistance described with reference to FIGS. 46 to 50B can be applied to the embodiment shown in FIGS. 61 to 64, and the technique shown in FIGS. 41 to 45 and FIGS. 65 can be applied to the memory shown in FIGS. 61 to 64.

Figure 66:
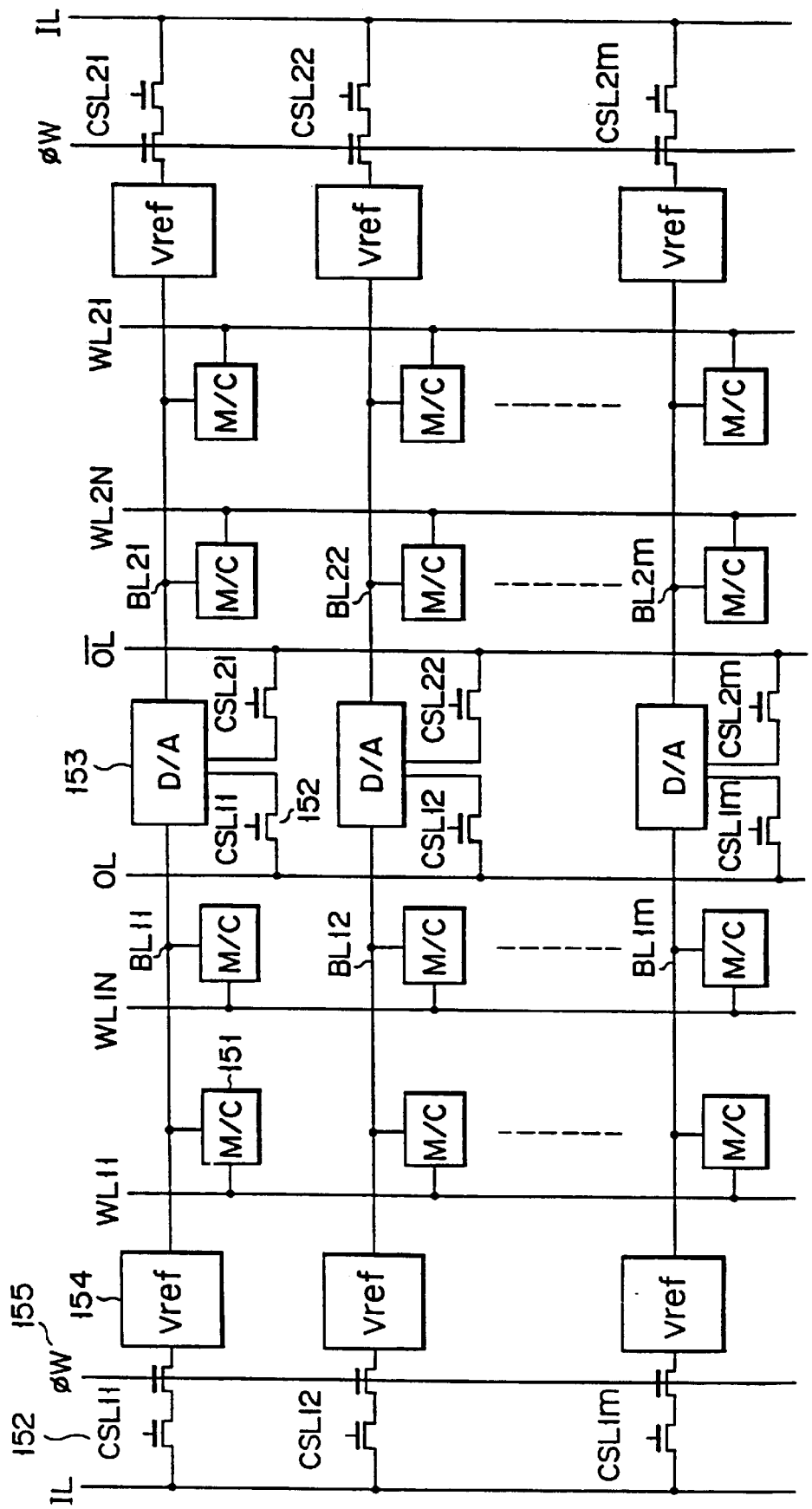
FIG. 66 is a circuit diagram of an SRAM employing the present invention.

FIG. 66 is a circuit diagram of a memory comprising memory cells and sense amplifiers. According to this memory, memory cells 151 of an SRAM are connected to differential amplifiers 153 as sense amplifiers through bit lines (BL11 to BL2m) and column selection gates 152. The outputs of the differential amplifiers are connected to output lines OL and $\overline{OL}$.

The bit lines (BL11 to BL2m) are connected to reference potential generating circuits 154 each having Vp as bit line potential $V_{BL}$. The bit lines (BL11 to BL2m) are connected to input lines IL and $\overline{IL}$ through write gates 155 and column selection gates 152.

Figure 68:
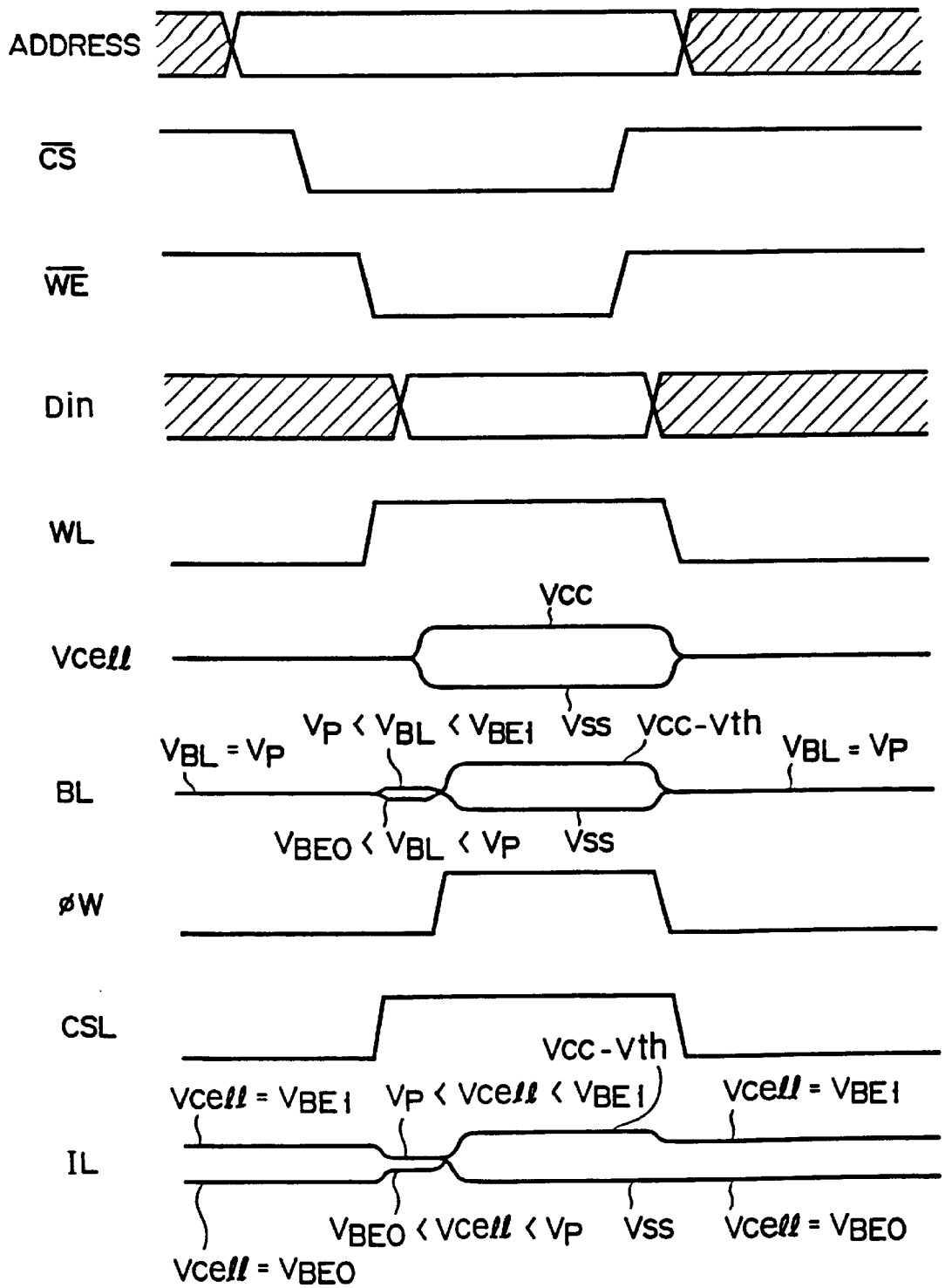
FIG. 68 is a timing chart showing a read operation of the SRAM shown in FIG. 66.

The read/write access of the memory shown in FIG. 66 will be described below with reference to the timing charts shown in FIGS. 67 and 68.

A read cycle shown in FIG. 67 will be described first. When external input signal CS is set in an active state, word line WL selected by a row address is enabled. Base potential Vcell of each memory cell is Vcell=$V_{BE1}$ when storage data is "1", and is Vcell=$V_{BE0}$ when storage data is "0". When word line WL is selected, a ratio potential with respect to each reference potential generating circuit connected to a bit line becomes Vp<Vcell<$V_{BE1}$ when data is "1" and becomes $V_{BE0}$<Vcell<Vp when it is "0". In this case, bit line potential $V_{BL}$ is equal to Vcell. Each differential amplifier 153 is connected to a bit line which selects a memory cell and a bit line which does not select a memory cell. More specifically, differential amplifier 153 amplifies a potential difference between $V_{BL}$=Vp and Vp<$V_{BL}$<$V_{BE1}$ ("1" read) or $V_{BL}$=Vp and $V_{BE0}$<$V_{BL}$<Vp ("0" read), and outputs data on a bit line designated by column selection signal CSL onto output lines OL and $\overline{OL}$. Thus, "1" or "0" data is read out from data out terminal Dout.

A write cycle will be described below with reference to FIG. 68. When write control signal WE is set in an active state after external input signal CS, a write cycle starts. First, when word line WL is enabled, data in a memory cell is transferred onto corresponding bit line BL in the same manner as in the read cycle. Next, when write gate 155 is enabled, data on external input data in terminal Din is written in bit line BL through input line IL. At this time, a bit line in which data is to be written is selected in advance by column selection signal CSL. FIG. 39 illustrates an operation for writing data opposite to stored data like "1"→"0" or "0"→"1". Bit line potential VBL when data "1" is written is $V_{BL}$=Vcc−Vth (Vth is a threshold voltage of column selection gate 152 and write gate 155). When both column selection signal OSL and write gate control signal ϕW are increased to exceed Vcc−Vth, bit line potential $V_{BL}$ at that time is not decreased to Vth and is set to be $V_{BL}$=Vcc.

Figure 69:
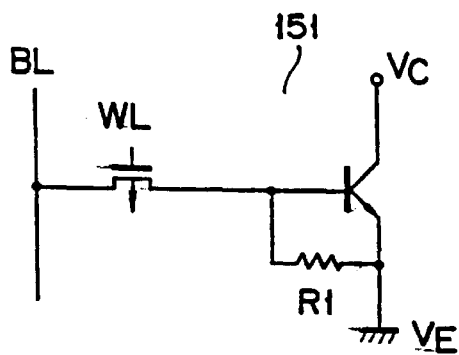
FIGS. 69 and 70 are circuit diagrams of a memory cell added with a resistor.
Figure 70:
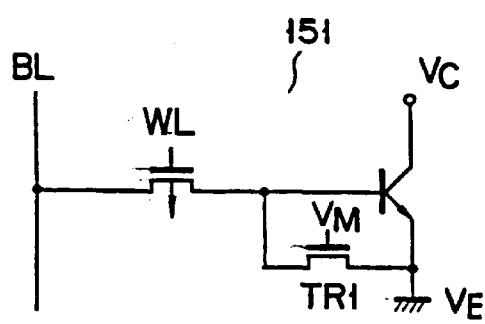

FIGS. 69 and 70 are detailed circuit diagrams of memory cell 151. A resistor is added between the base and emitter of a bipolar transistor of the memory cell, as shown in FIGS. 69 and 70. As shown in FIG. 70, in place of resistor R1, gate voltage $V_M$ is controlled to be a value equal to or lower than the threshold voltage of transistor TR1 by MOS transistor TR1, i.e., transistor TR1 can be operated in a sub-threshold region.

Figure 71:
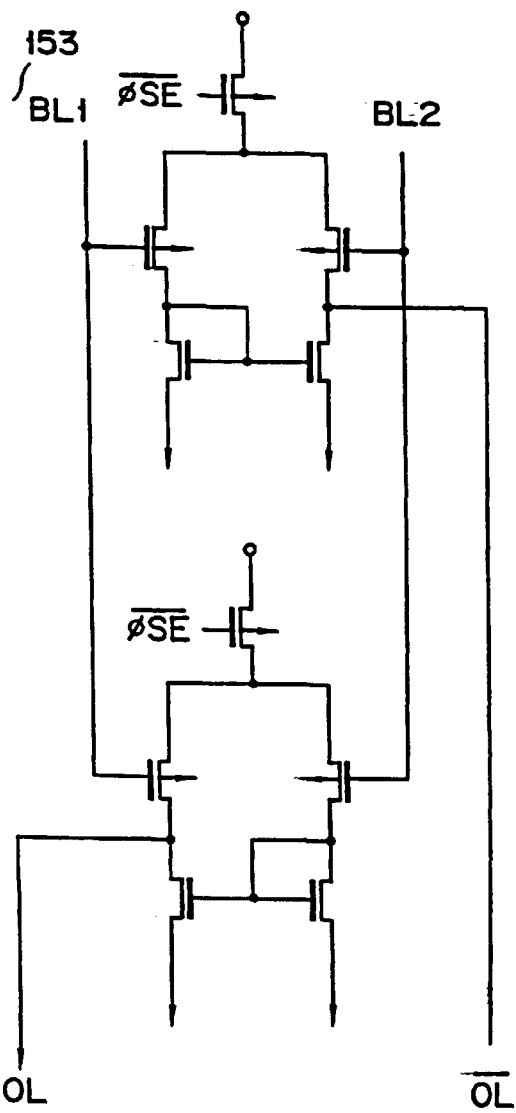
FIG. 71 is a circuit diagram of a differential amplifier.

FIG. 71 is a circuit diagram of differential amplifier 153. When clock ϕSE goes to LOW level, differential amplifier L53 is enabled.

Figure 72:
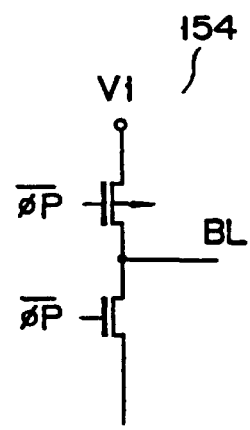
FIG. 72 is a circuit diagram of a reference potential generating circuit.

FIG. 72 is a circuit diagram of reference potential generating circuit 154. Potentials V1, $\overline{\phi P}$, and $\overline{\phi P}$ are set so that potential $V_{BL}$ bit line BL in a steady state becomes $V_{BL}$=Vp.

Figure 73:
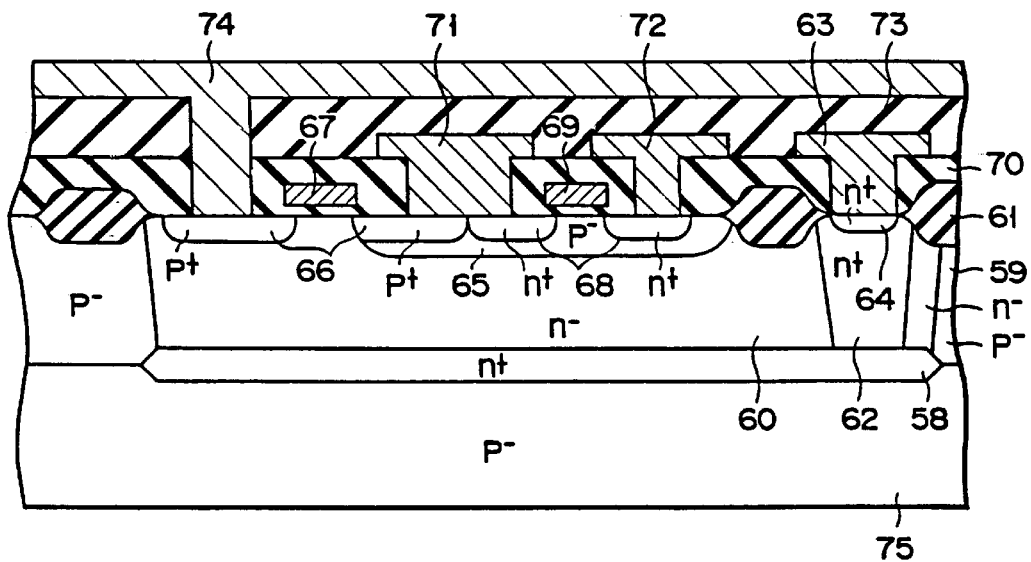
FIG. 73 is a sectional view of a semiconductor device in which a resistor is added to the circuit shown in FIG. 46.

FIG. 73 shows a modification when resistor R1 is arranged in FIG. 46. In FIG. 73, a MOS transistor is parallelly connected as a resistor between the base and emitter. N$^+$-type buried layer 58 is formed on the surface of p$^-$-type silicon substrate 75 so as to reduce a collector resistance, and p$^-$-type epitaxial silicon layer 59 is formed thereon. N-type well 60 is formed in p$^-$-type epitaxial silicon layer 59, and field oxide film 61 is formed on the surfaces of silicon layer 59 and n-type well 60. Collector lead layer 62 extending to n$^+$-type buried layer 58 and n$^+$-type region 64 for forming an ohmic contact with collector electrode 63 are formed in one of openings formed in oxide film 61. P$^-$-type base region 65 of a bipolar transistor is formed in the other opening, P$^+$-type source and drain regions 66 of a p-channel MOS transistor are formed in self alignment using gate electrode 67 as a mask. P$^+$-type source and drain regions 66 are formed in one process. Gate electrode 67 is used as a word line of a memory cell array. N$^+$-type source and drain regions 68 shallower than the p$^-$-type base region are formed in p$^-$-type base region 65 in self alignment in one process using gate electrode 69 as a mask. SiO$_2$ film 70 is deposited on the entire surface of the resultant semiconductor structure by CVD. An opening is formed above p$^+$-type regions 66 formed in p$^-$-type base region 65 and an n$^+$-type region 65 portion adjacent to region 66, and regions 65 and 66 are connected to electrode 71 through this opening, so that p$^-$-type base region 65 and n$^+$-type region 68 are kept at the same potential.

An opening is formed above n$^+$-type region 68 which is formed in p$^-$-type base region 65 and also serves as an emitter, and electrode 72 is connected to region 68 through this opening. Silicon oxide film 73 is deposited on the upper surface of the semiconductor structure, and bit line contact holes are formed in silicon oxide film 73. A bit line of electrode 74 is formed through the contact hole.

In the semiconductor device, an n-channel MOS transistor formed in base region 65 serves as a resistor which is parallelly connected to the base and emitter. When a gate voltage is set to be a desired value, the semiconductor device shown in FIG. 73 provides the same characteristics as those shown in FIG. 48. Since the n-channel MOS transistor is formed in the base region, a structure suitable for high integration can be obtained.

Channel implantation for controlling a threshold value can be performed in a channel region between n-and p-channel MOS transistors.

Figure 74:
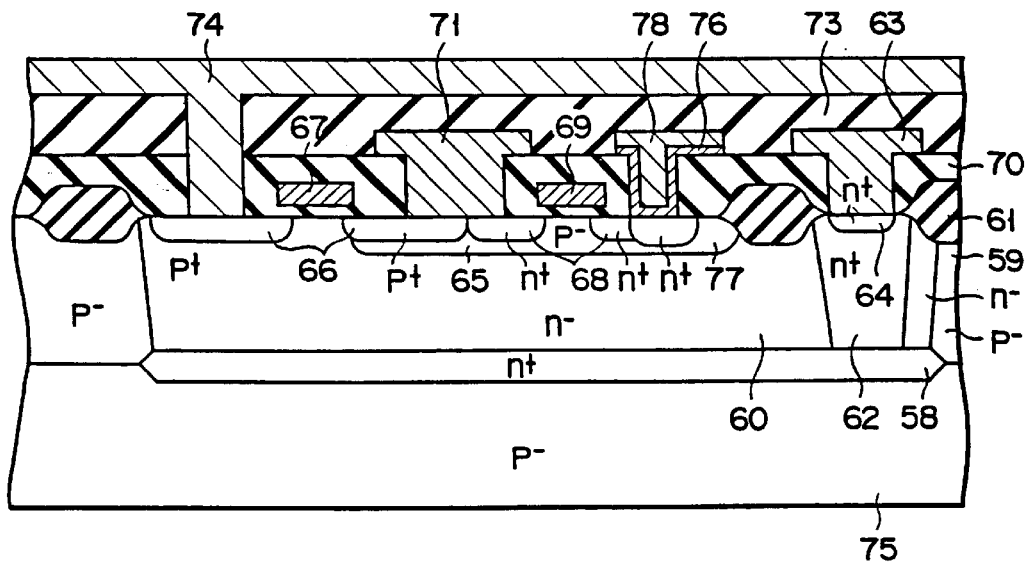
FIG. 74 is a sectional view of a semiconductor device using polysilicon in the device shown in FIG. 73.

According to the semiconductor device shown in FIG. 74, a doner impurity is doped on p$^-$-type base region 65 through polysilicon 76 adjacent to the source and drain on the n-channel MOS transistor in FIG. 73 to form n$^+$-type emitter region 77, and an emitter electrode is formed thereon by MoSi film 78. Polysilicon gate electrodes 67 and 69 and emitter polysilicon 76 can be formed by the same polysilicon.

FIGS. 73 and 74 show only one cell portion. However, when a plurality of cells are formed on a substrate, the n$^+$-type buried layer is formed by a continuous layer, and collector lead layer 62 is formed common to the cells. Between adjacent cells, bit line 74 has a folded structure with respect to contacting source region (p$^+$-type region) 66. However, p$^+$-type source region 66 may be commonly used.

Figure 82A:
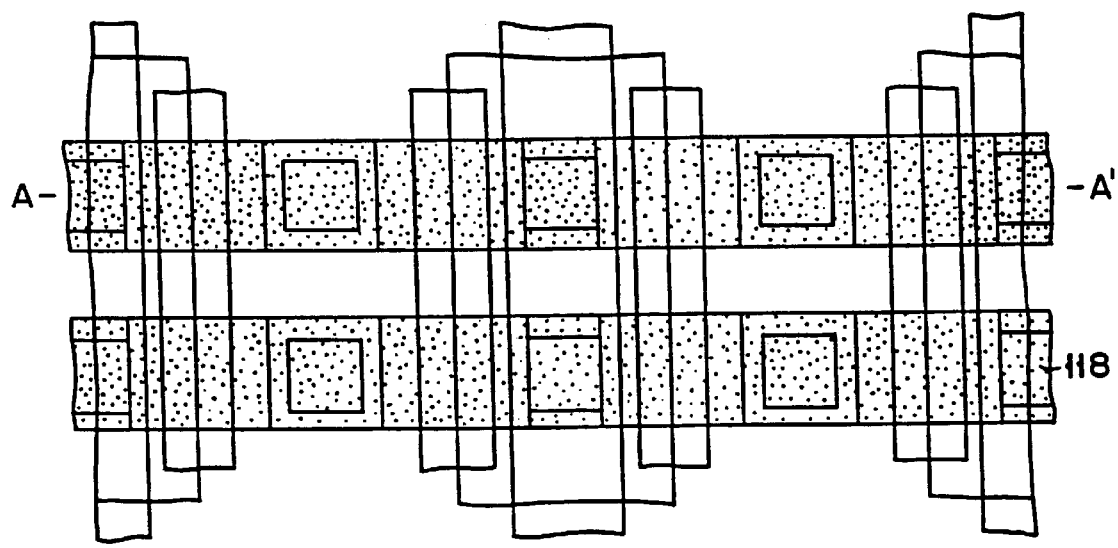
Figure 82B:
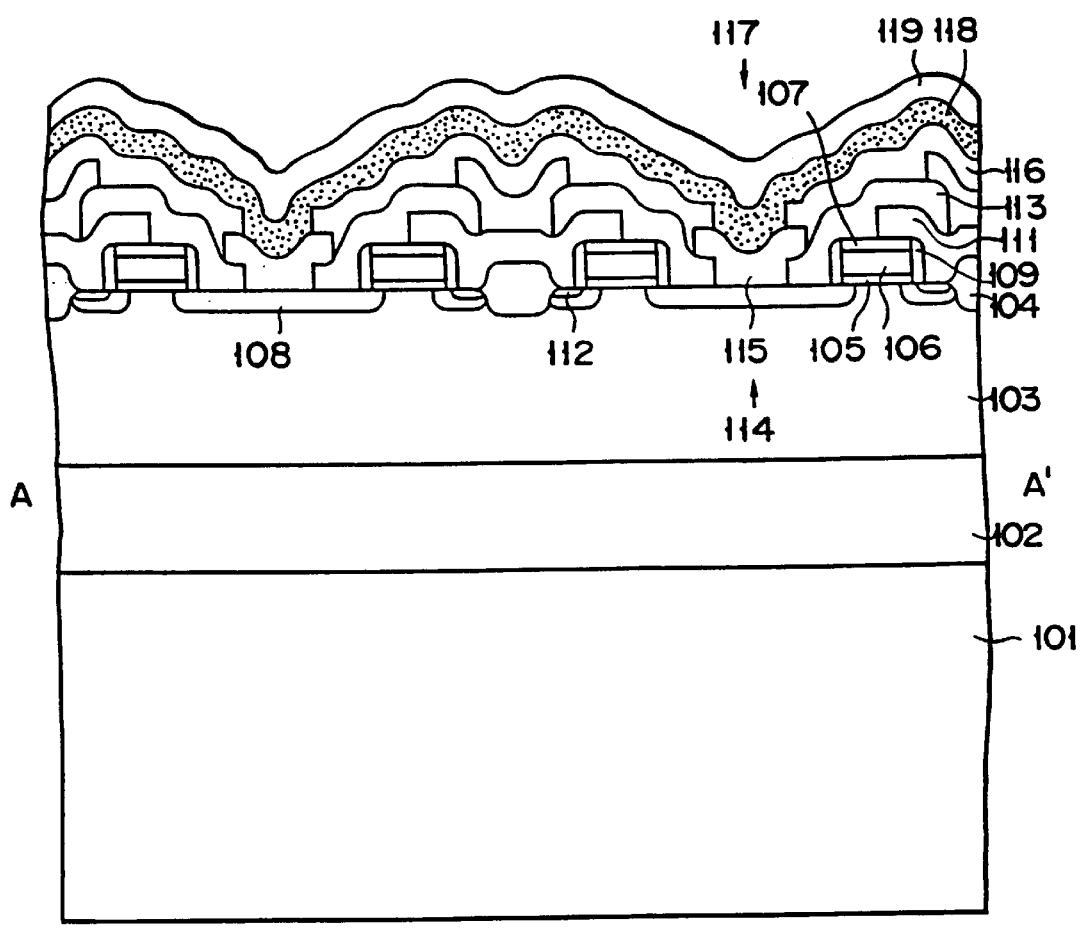
Figure 84A:
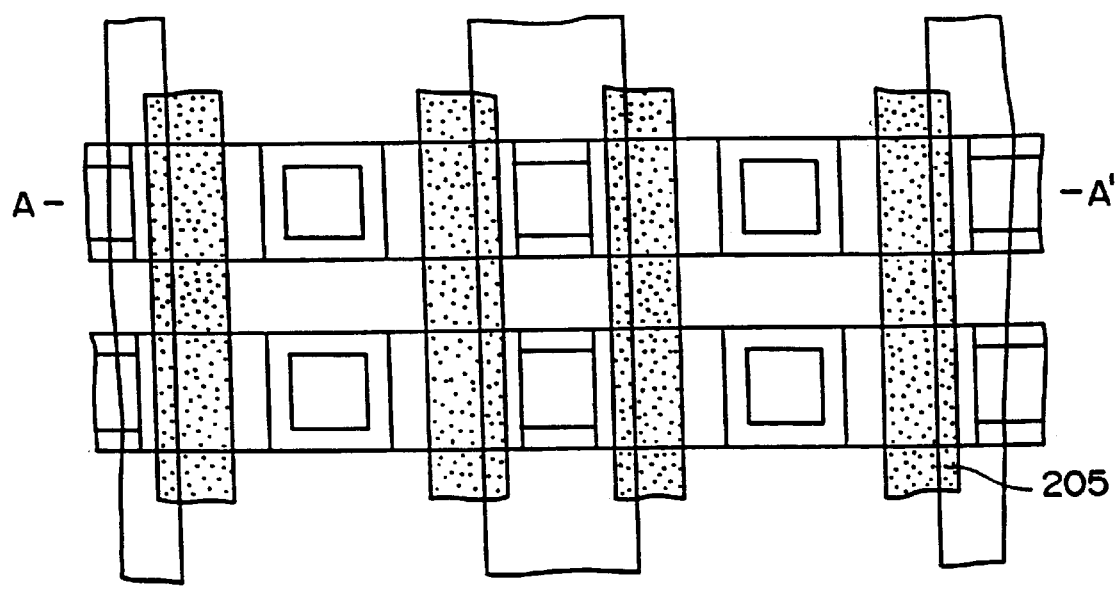
Figure 84B:
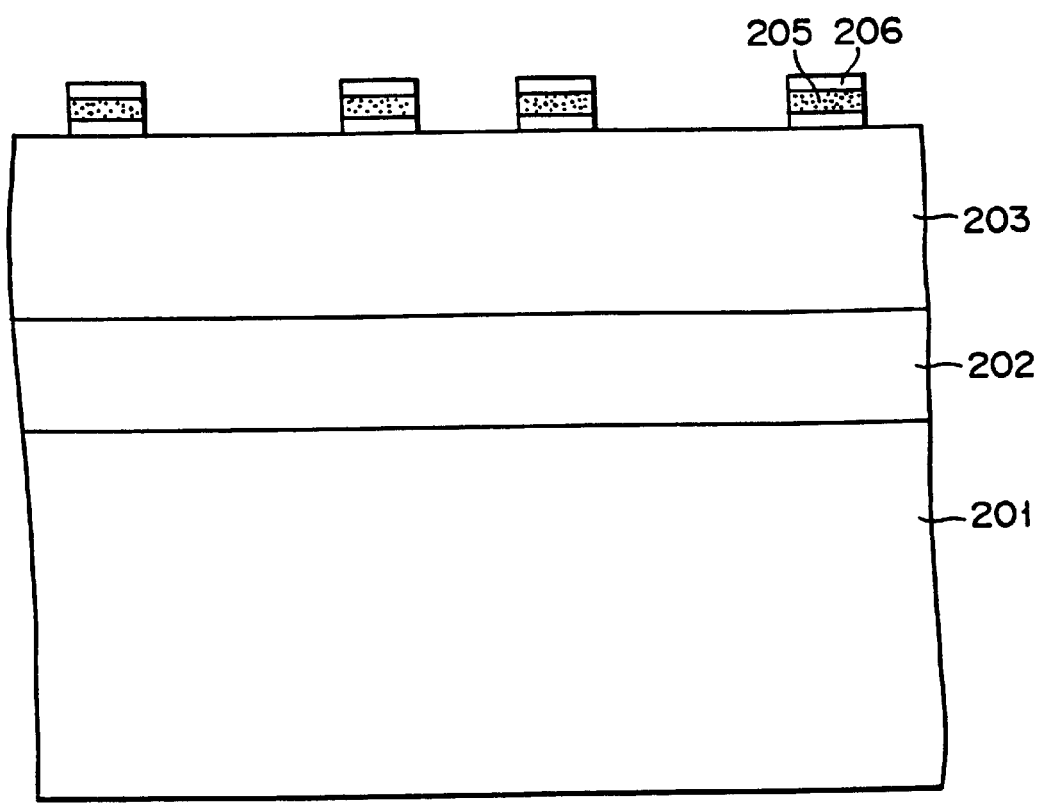

FIGS. 82A and 82B show the structure of an SRAM. For example, the SRAM circuit is the same as that shown in FIG. 35.

According to this SRAM, n$^+$-type buried layer 102 for reducing a collector resistance is formed on the surface of p$^-$-type silicon substrate 101. N-type well 103 is formed in a p$^-$-type epitaxial silicon film having a boron concentration of 1×10$^{15}$ cm$^{-3}$ and a thickness of, e.g., 2.5 μm. Element isolation is performed by a conventional co-planar method, and field oxide film 104 as a thermal oxidation film is formed.

A p-channel MOS transistor and npn bipolar transistor constituting a memory cell are formed in another element region.

Gate electrode 106 of the p-channel MOS transistor is formed of a first polysilicon layer, and p$^+$-type layer 108 and n-type well 103 serving as the source and drain of the MOS transistor are formed in self alignment using the gate electrode as a mask. Of the source and drain regions, a region used as the base region of the npn bipolar transistor may be formed in a different process, and may be changed to be a p$^-$-type layer (low concentration layer).

An emitter is formed by doping arsenic from second polysilicon layer 111. N-type emitter 112 has an impurity concentration of 2×10$^{20}$ cm$^{-3}$ and a junction depth of 0.15 μm, and p$^-$-type base 108 has an impurity concentration of $3 \times 10^{18}$ cm$^{-3}$ and a junction depth 0.3 μm. An emitter electrode is formed on emitter polysilicon 111 by patterning first Al electrode layer 115.

Silicon oxide film 116 is deposited on the entire surface of the resultant semiconductor structure, and bit line contact holes 117 are formed in silicon oxide film 116. Bit line 118 formed of a second Al electrode layer is formed on silicon oxide film 116.

Protective film 119 is deposited on the entire surface of the resultant structure, thus completing the semiconductor device. Note that an n$^+$-type collector lead layer extending to the n$^+$-type buried layer is formed around the memory cell array.

The manufacturing process of the SRAM described above will be described hereinafter with reference to FIGS. 75A to 81B.

P$^-$-type silicon substrate 101 is annealed in an Sb$_2$O$_3$ atmosphere at 1,250° C. for 25 minutes, and Sb is diffused in p$^-$-type silicon substrate 101, thus forming n$^+$-type buried layer 102.

The resultant structure is annealed in an SiH$_2$Cl+B$_2$H$_6$ atmosphere at 1,150° C. for 10 minutes to grow p$^-$-type epitaxial silicon film 103 on n$^+$-type buried layer 102. Thereafter, phosphorus ions (P$^+$) are implanted in epitaxial silicon film 103 at an acceleration voltage of 160 keV and a dose of $5 \times 10^{12}$ cm$^{-2}$. The phosphorus ions are diffused in epitaxial silicon film 103 by annealing in an N$_2$ atmosphere at 1,100° C. for 290 minutes, thereby forming n-type well 103.

Figure 75A:
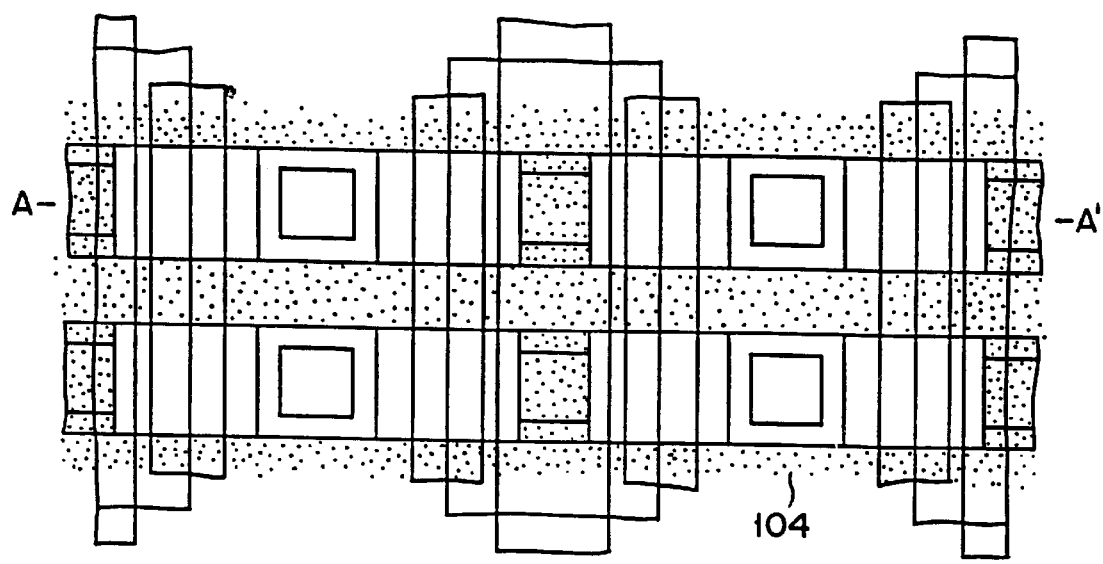
Figure 75B:
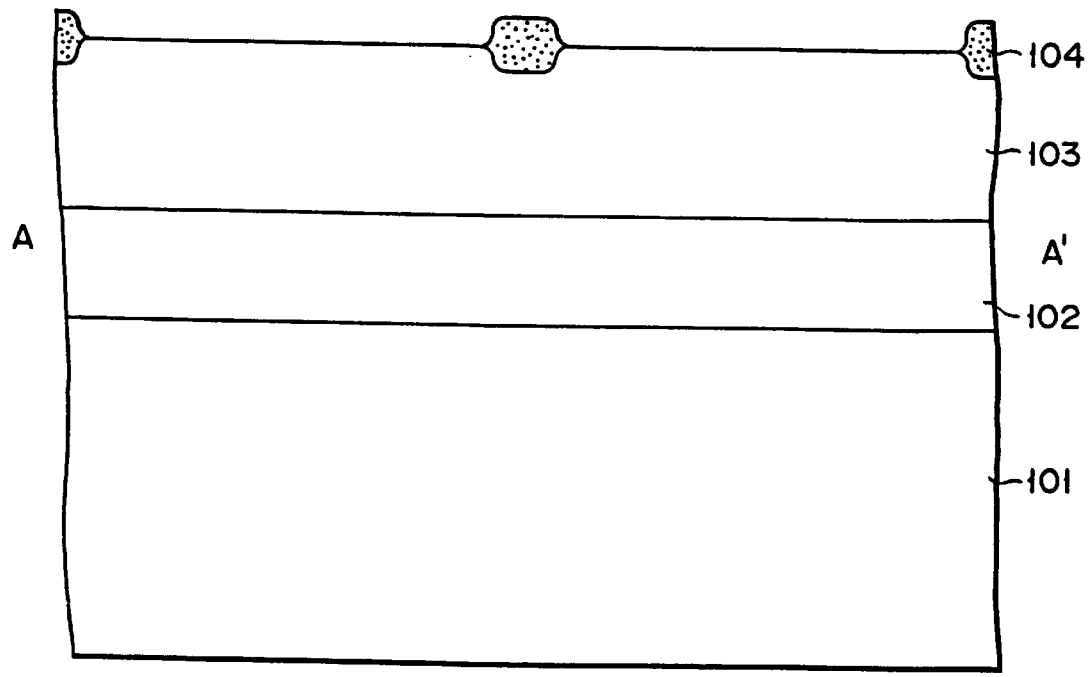

Field oxide film 104 as a thermal oxidation film is formed in n-type well 103 by the selective field oxidation method, and isolation regions for element isolation are formed by field oxide film 104 (FIG. 75B).

Then, gate oxide film 105 is formed on n-type well 103. Thereafter, gate electrode 106 of the p-channel MOS transistor is formed on gate oxide film 105 using phosphorus-doped polysilicon. Gate electrode 106 is used as the word line of the memory cell array. When gate electrode 106 is patterned, SiO$_2$ film 107 is deposited on the gate electrode (106) layer by CVD, and the gate electrode (106) layer is patterned together with SiO2 film 107.

P$^+$-type layers 108$_1$ and 108$_2$ serving as the source and drain of the p-channel MOS transistor are formed in n-type well layer 103 in self alignment using gate electrodes 106 as masks (FIGS. 77A and 77B). In this case, layers 108$_1$ and 108$_2$ may be formed in a single process, but may be formed in different processes so that the concentration of layer 108$_2$ serving as the base of the npn bipolar transistor is set to be lower than that of layer 108$_1$.

Figure 78A:
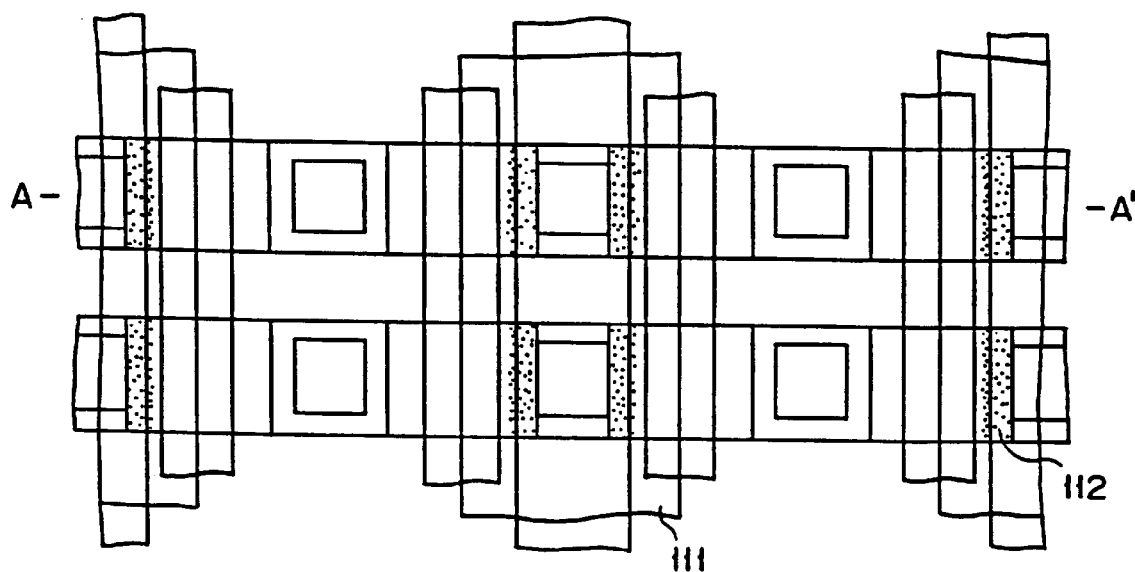
Figure 78B:
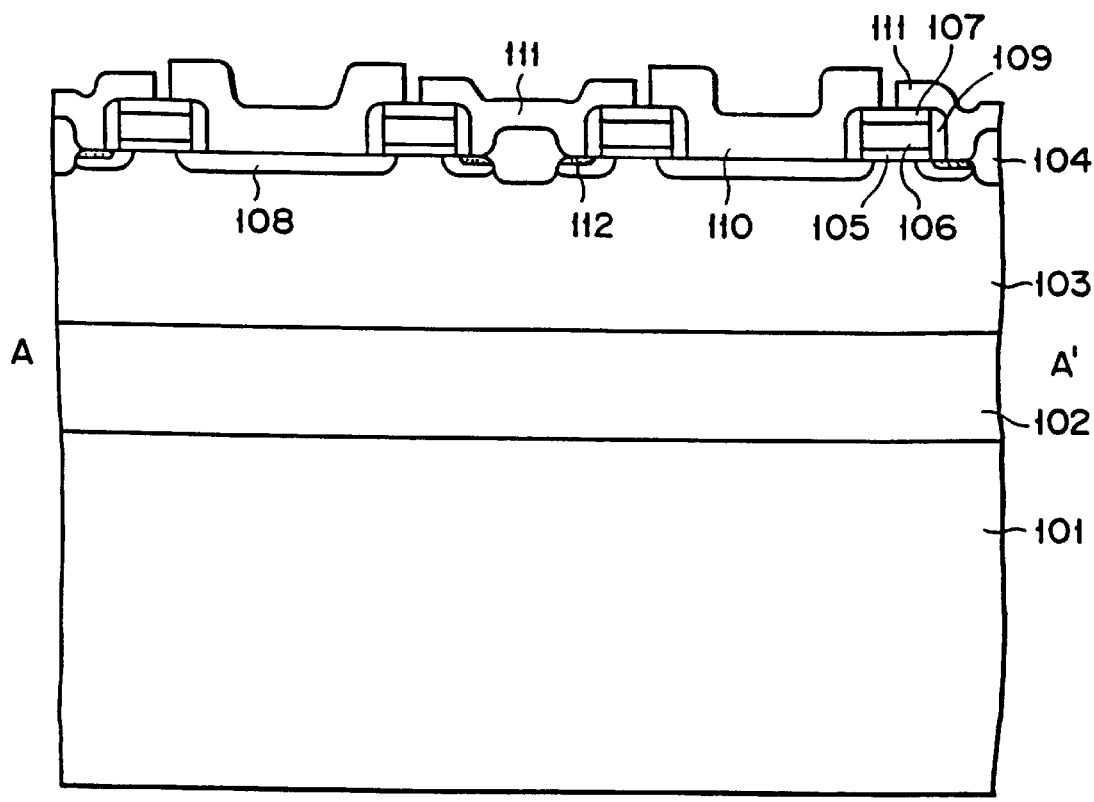

Resist 110 for protecting p$^+$-type bit line regions 108$_1$ is formed on the semiconductor structure shown in FIG. 77B, and is patterned. Thereafter, SiO$_2$ film 109 is formed by CVD, and then is patterned by an etching technique to be left on only the side surfaces of each gate electrode 106 having a great thickness. Polysilicon layer 111 is buried between gate electrode 106 of the p-channel MOS transistor and field oxide film 104. Arsenic is doped in polysilicon layer 111, and is diffused in layers 108$_1$ and 108$_2$, thereby forming n-type emitter layers 112 in layers 108$_1$ and 108$_2$ (FIG. 78B). N-type emitter 112 has an impurity concentration of $2 \times 10^{20}$ cm$^{-3}$ and a junction depth of 0.15 μm, and p$^-$-type base 108$_2$ has an impurity concentration of $3 \times 10^{18}$ cm$^{-3}$ and a junction depth of 0.3 μm.

Resist 110 is then removed, and SiO$_2$ film 113 is deposited on the entire surface of the semiconductor structure by CVD. Contact holes 114 are formed in SiO$_2$ film 113 above p$^+$-type bit line layer 108 and emitter polysilicon layer 111 (FIG. 79B).

A first Al layer is formed on SiO$_2$ film 113 having contact holes 114, and is patterned to form emitter electrode 115$_1$. At the same time, the first Al layer on the p$^+$-type bit line layer (108) is patterned to form electrode 115$_2$. Thus, a step formed when the first Al layer and a second Al layer formed later are connected can be reduced (FIG. 80B).

Figure 81A:
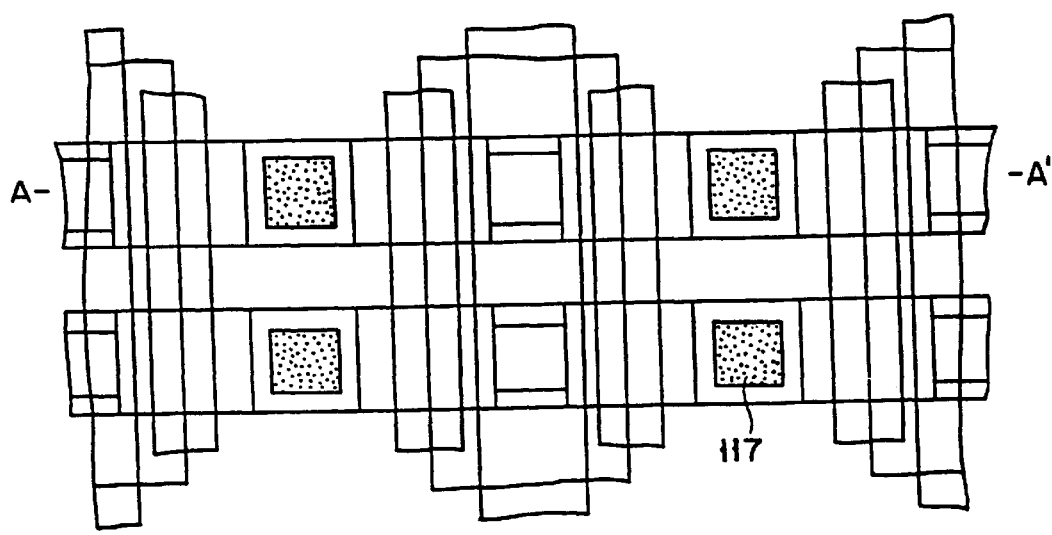
Figure 81B:
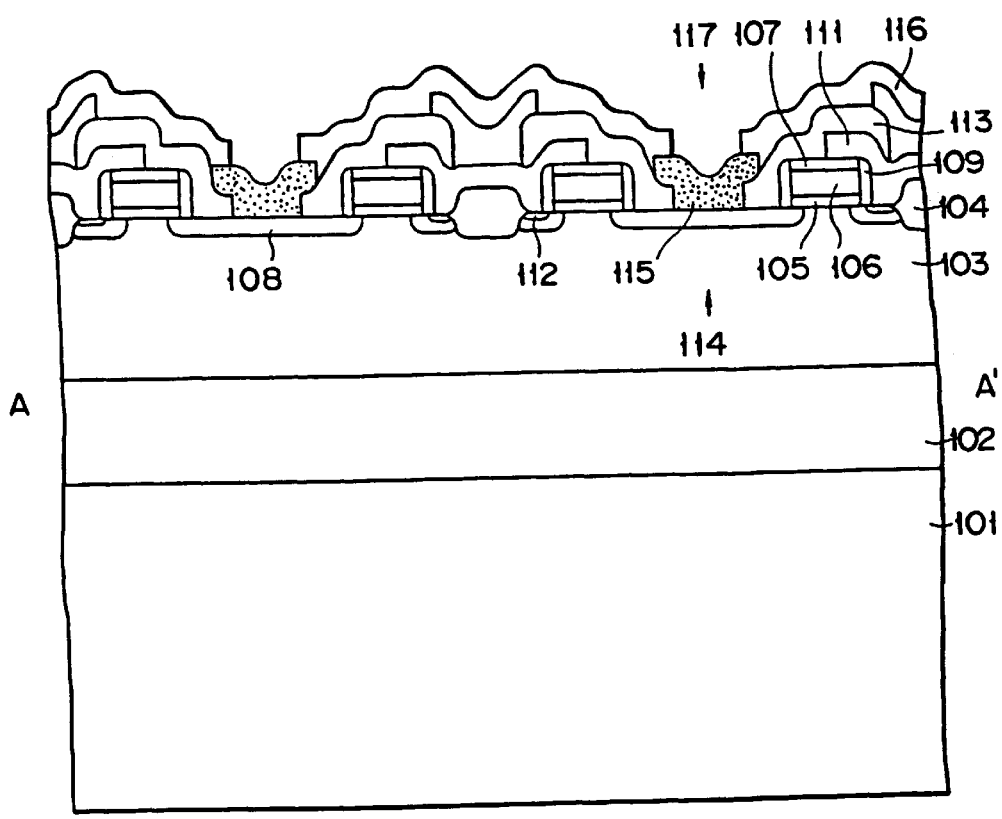

SiO$_2$ film 116 is deposited on the entire surface of the semiconductor structure shown in FIG. 80B by CVD, and contact holes 117 are formed in SiO$_2$ film 116 above first-layer Al electrodes 115 connected to p$^+$-type bit line layers 108 (FIG. 81B).

A second Al layer is formed on SiO$_2$ film 116 having contact holes 117, and is patterned to form bit lines 118. Finally, protective film 119 is deposited on the entire surface of the semiconductor structure, thus completing the semiconductor device (FIGS. 82A and 82B).

In the above description, the SRAM comprises the p-channel MOS transistor and the npn bipolar transistor. Contrary to this, a semiconductor device may be constituted by an n-channel MOS transistor and a pnp bipolar transistor.

Figure 92A:
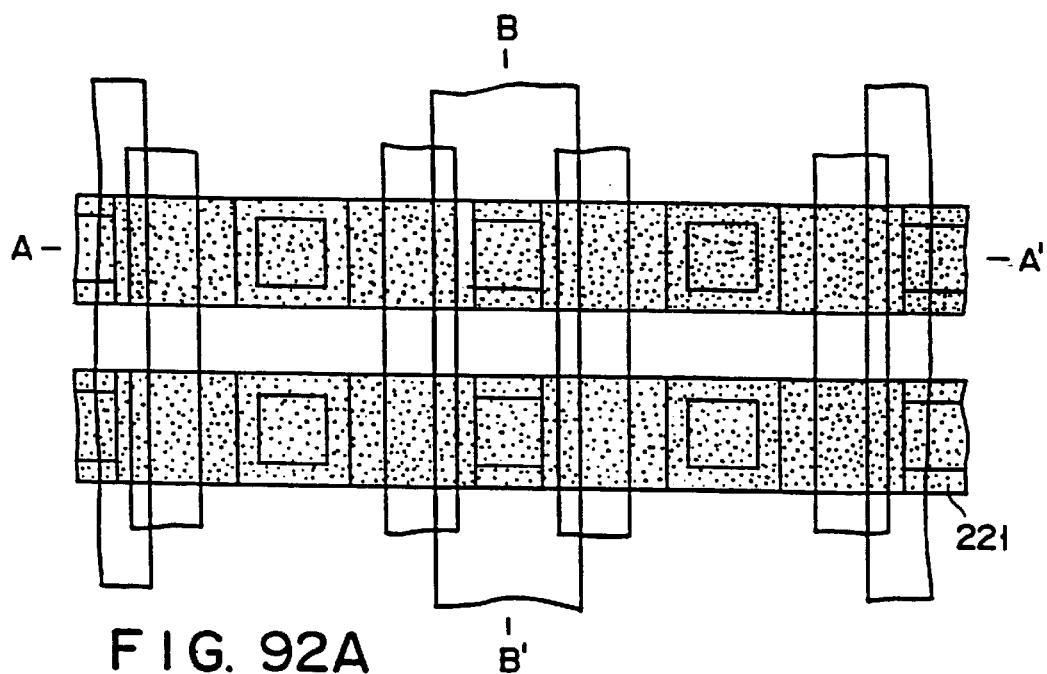
Figure 92B:
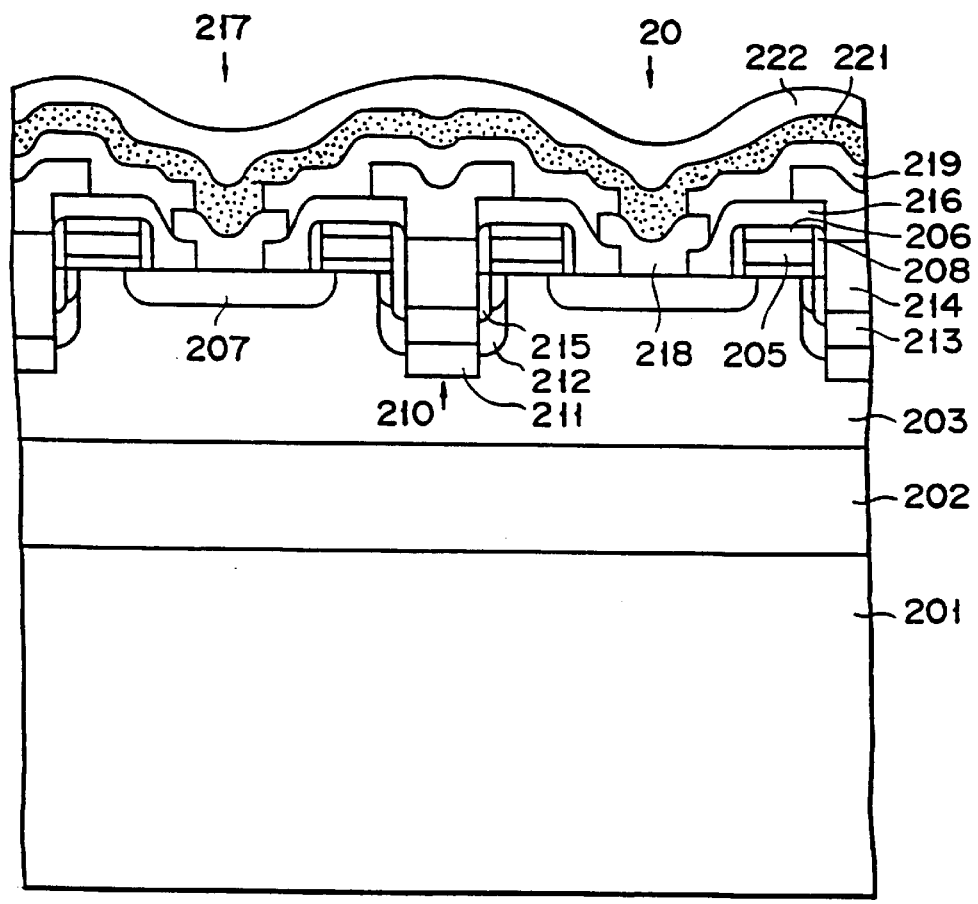

FIGS. 92A and 92B show another modification of an SRAM. This SRAM has the same circuit configuration as those shown in FIGS. 35 and 56.

According to this SRAM, n$^+$-type buried layer 202 for reducing a collector resistance is formed on the surface of p$^-$-type silicon substrate 201, and a p$^-$-type epitaxial silicon layer (not shown) having a boron concentration of about $1 \times 10^{15}$ cm$^{-3}$ and a thickness of, e.g., 2.5 μm is formed on n$^+$-type buried layer 202. N-type well 203 is formed in p$^-$-type epitaxial silicon layer. For element isolation, an SiO$_2$ film is buried in a groove formed by a BOX method and extending from the surface of n-type well 203 to n$^+$-type buried layer 202.

A p-channel MOS transistor and an npn bipolar transistor constituting the memory cell are formed in another element region.

Gate electrode 205 of the p-channel MOS transistor is formed of a first polysilicon layer, and p$^+$-type layers 207 serving as the source and drain of the MOS transistor are formed in n-type well 203 in self alignment using gate electrode 205 as a mask. Of the source and drain regions, a region used as a base region of the npn bipolar transistor may be formed in a different process, and may be changed to be a p$^-$-type layer (low-concentration layer).

For isolating the bases of the adjacent cells, an SiO$_2$ film deposited in a groove which is formed in self alignment using, as masks, gate electrodes 205 on the side walls of which the SiO$_2$ films are left.

An emitter is formed by diffusing arsenic from second polysilicon layer 214. N-type emitter 215 has an impurity concentration of $2 \times 10^{20}$ cm$^{-3}$ and a junction depth of 0.3 μm, and p$^-$-type base 212 has an impurity concentration of $3 \times 10^{18}$ cm$^{-3}$ and a junction depth of 0.3 μm. A first Al Layer is patterned to form emitter electrode 218 on emitter polysilicon 214.

Silicon oxide film 210 is deposited on the entire surface of the resultant structure, and bit line contact holes 220 are formed in silicon oxide film 219. Bit line 212 is formed by a second Al layer.

Protective film 222 is deposited on the entire surface of the resultant structure having bit line 212, thus completing a semiconductor device. An n$^+$-type collector lead layer reaching the n$^+$-type buried layer is formed around the memory cell array.

The manufacturing process of the SRAM described above will be described hereinafter with reference to FIGS. 83A to 92B.

P⁻-type silicon substrate 201 is annealed in an Sb$_2$O$_3$ atmosphere at 1,250° C. for 25 minutes, and Sb is diffused in p⁻-type silicon substrate 201, thus forming n⁺-type buried layer 202 in substrate 201.

The substrate is annealed in an SiH$_2$Cl+B$_2$H$_6$ atmosphere at 1,150° C. for 15 minutes to grow a p⁻-type epitaxial silicon layer on n⁺-type buried layer 202. Thereafter, phosphorus ions (P⁺) are implanted in the epitaxial silicon layer at an acceleration voltage of 160 keV and a dose of 5×10$^{12}$ cm$^{-2}$, and the silicon layer is annealed in an N$_2$ atmosphere at 1,100° C. for 290 minutes. The phosphorus ions are diffused in the silicon layer, thereby forming n-type well 203 in the silicon layer. A 2.5-μm deep groove reaching the n⁺-type buried layer is formed in an element isolation region, and SiO$_2$ film 204 is buried in this groove by CVD (FIGS. 83A and 83B).

Gate 205 of the p-channel transistor is formed on the gate oxide film using phosphorus-doped polysilicon. Gate electrodes 205 are used as the word lines of the memory cell array (FIGS. 84A and 84B) When polysilicon is patterned to form gate electrodes 205, it is patterned together with SiO$_2$ film 206 deposited thereon by CVD.

Figure 85A:
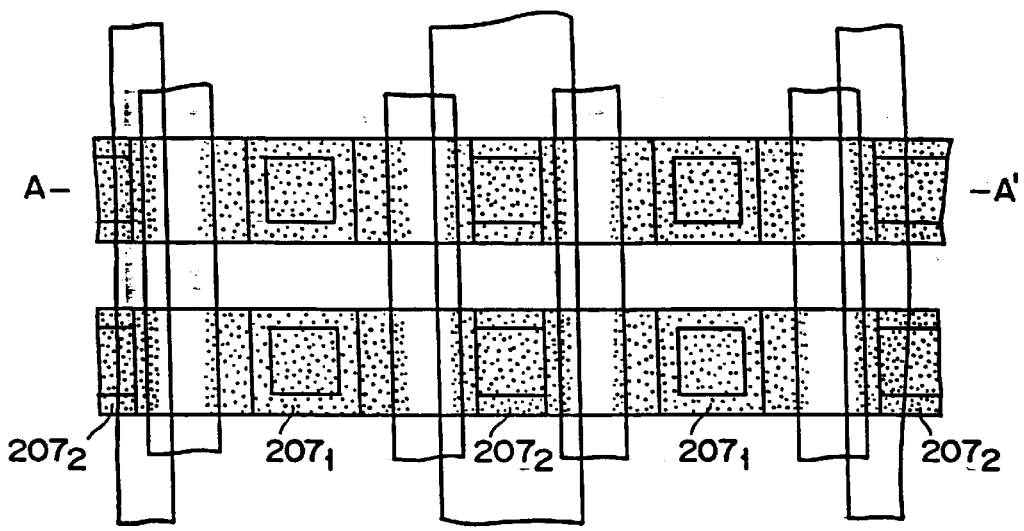
Figure 85B:
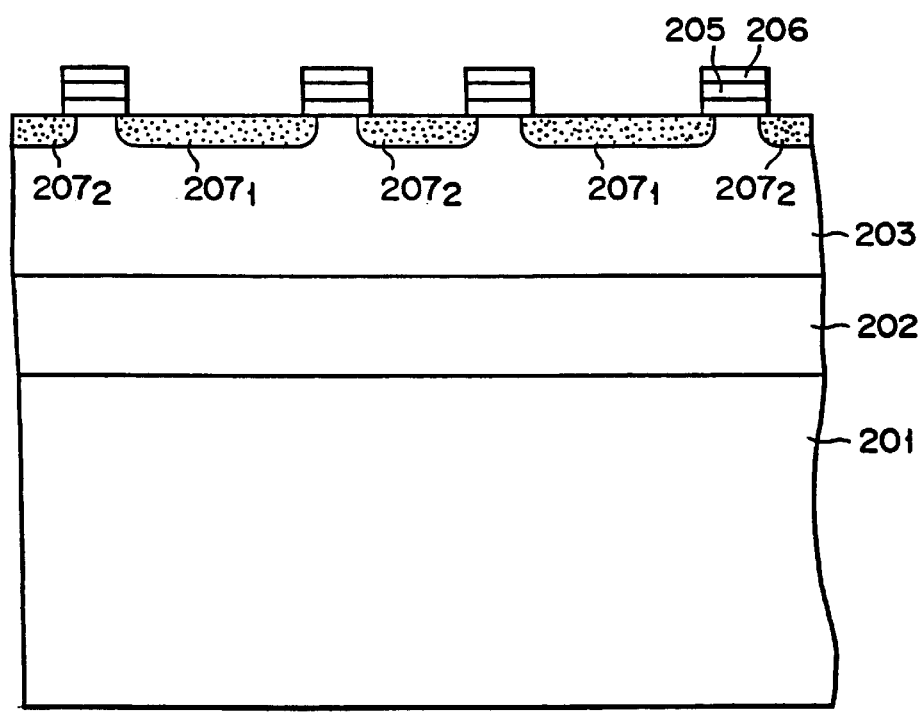

P⁺-type layers 207$_1$ and 207$_2$ serving as the source and drain of the p-channel MOS transistor are formed in n-type well 203 in self alignment using gate electrodes 205 as masks (FIGS. 85A and 85B). In this case, p⁺-type layers 207$_1$ and 207$_2$ may be formed in an identical process but may be formed in different processes so that the concentration of layer 207$_2$ serving as the base of the npn bipolar transistor is set to be lower than that of layer 207$_1$.

An SiO$_2$ film is deposited on the surface of the semiconductor structure shown in FIG. 85B by CVD, and is etched back to leave SiO$_2$ film 208 on the side wall portion of each gate electrode 205 of the p-channel MOS transistor. Resistor 209 for protecting the p⁺-type bit line regions is formed on the p⁺-type bit line regions by deposition and patterning. 1.5-μm deep grooves 210 are formed in n-type well 203 in self alignment using, as masks, gate electrodes 205 on which SiO$_2$ films 208 are left (FIGS. 86A and 86B).

Figure 87A:
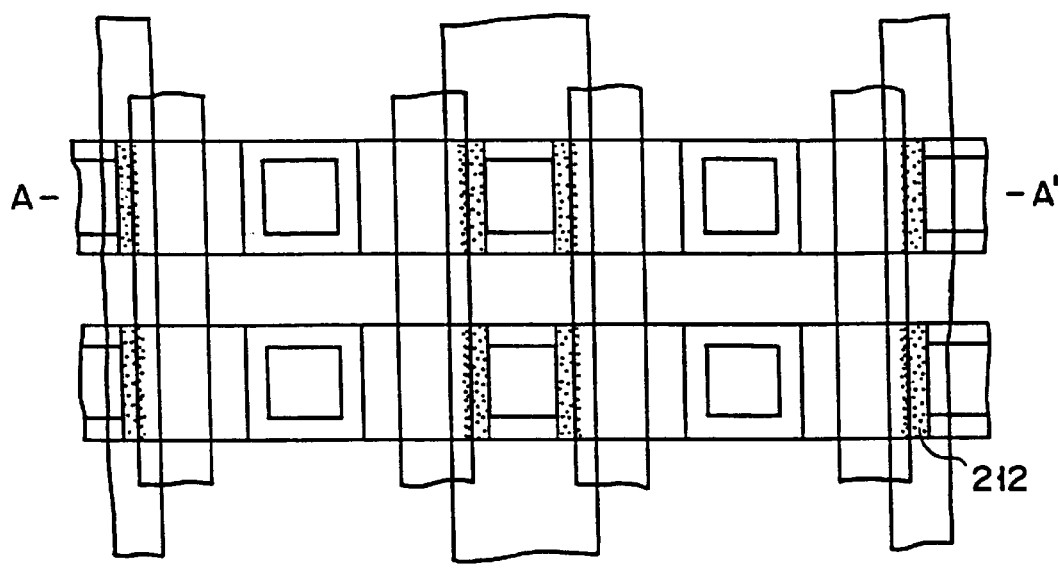
Figure 87B:
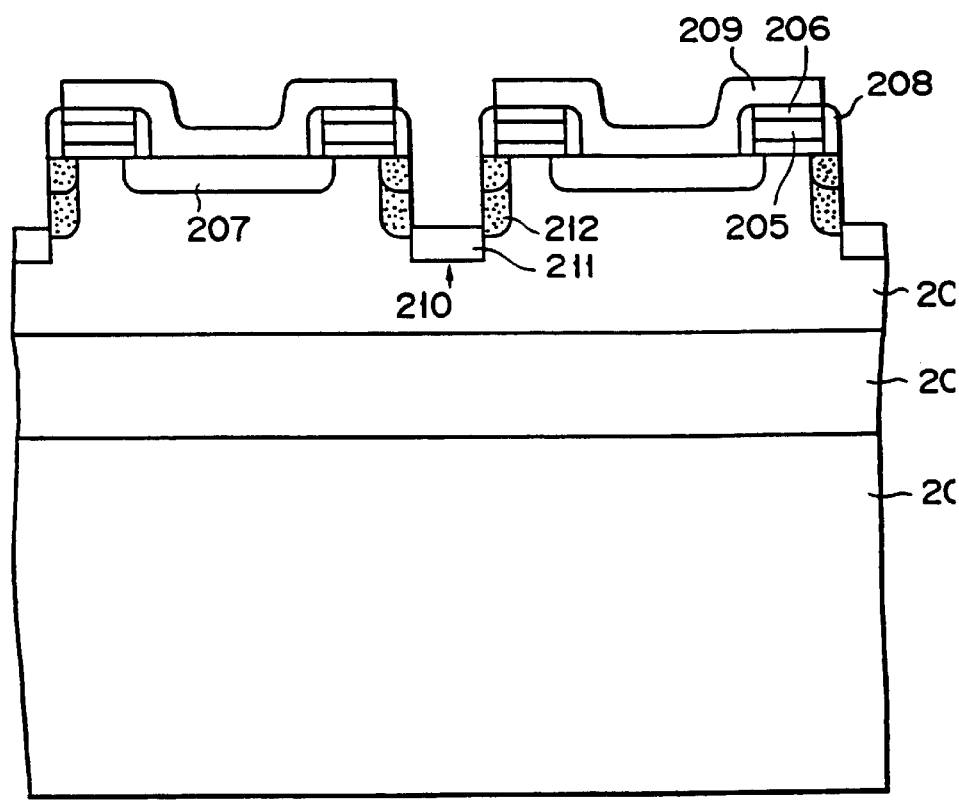
Figure 88A:
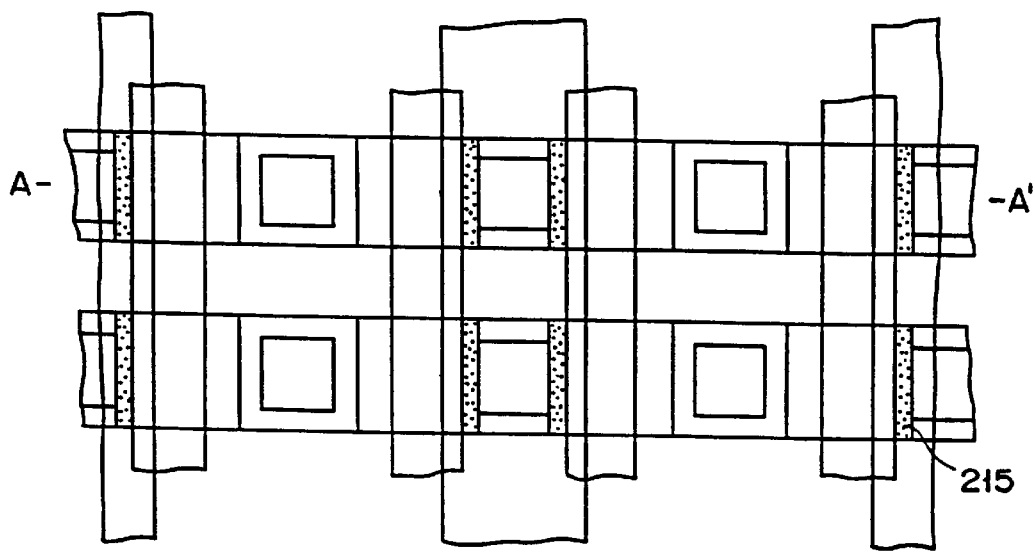
Figure 88B:
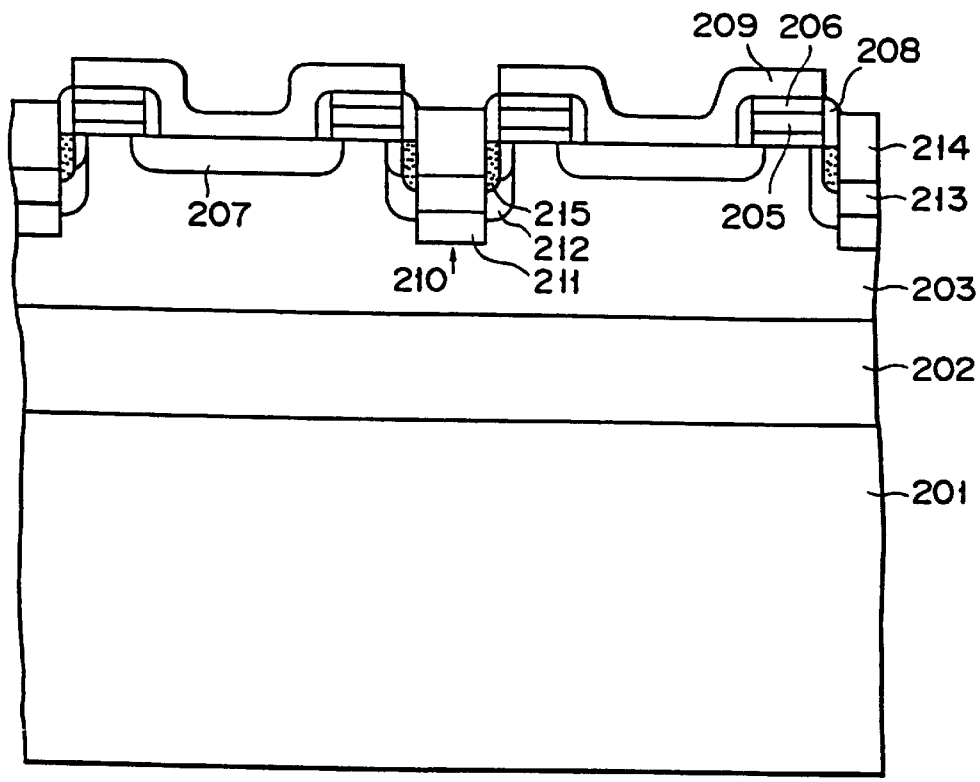

0.5-μm thick SiO$_2$ film 2111 is buried in each groove 210 by CVD. Boron ions (B⁺) are implanted in grooves 210 buried with SiO$_2$ films 211 at an acceleration voltage of 30 keV and a dose of 1×10$^{14}$ cm$^{-2}$, thereby forming p⁻-type base layers 212 serving as the bases in n-type well 203. 0.3-μm thick SiO$_2$ film 213 is buried in each groove 210 by CVD (FIG. 87B). Furthermore, polysilicon 214 is buried in each groove 210, and arsenic is doped through polysilicon 214, thereby forming n-type emitter layer 215 in each layer 212 (FIG. 89B). N-type emitter 215 has an impurity concentration of 2×10$^{20}$ cm$^{-3}$ and a junction depth of 0.15 μm and p⁻-type base 212 has an impurity concentration of 3×10$^{18}$ cm$^{-3}$ and a junction depth of 0.3 μm.

Figure 89A:
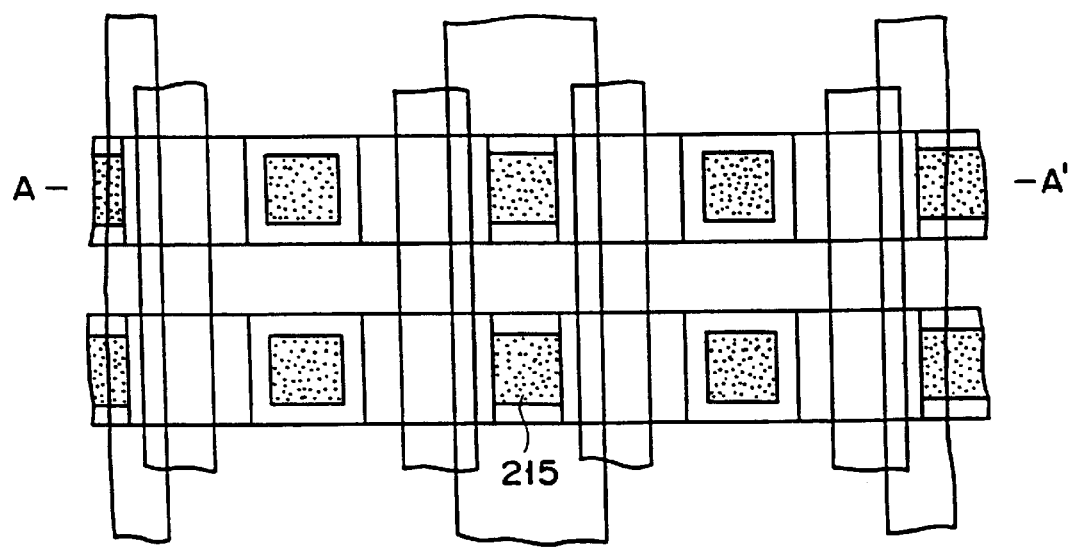
Figure 89B:
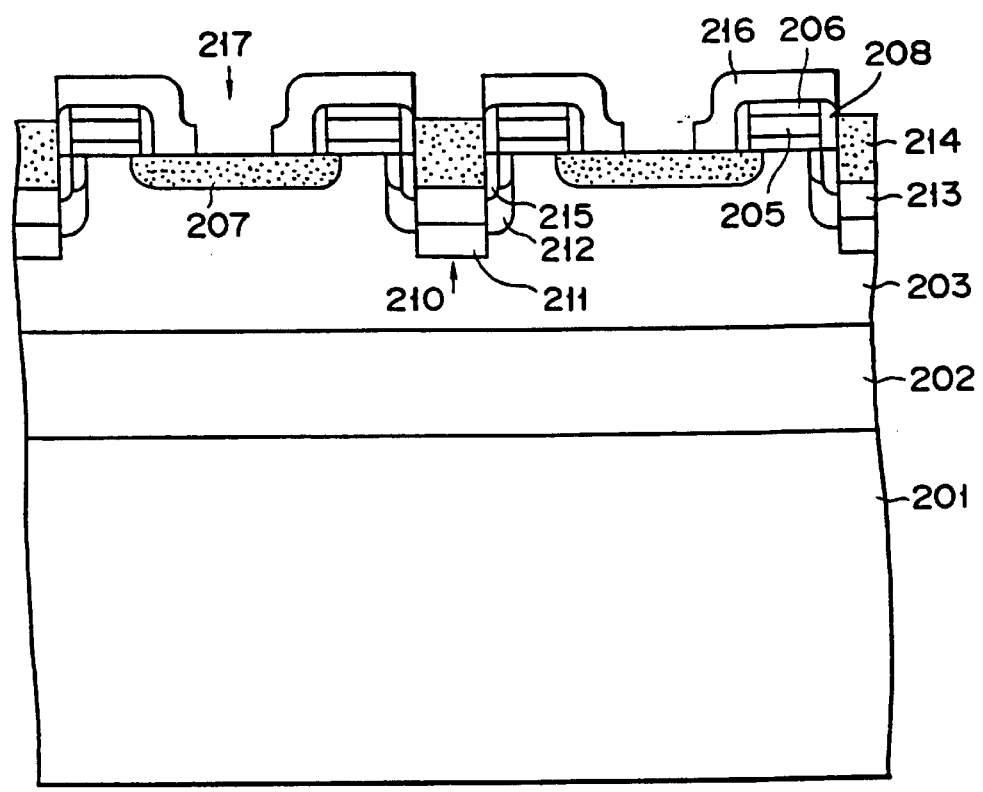

Resist 209 is then removed, and SiO$_2$ film 216 is deposited on the entire surface of the resultant structure by CVD, and contact holes 217 are formed in SiO$_2$ film 216 above p⁺-type bit line layers 207, and emitter polysilicon layers 214 (FIG. 89A).

A first Al film is deposited on SiO$_2$ film 217 and is patterned to form emitter electrodes 218. At the same time, the first Al film on each p⁺-type bit line layer is patterned to form bit line electrode 218. Since the electrodes are formed in this manner, a step formed when a second Al film formed later and the electrodes are connected can be reduced (FIG. 90B).

Figure 91A:
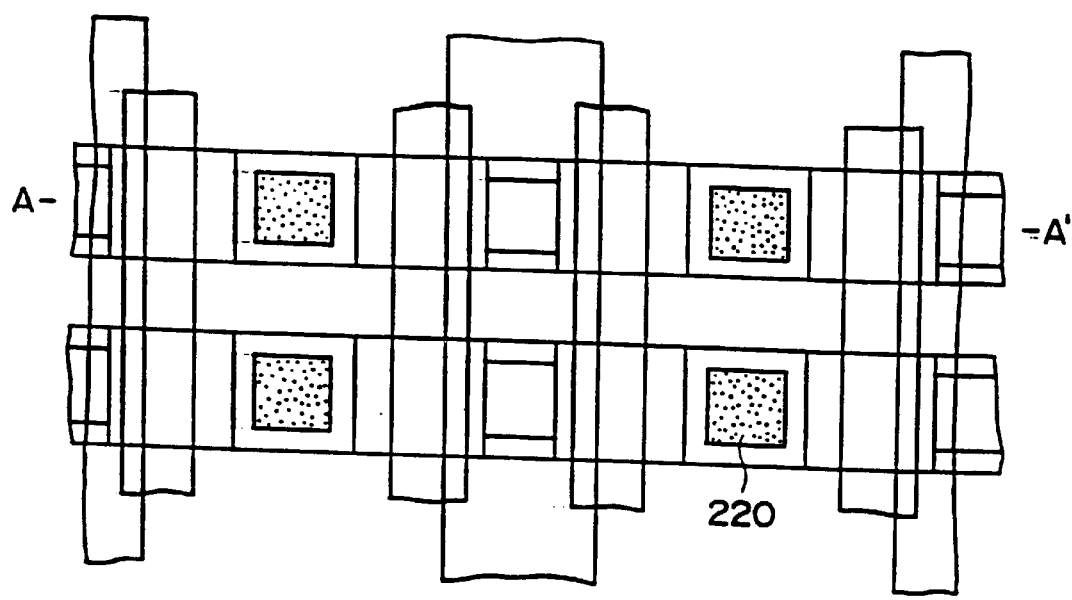
Figure 91B:
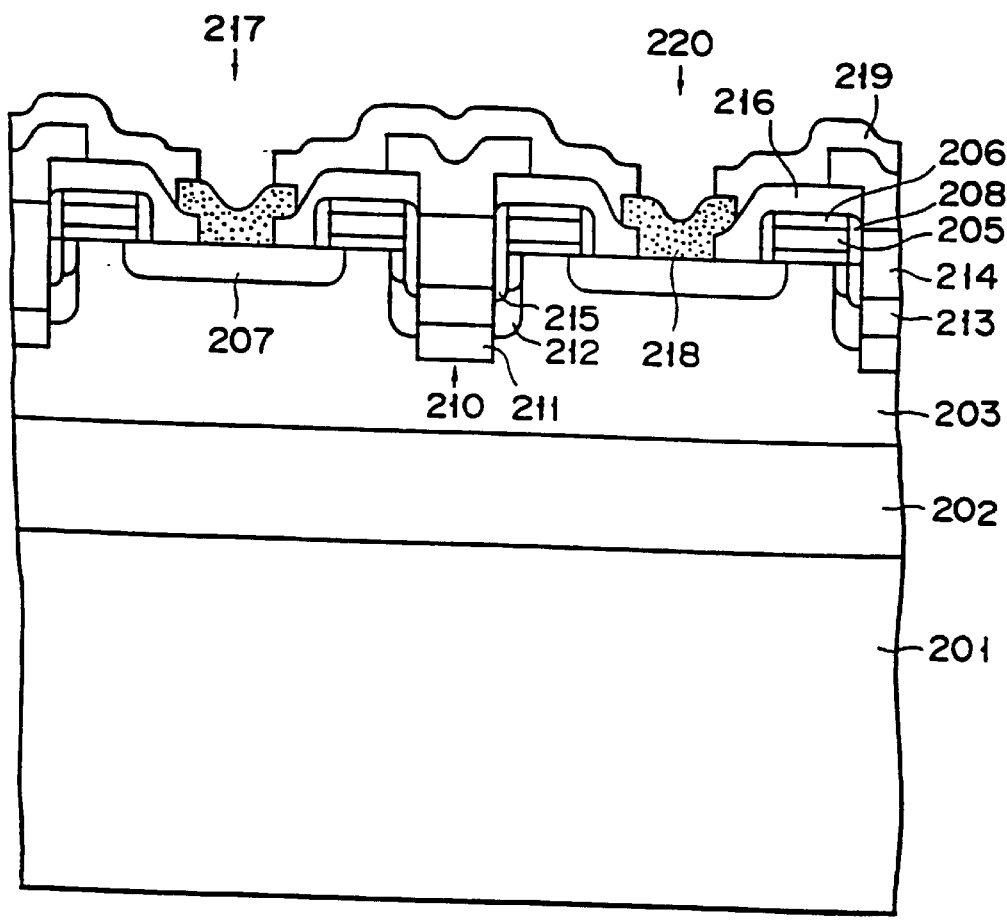

SiO$_2$ film 219 is formed on the entire surface of the resultant structure by CVD, and contact holes 220 are formed in SiO$_2$ film 219 on first Al layer 218 connected to the p⁺-type bit line layers (FIG. 91B).

Figure 92C:
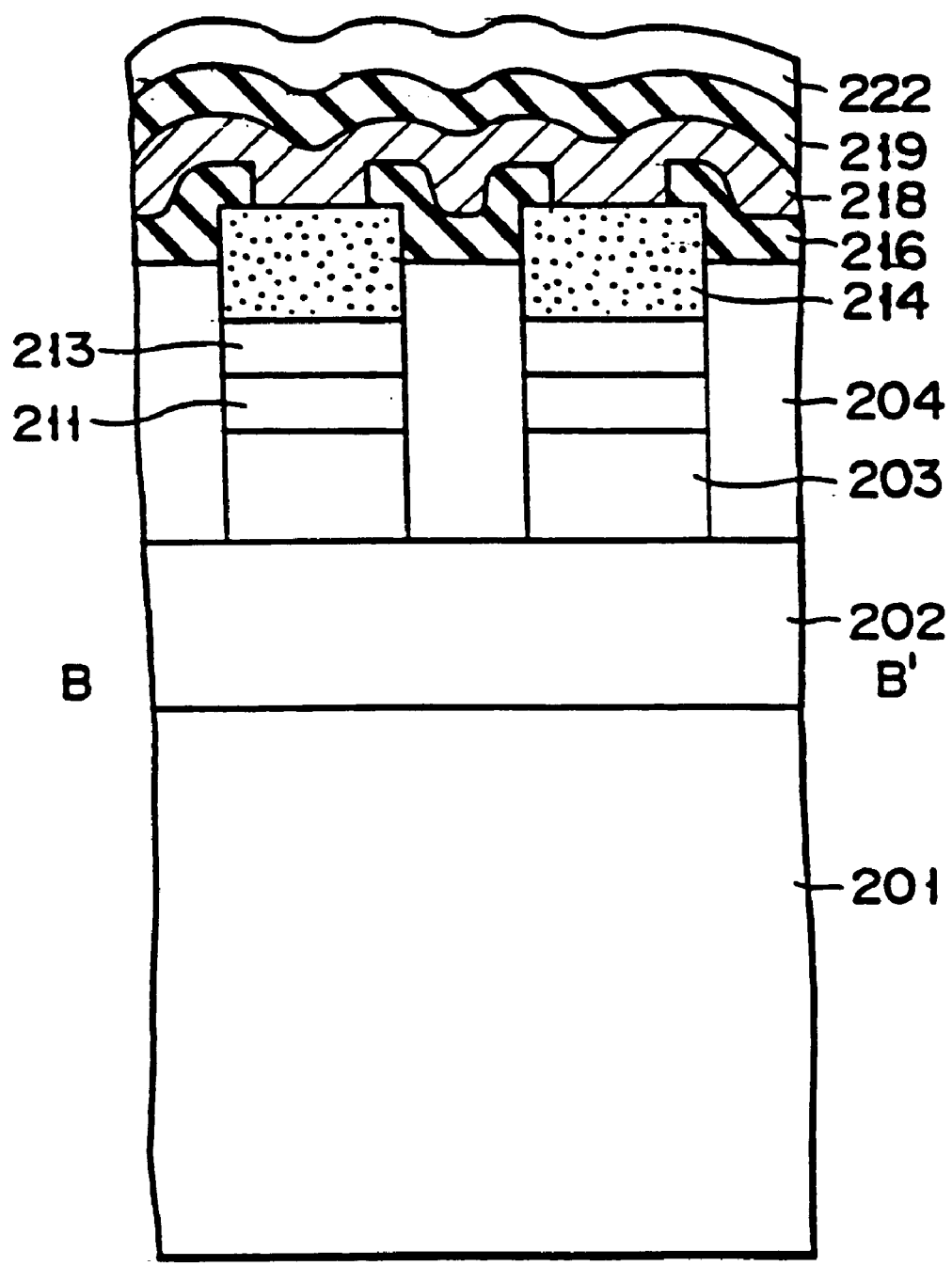

A second Al layer is deposited on SiO$_2$ film 219 and is patterned to form bit lines. Thereafter, protective film 222 is deposited on the entire surface of the resultant structure, thus completing a semiconductor device (FIGS. 92A to 92C).

Figure 93:
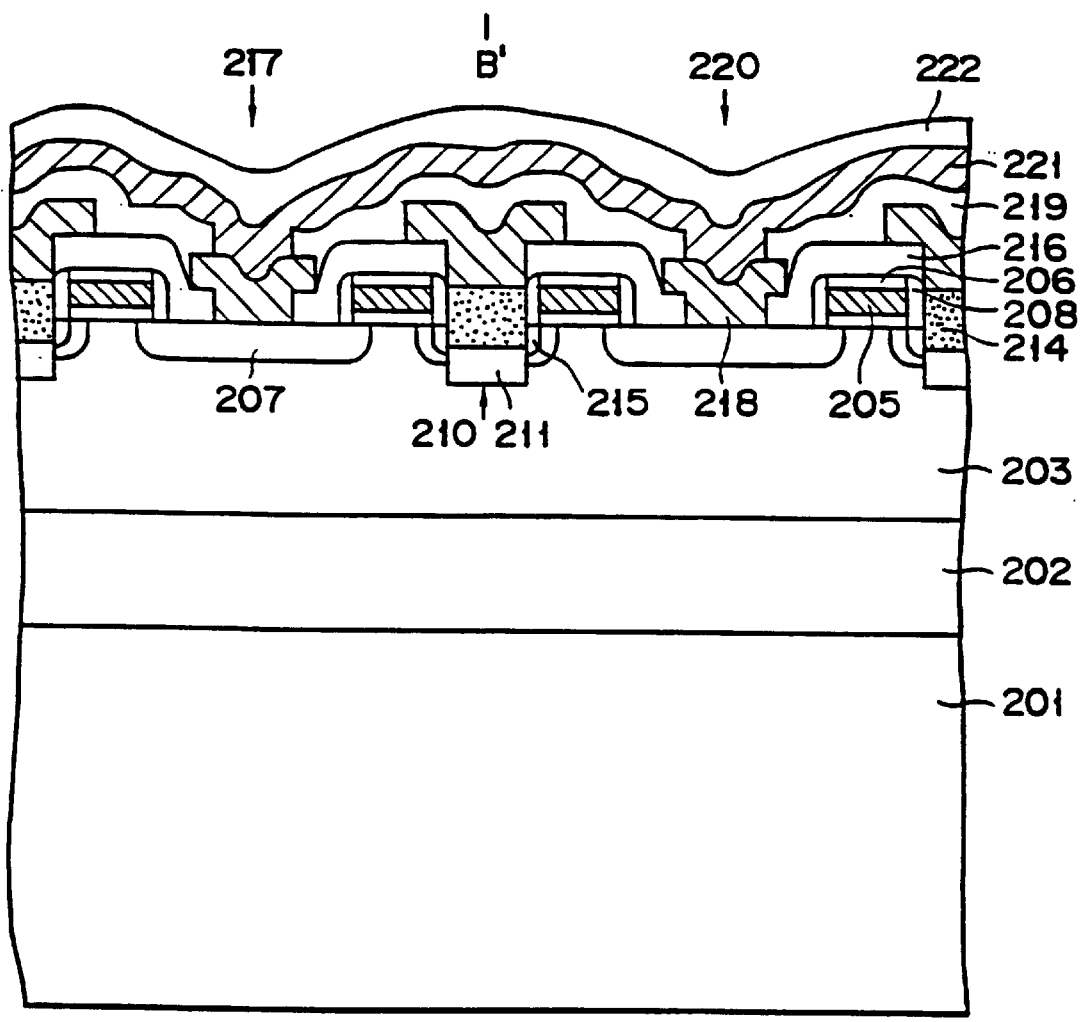
FIG. 93 is a sectional view of a semiconductor structure in the manufacturing process.

As another embodiment, as shown in FIG. 93, groove 210 is formed to have a depth of 0.6 μm larger than the depth of 0.3 μm of p⁺-type layer 207, and 0.5-μm thick SiO$_2$ film 211 is buried in groove 210. Thus, p⁻-type layer 212 formed by ion-implantation of boron can be omitted. Emitter polysilicon 214 is then buried in the groove, and thereafter, n-type emitter 215 is formed.

In the above description, the SRAM memory cell is constituted by the p-channel MOS transistor and the npn bipolar transistor. However, the present invention can be applied to a semiconductor device using an n-channel MOS transistor and a pnp bipolar transistor.

Each groove 210 is formed in self alignment using gate electrodes 205 of the p-channel MOS transistors as masks. However, the present invention can be effectively applied to a case wherein after a mask is separately formed, a groove is formed without self alignment.

What is claimed is:

1. A semiconductor device comprising:

a plurality of memory cells arranged in a matrix, each of said memory cells comprising a bipolar transistor and a respective switching element connected to the bipolar transistor of the respective memory cell;

a plurality of bit lines each connected to the first terminal of said respective switching element;

a plurality of word lines each connected to the control terminal of said respective switching element; and an amplifier unit which receives data read out from said memory cells, said bipolar transistor having a base, an emitter, a collector, a base-emitter junction and a collector-base junction, said bipolar transistor has a first operating region such that with a positive base-emitter voltage $V_{BE}$ in a first range and a predetermined positive collector-emitter voltage $V_{CE}$, a positive base current $I_B$ is produced, a second operating region such that with a positive base-emitter voltage $V_{BE}$ in a second range greater than the first range and said positive collector-emitter voltage $V_{CE}$, a negative base current $I_B$ is produced, said positive base-emitter voltage $V_{BE}$ being determined so that said negative base current $I_B$ is produced by impact ionization in said second operating region without actual breakdown, and a third operation region such that with a positive base-emitter voltage $V_{BE}$ in a third range greater than the second range and said positive collective emitter voltage $V_{CE}$, a positive base current $I_B$ is produced; and a bias unit which biases the bipolar transistor to operate with the positive collector-emitter voltage $V_{CE}$ and at a boundary point between the second and third operation regions, including a voltage varying unit which varies a voltage applied to the base of said bipolar transistor so that when $V_{BE}$ exceeds a predetermined threshold and the voltage applied to the base of the bipolar transistor is removed by said bias unit, the transistor is self-latched at the boundary between the second and third operating regions to output from the base of the bipolar transistor an output voltage at a first level, and so that when the voltage applied to the base of said bipolar transistor is such that $V_{BE}$ is less than said threshold and said applied voltage is then removed by said bias unit, the bipolar transistor operates in said first operating region and outputs from the base an output voltage at a second level different than said first level, and wherein said bias unit comprises a switching element having first and second terminals, a conduction path between said first and second terminals, and a control terminal for controlling conductivity of said conduction path, said second terminal connected to the base of said bipolar transistor, wherein, when said conduction path is rendered conductive and a first logic level voltage in said first range is temporarily applied to the base of said bipolar transistor via said conduction path, said bipolar transistor operates in said first operating region during the time of application of said first logic level voltage to said base, and after said conduction path is rendered nonconductive resulting in cessation of application of said first logic level voltage to said base, said base assumes a stable low logic level at said base of said bipolar transistor, and when said conduction path is rendered conductive and a second logic level voltage in one of said second and third range sis temporarily applied to the base of said bipolar transistor via said conduction path, said bipolar transistor operates in one of said second and third operating regions during application of said second logic level, and upon said conduction path being rendered non-conductive resulting in the cessation of application of said logic level voltage to said base of said bipolar transistor, said base of said bipolar transistor assumes a stable high logic level at said boundary potential.

2. The semiconductor device according to claim 1, wherein said bit lines are divided into a plurality of bit line groups, said amplifier unit comprise a plurality of first transfer gates connected to a plurality of bit lines constituting each of the bit line groups, a plurality of first sense amplifiers commonly connected to the bit lines of the corresponding bit line groups through said first transfer gates, a plurality of second transfer gates connected to said first sense amplifiers, respectively, and a second sense amplifier connected to said second transfer gates.

3. The device according to claim 1, further comprising a capacitive element connected to a junction between said base of said bipolar transistor and said switching element.

4. The device according to claim 3, wherein said switching element comprises a MOS transistor controlled by a clock.

5. The device according to claim 1, further comprising a resistor connected across the base and emitter of said bipolar transistor.

6. The device according to claim 3, further comprising a resistor connected across the base and emitter of said bipolar transistor.

7. The device according to claim 5, wherein said resistor comprises a variable resistor.

8. The device according to claim 1, wherein said bias unit comprises a diode for applying a voltage to the base of said bipolar transistor.

9. The device according to claim 1, wherein said bias unit comprises a diode for applying a voltage to the base of said bipolar transistor.

10. The device according to claim 1, comprising discharging means connected to the base of said bipolar transistor to reset a voltage charged to said base of said bipolar transistor.

11. The device according to claim 9, comprising discharging means connected to the base of said bipolar transistor to reset a voltage charged to said base of said bipolar transistor.

12. The semiconductor device according to claim 1 wherein said bias unit further comprises changing means which changes said collector-emitter voltage $V_{CE}$ so as to reset the base voltage $V_B$ of the bipolar transistor.

* * * * *

UNITED STATES PATENT AND TRADEMARK OFFICE
CERTIFICATE OF CORRECTION

PATENT NO. : 6,292,390 B1  
DATED : September 18, 2001  
INVENTOR(S) : Sakui et al.

Page 1 of 1

It is certified that error appears in the above-identified patent and that said Letters Patent is hereby corrected as shown below:

<u>Title page,</u>  
Item [30], the Foreign Application Priority information should read  
-- [30]          Foreign Application Priority Data

| | | |
|---|---|---|
| Jan. 8, 1988 | (JP) | 63-1334 |
| Jan. 29, 1988 | (JP) | 63-17383 |
| Jan. 29, 1988 | (JP) | 63-17384 |
| Jan. 29, 1988 | (JP) | 63-17385 |
| Jan. 29, 1988 | (JP) | 63-17386 |
| Jan. 29, 1988 | (JP) | 63-17387 |
| Mar. 25, 1988 | (JP) | 63-69627 |
| Mar. 25, 1988 | (JP) | 63-69636 |
| Jun. 28, 1988 | (JP) | 63-158188 |
| Jun. 28, 1988 | (JP) | 63-158189 |
| Jun. 28, 1988 | (JP) | 63-158190 |
| Jun. 30, 1988 | (JP) | 63-160874 |

Signed and Sealed this

Second Day of April, 2002

Attest:

*Attesting Officer*

JAMES E. ROGAN  
*Director of the United States Patent and Trademark Office*